United States Patent
Choi et al.

(10) Patent No.: US 9,646,711 B2
(45) Date of Patent: May 9, 2017

(54) MEMORY DEVICE

(71) Applicant: Samsung Electronics Co., Ltd., Suwon-si (KR)

(72) Inventors: Hyun-Min Choi, Uiwang-si (KR); Shigenobu Maeda, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 14 days.

(21) Appl. No.: 14/676,819

(22) Filed: Apr. 2, 2015

(65) Prior Publication Data

US 2015/0380102 A1    Dec. 31, 2015

(30) Foreign Application Priority Data

Jun. 26, 2014  (KR) .................. 10-2014-0079073

(51) Int. Cl.
| | |
|---|---|
| *G11C 5/02* | (2006.01) |
| *G11C 17/16* | (2006.01) |
| *H01L 23/525* | (2006.01) |
| *H01L 27/112* | (2006.01) |

(52) U.S. Cl.
CPC .......... *G11C 17/16* (2013.01); *H01L 23/5252* (2013.01); *H01L 27/11206* (2013.01); *H01L 2924/0002* (2013.01)

(58) Field of Classification Search
CPC ................. G11C 17/16; H01L 23/5252; H01L 27/11206; H01L 2924/00
See application file for complete search history.

(56) References Cited

U.S. PATENT DOCUMENTS

| | | |
|---|---|---|
| 6,275,414 B1 | 8/2001 | Randolph et al. |
| 6,593,606 B1 | 7/2003 | Randolph et al. |
| 6,713,839 B2 | 3/2004 | Madurawe |
| 7,176,078 B2 | 2/2007 | Kim |

(Continued)

FOREIGN PATENT DOCUMENTS

| | | |
|---|---|---|
| KR | 10-0604875 | 7/2006 |
| KR | 10-0771679 | 11/2007 |

*Primary Examiner* — Richard Elms
*Assistant Examiner* — Mohammed A Bashar
(74) *Attorney, Agent, or Firm* — Muir Patent Law, PLLC

(57) ABSTRACT

A memory device includes first through fourth active regions arranged sequentially along a first direction, and which extend along a second direction different from the first direction; a first gate electrode formed on the first through fourth active regions to intersect the first through fourth active regions, and extending along the first direction; a second gate electrode formed on the first through fourth active regions to intersect the first through fourth active regions, extending along the second direction, and arranged so that no other gate electrodes are between the first gate electrode and the second gate electrode in the second direction; the first gate electrode extending between a first end and a second end;
a first wiring line which is formed on the first gate electrode; a first strap contact, which connects the first wiring line and the first gate electrode between the first active region and the second active region; and a second strap contact, which connects the first wiring line and the first gate electrode between the third active region and the fourth active region.

17 Claims, 73 Drawing Sheets

(56) References Cited

U.S. PATENT DOCUMENTS

| | | |
|---|---|---|
| 7,688,614 B2 | 3/2010 | Morimoto |
| 8,101,471 B2 | 1/2012 | Hafez et al. |
| 2013/0161761 A1 | 6/2013 | Luan et al. |
| 2013/0294141 A1* | 11/2013 | Oh .................. G11C 17/18 365/96 |
| 2013/0322150 A1* | 12/2013 | Kim .................. G11C 17/16 365/104 |

* cited by examiner

PRESENT INVENTION

COMPARED ART

MEMORY DEVICE

CROSS-REFERENCE TO RELATED APPLICATIONS

This application claims priority from Korean Patent Application No. 10-2014-0079073, filed on Jun. 26, 2014, in the Korean Intellectual Property Office, the disclosure of which is incorporated herein by reference in its entirety.

BACKGROUND

The present disclosure relates to a memory device, and more particularly, to a nonvolatile memory device including antifuse memory cells.

In general, programmable memory is used in microcontroller units (MCUs), power integrated circuits (ICs), display driver ICs, complementary metal oxide semiconductor (CMOS) image sensors, etc., which are used in devices such as mobile device parts, automobile parts, etc. For such programmable memory, one-time programmable (OTP) memory is widely used. The OTP typically occupies a small area, does not require an additional process, and is programmed by electrically short-circuiting with a breakdown mechanism when a high voltage is applied to a thin gate oxide layer.

Programmable memory apparatuses such as OTP memory devices are usually programmed by breaking connections (using fuses) or creating connections (using antifuses) in a memory circuit. For example, a programmable read-only memory (PROM) includes a fuse and/or an antifuse at a memory position or a bit and is programmed by triggering one of the fuse and the antifuse. Once programming is done, it is usually irreversible. Usually, programming is carried out after memory apparatuses are manufactured, taking a particular end use or application into account.

Fuse connection is implemented by resistive fuse devices that open or break at a certain amount of high current. Antifuse connection is implemented by a thin barrier layer formed of a non-conductive material (such as silicon dioxide) between two conductive layers or terminals. When a sufficiently high voltage is applied to the terminals, silicon dioxide or such non-conductive material becomes a short circuit or a low-resistance conductive path between the two terminals.

SUMMARY

Aspects of the present disclosure provide a nonvolatile memory device which can provide a uniform voltage to the entire programming gate and/or the entire reading gate.

However, aspects of the present disclosure are not restricted to the one set forth herein. The above and other aspects of the present disclosure will become more apparent to one of ordinary skill in the art to which the present disclosure pertains by referencing the detailed description of the various embodiments given below.

In one embodiment, a nonvolatile memory device includes: an anti-fuse memory cell array; a plurality of transistors of the anti-fuse memory cell array, the transistors arranged in a plurality of rows, each row extending in a first direction and including a set of transistors; a first gate electrode extending along a first row of the plurality of rows and connected to a first set of transistors in the first row; a first wiring line above the first gate electrode and separated from the first gate electrode in a vertical direction, the first wiring line extending in the first direction; and a plurality of strap contacts arranged along the first direction and first row, each strap contact extending between the first gate electrode and the first wiring line, and each strap contact arranged along the first row being referred to as a 1th strap contact. A first 1th strap contact of the plurality of 1th strap contacts is arranged to be at a first side of a second 1th strap contact of the plurality of 1th strap contacts, and the first 1th strap contact and second 1th strap contact are arranged to have two or fewer transistors between them, and a third 1th strap contact of the plurality of strap contacts is arranged to be at a second side of the second 1th strap contact opposite the first side, and the third 1th strap contact and second 1th strap contact are arranged to have two or fewer transistors between them.

In one embodiment, the first set of transistors are rupture transistors of respective fuse circuits.

In one embodiment, the nonvolatile memory device includes a second gate electrode extending along a second row of the plurality of rows and connected to a second set of transistors in the second row, the second row being parallel to the first row; and at least a first contact arranged in the second row and extending vertically from the second gate electrode to connect to a word line.

In one embodiment, the first contact arranged in the second row is the only contact extending vertically from the second gate electrode.

In one embodiment, the first set of transistors are rupture transistors of respective fuse circuits; the second set of transistors are access transistors of respective fuse circuits; and each rupture transistor corresponds to an access transistor to form a fuse circuit.

In one embodiment, the nonvolatile memory device further includes first through fourth active regions which extend along a second direction different from the first direction and are arranged sequentially along the first direction. The first gate electrode may be formed on the first through fourth active regions to intersect the first through fourth active regions, and the second gate electrode may be formed on the first through fourth active regions to intersect the first through fourth active regions. The first 1th strap contact connects the first wiring line and the first gate electrode between the first active region and the second active region, and one of the second 1th strap contact or the third 1th strap contact connects the first wiring line and the first gate electrode between the third active region and the fourth active region.

In one embodiment, the nonvolatile memory device, further includes: first through fourth bit line contacts which are respectively and electrically connected to the first through fourth active regions and are arranged on a side of the second gate electrode, wherein the second gate electrode is disposed between the first gate electrode and the first bit line contact.

In one embodiment, each of the first gate electrode and the second gate electrode is a metal gate electrode.

In one embodiment, the nonvolatile memory device further includes a second wiring line above the second gate electrode and separated from the second gate electrode in a vertical direction, the second wiring line extending in the first direction and being parallel to the first wiring line, wherein the first contact arranged in the second row is a strap contact extending vertically between and connecting the second gate electrode and the second wiring line.

In one embodiment, the first gate electrode extends in the first direction from a first end to a second end, and the first set of transistors and the first, second, and third 1th strap contacts are all disposed between the first end and the second end.

In one embodiment, a thickness of the first wiring line in the vertical direction is greater than a thickness of the first gate electrode in the vertical direction.

In other aspects of the invention, a nonvolatile memory device includes: an anti-fuse memory cell array; a plurality of transistors of the anti-fuse memory cell array, the transistors arranged in a plurality of rows, each row extending in a first direction and including a set of transistors; a first gate electrode extending along a first row of the plurality of rows from a first end of the first gate electrode to a second end of the first gate electrode, the first gate electrode connected to a first set of transistors in the first row; a first wiring line above the first gate electrode and separated from the first gate electrode in a vertical direction, the first wiring line extending in the first direction; and a plurality of strap contacts arranged along the first direction and first row and disposed between the first end of the first gate electrode and the second end of the first gate electrode, each strap contact extending between the first gate electrode and the first wiring line in the vertical direction, wherein each strap contact arranged along the first row is referred to as a 1th strap contact.

In one embodiment, two adjacent 1th strap contacts of the plurality of 1th contacts have only one or two transistors of the first set of transistors disposed between them in the first direction.

In one embodiment, the plurality of strap contacts includes at least three strap contacts.

In one embodiment, the nonvolatile memory device further includes a second gate electrode extending along a second row of the plurality of rows and connected to a second set of transistors in the second row, the second row being parallel to the first row; and at least a first contact arranged in the second row and extending vertically from the second gate electrode to connect to a word line.

In one embodiment, the first set of transistors are rupture transistors of respective fuse circuits; and the second set of transistors are access transistors of respective fuse circuits, wherein each rupture transistor corresponds to an access transistor to form a fuse circuit.

In one embodiment, the nonvolatile memory device further includes first through fourth active regions which extend along a second direction different from the first direction and are arranged sequentially along the first direction, wherein the first gate electrode is formed on the first through fourth active regions to intersect the first through fourth active regions, and the second gate electrode is formed on the first through fourth active regions to intersect the first through fourth active regions, wherein a first 1th strap contact connects the first wiring line and the first gate electrode between the first active region and the second active region, and wherein a second 1th strap contact connects the first wiring line and the first gate electrode between the third active region and the fourth active region.

In one embodiment, the number of strap contacts extending between the first gate electrode and first wiring line is different from the number of contacts extending vertically from the second gate electrode.

In one embodiment, a memory device includes: first through fourth active regions arranged sequentially along a first direction, and which extend along a second direction different from the first direction; a first gate electrode formed on the first through fourth active regions to intersect the first through fourth active regions, and extending along the first direction; a second gate electrode formed on the first through fourth active regions to intersect the first through fourth active regions, extending along the second direction, and arranged so that no other gate electrodes are between the first gate electrode and the second gate electrode in the second direction; the first gate electrode extending between a first end and a second end; a first wiring line which is formed on the first gate electrode; a first strap contact, which connects the first wiring line and the first gate electrode between the first active region and the second active region; and a second strap contact, which connects the first wiring line and the first gate electrode between the third active region and the fourth active region.

The memory device may further comprising a third strap contact, which connects the first wiring line and the first gate electrode between the second active region and the third active region.

In one embodiment, the first gate electrode is a gate electrode for a set of rupture transistors of an antifuse circuit; and the second gate electrode is a gate electrode for a set of access transistors of an antifuse circuit.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
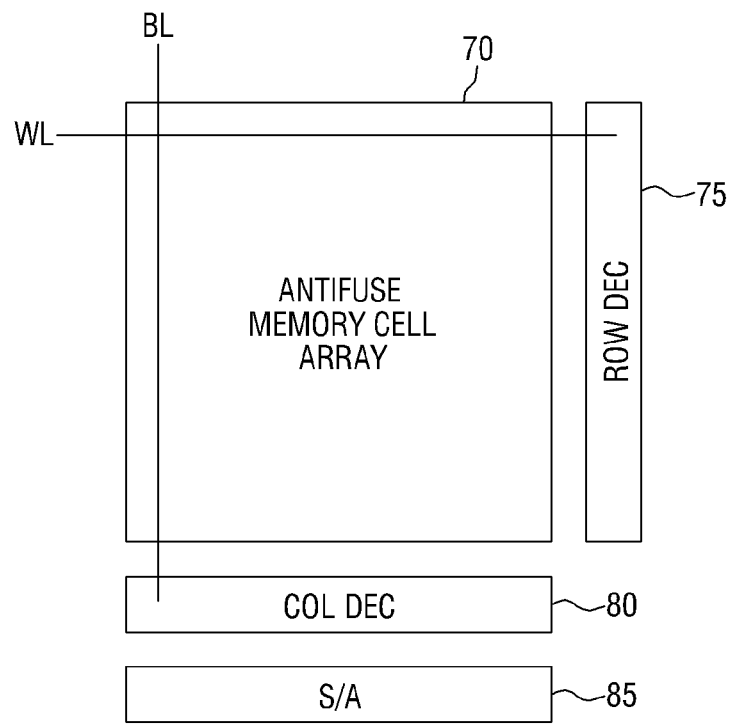
FIG. 1 is a conceptual diagram of a memory apparatus including a nonvolatile memory device according to embodiments of the present invention.

The present disclosure will now be described more fully hereinafter with reference to the accompanying drawings, in which various embodiments of the invention are shown. This invention may, however, be embodied in different forms and should not be construed as limited to the embodiments set forth herein. The same reference numbers indicate the same or similar components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, or as "contacting" another element or layer, there are no intervening elements or layers present. It will also be understood that when a layer is referred to as being "on" another layer or substrate, it can be directly on the other layer or substrate, or intervening layers may also be present. In contrast, when an element is referred to as being "directly on" another element, there are no intervening elements present.

As used herein, the term "and/or" includes any and all combinations of one or more of the associated listed items.

It will be understood that, although the terms first, second, etc. may be used herein to describe various elements, these elements should not be limited by these terms. Unless the context indicates otherwise, these terms are only used to distinguish one element from another element, for example as a naming convention. Thus, for example, a first element, a first component or a first section discussed below could be termed a second element, a second component or a second section without departing from the teachings of the present invention.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Figure 2:
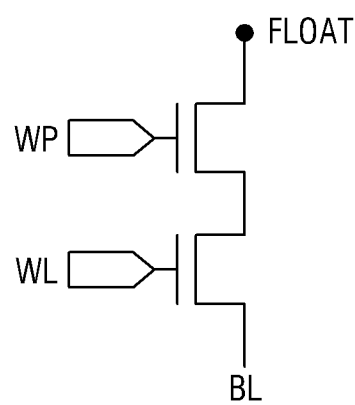
FIG. 2 is a circuit diagram of one antifuse memory cell, according to certain embodiments.

FIG. 1 is a conceptual diagram of a memory apparatus including a nonvolatile memory device according to certain embodiments of the present invention. FIG. 2 is a circuit diagram of one antifuse memory cell.

As used herein, a memory device may refer to a semiconductor device that includes a memory array. For example, a semiconductor device may refer to an array of transistors, or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices. A memory device may therefore refer to one of these semiconductor devices that include a memory array.

An electronic device, as used herein, may refer to these semiconductor devices or memory devices, but may additionally include products that include these devices, such as a memory module, memory card, hard drive including additional components, or a mobile phone, laptop, tablet, desktop, camera, or other consumer electronic device, etc.

Referring to FIG. 1, the memory apparatus includes a memory cell array 70, a row decoder 75, a column decoder 80, and a sense amplifier 85.

The memory cell array 70 includes a plurality of antifuse memory cells located between X bit lines BL and Y word lines WL, where X and Y are integers of one or more.

Each of the antifuse memory cells is connected between a bit line BL and a word line WL as illustrated in FIG. 2. Each of the antifuse memory cells includes two transistors; an access transistor and a rupture transistor. The access transistor has a gate terminal connected to a word line WL, a source terminal connected to a drain terminal of the rupture transistor, and a drain terminal connected to a bit line BL. The rupture transistor has a gate terminal connected to a high-voltage line WP, a source terminal connected to a floating terminal FLOAT, and the drain terminal connected to the source terminal of the access transistor.

The row decoder 75 selects a word line WL based on a row of a target cell to be accessed in the memory cell array 70, i.e., based on a decoded word line address.

The column decoder 80 selects a bit line BL based on a column of the target cell to be accessed in the memory cell array 70, i.e., based on a decoded bit line address.

The sense amplifier 85 is connected to an end of each of the bit lines BL to sense and amplify data of the target cell and output the sensed and amplified data.

A nonvolatile memory device according to a first embodiment of the present invention will now be described with reference to FIGS. 3 through 5.

Figure 3:
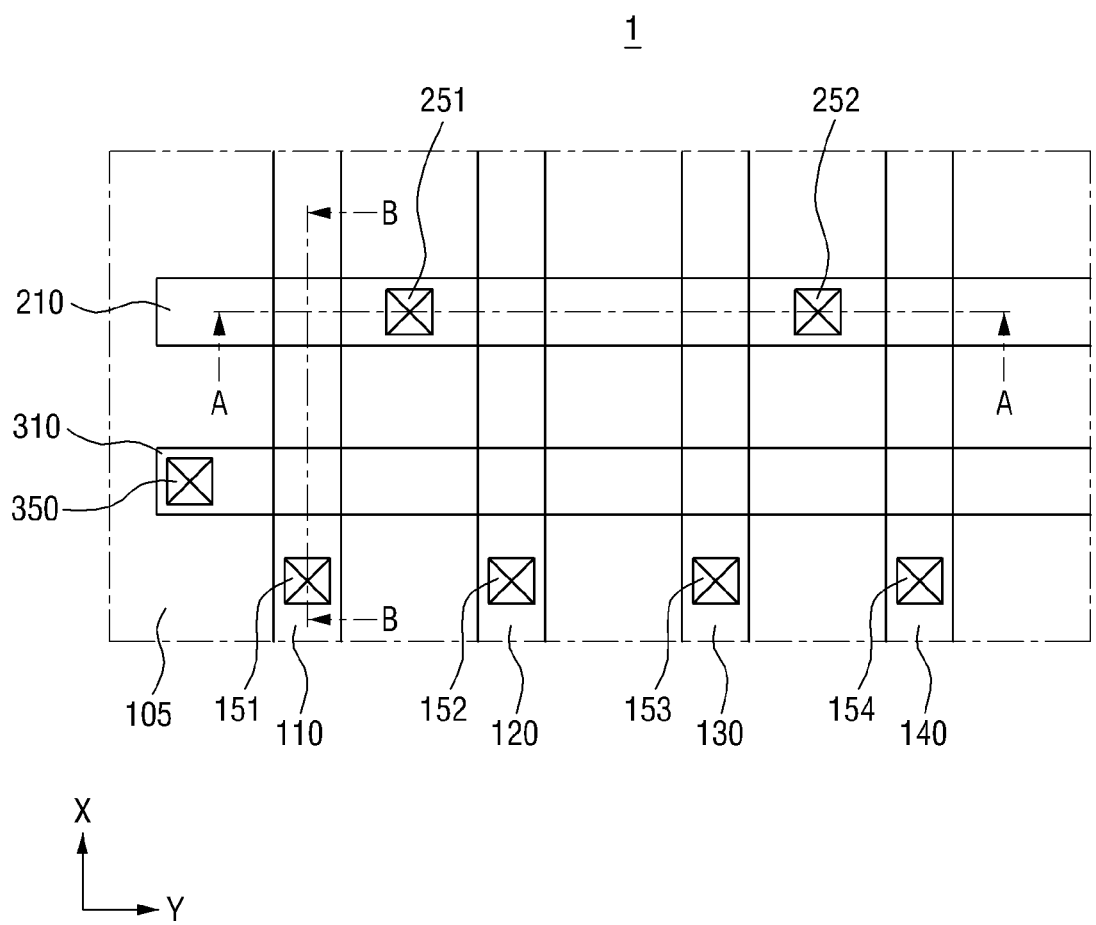
FIG. 3 is a layout view of a nonvolatile memory device according to a first embodiment of the present invention.

FIG. 3 is a layout view of a nonvolatile memory device 1 according to a first embodiment of the present invention. FIGS. 4 and 5 respectively are cross-sectional views taken along the lines A-A and B-B of FIG. 3. In the layout view of FIG. 3, active regions, gate electrodes, and contacts only are illustrated.

Figure 4:
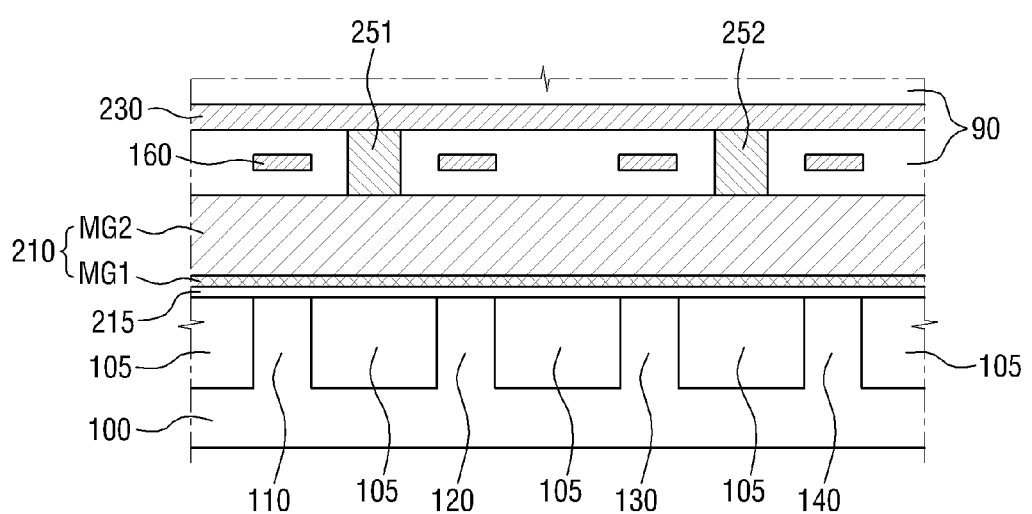
FIGS. 4 and 5 respectively are exemplary cross-sectional views taken along the lines A-A and B-B of FIG. 3, according to one embodiment.
Figure 5:
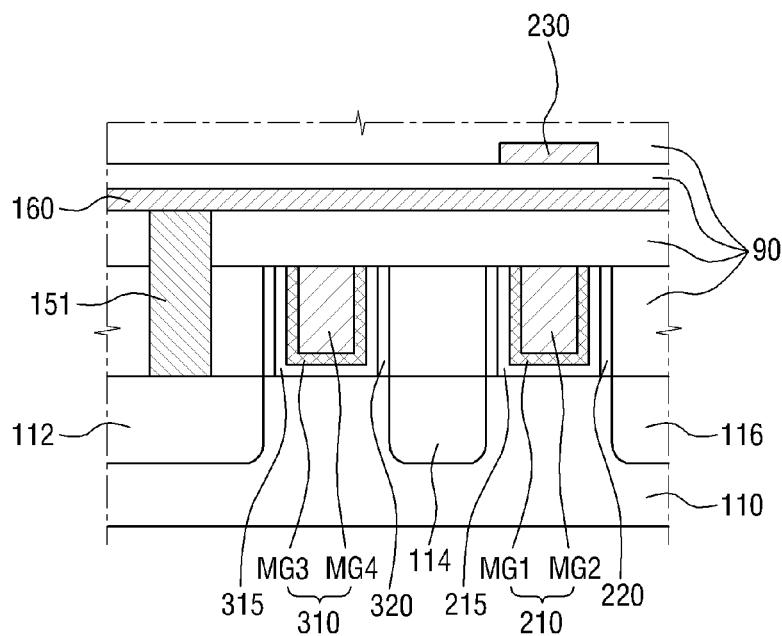

Referring to FIGS. 3 through 5, the nonvolatile memory device 1 according to the first embodiment of the present invention includes a first active region 110, a second active region 120, a third active region 130, a fourth active region 140, a first gate electrode 210, a second gate electrode 310, a first wiring line 230, a first vertical connector 251, also described as a first strap contact 251, or a (1_1)th strap contact 251, and a second vertical connector 252, also described as a second strap contact 252, or a (1_2)th strap contact 252. The first strap contact 251 and second strap contact 252 are both disposed along a first row, and being part of that first row, these contacts may also be referred to as a first 1th contact and a second 1th contact. These terms (e.g., "1th" and (1_1)th) are used for naming purposes to distinguish different contacts and different rows from each other.

A substrate 100 may be, for example, a bulk silicon substrate or a silicon-on-insulator (SOI) substrate. Otherwise, the substrate 100 may be a silicon substrate or may be a substrate formed of another material such as silicon germanium, indium antimonide, lead telluride, indium arsenide, indium phosphide, gallium arsenide, or gallium antimonide. Alternatively, the substrate 100 may consist of a base substrate and an epitaxial layer formed on the base substrate.

The first active region 110, the second active region 120, the third active region 130, and the fourth active region 140 may be defined in the substrate 100. For example, the first through fourth active regions 110 through 140 may be defined by a field insulating layer 105 formed in the substrate 100. The field insulating layer 105 may include one of, e.g., an oxide layer, a nitride layer, an oxynitride layer, and combinations of the same.

The first through fourth active regions 110 through 140 may extend along a first direction X. In addition, the first through fourth active regions 110 through 140 may be arranged along a second direction Y. The first through fourth active regions 110 through 140 may be arranged sequentially along the second direction Y. Note that the names of the directions, e.g., "first" and "second" are not necessarily used in all parts of this specification to refer to the respective X and Y directions depicted in FIG. 3. For example, in certain portions of this specification and/or claims, a "first" direction is used to refer to a direction along the Y axis shown in FIG. 3, and a "second" direction is used to refer to a direction along the X axis as shown in FIG. 3.

In one embodiment, each of the first through fourth active regions 110 through 140 may include long sides extending along the first direction X and short sides extending along the second direction Y. In the first through fourth active regions 110 through 140 arranged sequentially along the second direction Y, the long sides of the first active region 110, the long sides of the second active region 120, the long sides of the third active region 130, and the long sides of the fourth active region 140 may face one another.

In nonvolatile memory devices according to certain embodiments of the present invention, the second active region 120 may be most adjacent to the first active region 110 and the third active region 130, and the third active region 130 may be most adjacent to the fourth region 140. Here, when "the first active region 110 and the second active region 120 are most adjacent to each other," it means that there is no active region present between the first active region 110 and the second active region 120. Such active regions may also be described here as adjacent active regions with no active regions therebetween, or directly adjacent active regions.

In FIG. 3, four active regions 110 through 140 are illustrated. However, this is merely an example used for ease of description, and the present invention is not limited to this example. That is, a plurality of active regions may be formed additionally and arranged sequentially along the second direction Y after the fourth active region 140.

The first gate electrode 210 is formed on the substrate 100. More specifically, the first gate electrode 210 is formed on the first through fourth active regions 110 through 140. The first gate electrode 210 may extend along the second direction Y and intersect the first through fourth active regions 110 through 140.

The second gate electrode 310 is formed on the first through fourth active regions 110 through 140. The second gate electrode 310 may extend along the second direction Y and intersect the first through fourth active regions 110 through 140.

Respective ends of the first gate electrode 210 and the second gate electrode 310 protrude from the first active region 110 in the second direction Y. In certain embodiments, each of the first gate electrode 210 and the second gate electrode 310 have a first end and a second, opposite end, and the active regions are positioned between the first end and the second end. In certain embodiments, no active region intersecting the first gate electrode 210 and the second gate electrode 310 is formed on a side of the first active region 110 which is not adjacent to the second active region 120 (e.g., the left side in FIG. 3).

In one embodiment, the second gate electrode 310 is formed side by side with the first gate electrode 210. The first gate electrode 210 and the second gate electrode 310 are arranged in the first direction X, and may extend in the second direction Y. The second gate electrode 310 is most adjacent to the first gate electrode 210, and may be a directly adjacent gate electrode to the first gate electrode 210. The first gate electrode 210 and second gate electrode 310 may be parallel to each other such that they extend in one direction (e.g., the Y direction) and are separated from each other in a second direction (e.g., the X direction).

The first gate electrode 210 may include metal layers (MG1, MG2). As illustrated in the drawings, the first gate electrode 210 may be formed by stacking two or more metal layers (MG1, MG2), but the present invention is not limited thereto. A first metal layer MG1 may control a work function, and a second metal layer MG2 may fill a space formed by the first metal layer MG1. For example, the first metal layer MG1 may include at least one of TiN, TaN, TiC, and TaC. In addition, the second metal layer MG2 may include W or Al. Alternatively, the first gate electrode 210 may be made of a material (e.g., Si or SiGe) other than metal. The material that forms the first gate electrode 210 may be a conductive material. The first gate electrode 210 may be formed by, but is not limited to, a replacement process.

As illustrated in the drawings, the second gate electrode 310 may also be formed by stacking two or more metal layers (MG3, MG4), but the present invention is not limited thereto. Since a description of the material that forms the second gate electrode 310 can be a repetition of the description of the material that forms the first gate electrode 210, it will be omitted.

One antifuse memory cell may include two gate electrodes and one active region. For example, one antifuse memory cell may include the first gate electrode 210, the second gate electrode 310, and the first active region 110. In one embodiment, this active region 110 and gate electrodes 210 and 310 are the only active regions and gate electrodes that make up the one antifuse memory cell.

In nonvolatile memory devices according to certain embodiments of the present invention, the second gate electrode 310 may be the gate terminal of the access transistor illustrated in FIG. 2. As such, the second gate electrode 310 may be connected to the word line WL.

In addition, in semiconductor devices according to embodiments of the present invention, the first gate electrode 210 may be the gate terminal of the rupture transistor illustrated in FIG. 2. As such, the first gate electrode 210 may be connected to the high-voltage line WP.

A first gate insulating layer 215 may be formed between the first through fourth active regions 110 through 140 and the first gate electrode 210. In addition, the first gate insulating layer 215 may be formed between the first gate electrode 210 and the field insulating layer 105.

A second gate insulating layer 315 may be formed between the first through fourth active regions 110 through 140 and the second gate electrode 310. In addition, the second gate insulating layer 315 may be formed between the second gate electrode 310 and the field insulating layer 105.

Each of the first gate insulating layer 215 and the second gate insulating layer 315 may include, for example, silicon oxide, silicon nitride, silicon oxynitride, or a high-k material. For example, the high-k material may include one or more of, but not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

First gate spacers 220 may be formed on sidewalls of the first gate electrode 210. Second gate spacers 320 may be formed on sidewalls of the second gate electrode 310. Each of the first and second gate spacers 220 and 320 may include at least one of silicon nitride (SiN), silicon oxynitride (SiON), silicon oxide (SiO2), silicon oxycarbonitride (SiOCN), and combinations of the same. In the drawings, each of the first and second gate spacers 220 and 320 is illustrated as a single layer. However, the present invention is not limited thereto, and each of the first and second gate spacers 220 and 320 may also have a multilayer structure.

A first impurity region 114 may be formed between the first gate electrode 210 and the second gate electrode 310. The first impurity region 114 may be shared by the first gate electrode 210 and the second gate electrode 310.

A second impurity region 112 may be formed on a side of the second gate electrode 310. Therefore, the second impurity region 112 may be formed on a side of the second gate electrode 310, and the first impurity region 114 may be formed on the other side of the second gate electrode 310.

A third impurity region 116 may be formed on a side of the first gate electrode 210. Therefore, the third impurity region 116 may be formed on a side of the first gate electrode 210, and the first impurity region 114 may be formed on the other side of the first gate electrode 210.

In semiconductor devices according to embodiments of the present invention, if the second gate electrode 310 is a gate terminal of a p-channel metal oxide semiconductor (PMOS) transistor, the first, second and third impurity regions 114, 112 and 116 may include, e.g., p-type impurities. The p-type impurities may be, but are not limited to, boron (B).

In semiconductor devices according to embodiments of the present invention, if the second gate electrode 310 is a gate terminal of an n-channel metal oxide semiconductor (NMOS) transistor, the first, second and third impurity regions 114, 112 and 116 may include, e.g., n-type impurities. The n-type impurities may be, but are not limited to, P, As, or Sb.

In semiconductor devices according to embodiments of the present invention, the first impurity region 114 may be the source terminal of the access transistor and the drain terminal of the rupture transistor illustrated in FIG. 2. In addition, the second impurity region 112 may be the drain terminal of the access transistor and is connected to the bit line BL. The third impurity region 116 may be the source terminal of the rupture transistor and is connected to the floating terminal FLOAT.

As illustrated in FIGS. 2 and 5, a contact electrically connected to the first impurity region 114 is not formed in the first impurity region 114. Therefore, the first impurity region 114 is not electrically connected to a wiring line to which a voltage or current is supplied from an external source or a wiring line which supplies a voltage or current to an external destination.

The first, second and third impurity regions 114, 112 and 116 formed in the first active region 110 have been described above as an example. The description of the first, second and third impurity regions 114, 112 and 116 formed in the first active region 110 can be applied to the second through fourth active regions 120 through 140. Therefore, the first gate electrode 210 may cross and connect to a plurality of transistors (e.g., rupture transistors) in the Y direction, and the second gate electrode 310 may cross and connect to a plurality of transistors (e.g., access transistors) in the Y direction. In each case, the plurality of transistors, as well as a plurality of strap contacts, described further below, may be arranged in one direction (e.g., the Y direction) along a gate electrode, and between a first and second end of the gate electrode. As a result, a plurality of fuse circuits, each including an access transistor and a fuse transistor, may be arranged along the direction of the gate electrodes, thus forming part of an anti-fuse memory cell array.

A first bit line contact 151 is electrically connected to the first active region 110, and a second bit line contact 152 is electrically connected to the second active region 120. In addition, a third bit line contact 153 is electrically connected to the third active region 130, and a fourth bit line contact 154 is electrically connected to the fourth active region 140.

For example, the first bit line contact 151 penetrates through part of an interlayer insulating film 90 and is disposed on the first active region 110. The first bit line contact 151 is electrically connected to the second impurity region 112 formed in the first active region 110. The first bit line contact 151 formed on the first active region 110 may be connected to a bit line 160 formed on the substrate 100. Therefore, the second impurity region 112 may be connected to the bit line 160 by the first bit line contact 151.

The first bit line contact 151 may include, but is not limited to, Al, Cu, W, etc. In addition, the bit line 160 may include, but is not limited to, Al, Cu, etc.

The description of the first bit line contact 151 can be applied to each of the first through fourth bit line contacts 152 through 154. The second through fourth bit line contacts 152 through 154 may be connected to different bit lines, respectively.

The first through fourth bit line contacts 151 through 154 respectively and electrically connected to the first through fourth active regions 110 through 140 may be arranged in a row along the second direction Y.

In one embodiment, all of the first through fourth bit line contacts 151 through 154 are located at the same side surface of the second gate electrode 310 in the first direction X. As such, the second gate electrode 310 is located between the first through fourth bit line contacts 151 through 154 arranged in a row and the first gate electrode 210. For example, the second gate electrode 310 is disposed between the first bit line contact 151 and the first gate electrode 210.

The first wiring line 230 is formed on the first gate electrode 210. The first wiring line 230 extends along the first gate electrode 210 in the second direction Y.

In one embodiment, the first wiring line 230 is arranged to apply a uniform voltage to the first gate electrode 210. The first wiring line 230 may be the high-voltage line WP described above with reference to FIG. 2. Alternatively, the first wiring line 230 may be a connecting line which connects the first gate electrode 210 and the high-voltage line WP.

The first wiring line 230 may include, but is not limited to, Al or Cu.

The first wiring line 230 is disposed above the first gate electrode 210, such that it is separated from the first gate electrode 210 by a particular distance in a vertical direction. In one embodiment, the first wiring line 230 has a thickness in a vertical direction less than a thickness of the first gate electrode 210 in the vertical direction. In the drawings, the first wiring line 230 is located further away from a top surface of the substrate 100 than the bit line 160. However, the present invention is not limited thereto.

The (1_1)th strap contact 251 connects the first wiring line 230 and the first gate electrode 210. The (1_2)th strap contact 252 connects the first wiring line 230 and the first gate electrode 210. That is, the first gate electrode 210 is electrically connected to the first wiring line 230 by a plurality of first strap contacts 251 and 252, also referred to as a plurality of 1th strap contacts. In this manner, a plurality of strap contacts, positioned between ends of the first gate electrode 210, may connect the first gate electrode 210 to the first wiring line 230. The strap contacts may be arranged in the direction that first gate electrode 210 and wiring line 230 extend. The first gate electrode 210 connected to the wiring line 230 by a plurality of strap contacts may be referred to as a strapped gate electrode.

In one embodiment, the (1_1)th strap contact 251 is formed between the first active region 110 and the second active region 120. The (1_2)th strap contact 252 is formed between the third active region 130 and the fourth active region 140. The (1_1)th strap contact 251 is formed on the first gate electrode 210 between the first active region 110 and the second active region 120, and the (1_2)th strap contact 252 is formed on the first gate electrode 210 between the third active region 130 and the fourth active region 140.

In one embodiment, the (1_1)th strap contact 251 and the (1_2)th strap contact 252 are formed not on the first through fourth active regions 110 through 140 but on the field insulating layer 105.

The (1_1)th strap contact 251 may be positioned between and shared by two antifuse memory cells defined respectively by the first active region 110 and the second active region 120, and the (1_2)th strap contact 252 may be positioned between and shared by two antifuse memory cells defined respectively by the third active region 130 and the fourth active region 140.

Though not shown, additional active regions and strap contacts, and thus additional transistors and antifuse memory cells, may be included in an antifuse memory cell array such as shown in FIG. 3. For example, the pattern may continue toward the right in FIG. 3, in one embodiment, up to the other end of the first gate electrode 210. As such, the strap contacts connected to the first gate electrode 210 may include at least 3 strap contacts, wherein a second strap contact is between a first strap contact and a third contact such that the first strap contact is at one side of the second contact, and the third strap contact is at the other side of the second contact. In an embodiment such as shown in FIG. 3, two transistors may be positioned between two directly adjacent strap contacts.

In one embodiment, a second normal contact 350 is formed on the second gate electrode 310 to be connected to the second gate electrode 310. The second normal contact 350 connects the second gate electrode 310 to a word line WL described above with reference to FIG. 2.

The word line WL which applies a gate voltage to the second gate electrode 310 is electrically connected to the second gate electrode 310 by the second normal contact 350. One second normal contact 350 may be connected to the second gate electrode 310. For example, in one embodiment, unlike the first gate electrode 210, the second gate electrode 310 may be connected to the word line WL by only one contact, for example, one second normal contact 350 connected at an end of the second gate electrode 310. In this example, the second gate electrode 310 is not a strapped gate electrode, as it does not connect to a wiring line using strap contacts.

As a result, in this embodiment, no contact used to apply a gate voltage to the second gate electrode 310 is additionally formed between the first active region 110 and the fourth active region 140. As such, no contacts or strap contacts are disposed along the second gate electrode 310 between outer-most transistors in the same row as and connected to the second gate electrode 310.

Figure 6:
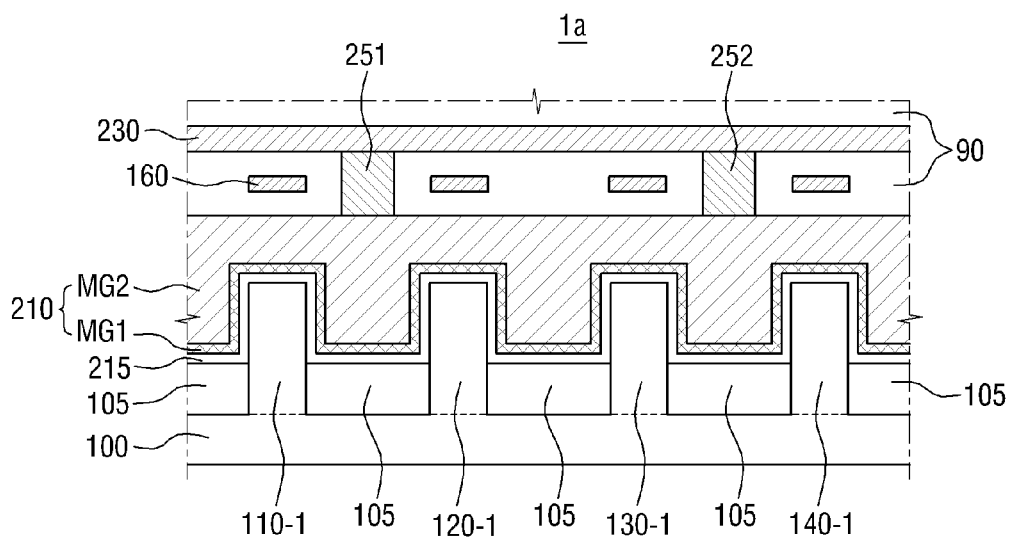
FIGS. 6 and 7 are views illustrating modified examples of the nonvolatile memory device according to the first embodiment of the present invention.
Figure 7:
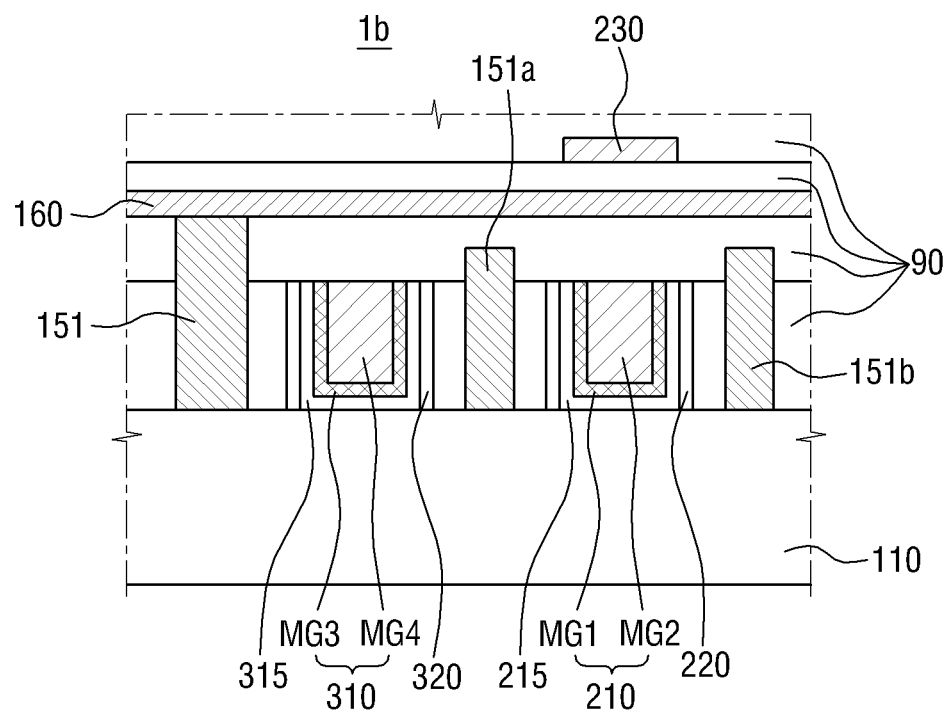

FIGS. 6 and 7 are views illustrating modified examples of the nonvolatile memory device 1 according to the first embodiment of the present invention.

Referring to FIG. 6, in a first modified example 1a of the nonvolatile memory device 1 according to the first embodiment of the present invention, first through fourth active regions 110 through 140 are first through fourth fin-type active patterns 110-1 through 140-1, respectively.

The first through fourth fin-type active patterns 110-1 through 140-1 protrude from a substrate 100. A field insulating layer 105 partially covers sidewalls of each of the first through fourth fin-type active patterns 110-1 through 140-1. Accordingly, a top surface of each of the first through fourth fin-type active patterns 110-1 through 140-1 protrudes further upward than a top surface of the field insulating layer 105.

Each of the first through fourth fin-type active patterns 110-1 through 140-1 may include an element semiconductor material such as silicon or germanium. In addition, each of the first through fourth fin-type active patterns 110-1 through 140-1 may include a compound semiconductor such as a group IV-IV compound semiconductor or a group III-V compound semiconductor.

Specifically, the group IV-IV compound semiconductor that forms each of the first through fourth fin-type active pattern 110-1 through 140-1 may be a binary or ternary compound containing two or more of carbon (C), silicon (Si), germanium (Ge) and tin (Sn) or a compound obtained by doping the binary or ternary compound with a group IV element.

The group III-V compound semiconductor that forms each of the first through fourth fin-type active patterns 110-1 through 140-1 may be a binary, ternary, or quaternary compound composed of at least one of aluminum (Al), gallium (Ga) and indium (In) (i.e., group III elements) bonded with one of phosphorus (P), arsenic (As) and antimony (Sb) (i.e., group V elements).

Referring to FIG. 7, in a second modified example 1b of the nonvolatile memory device 1 according to the first embodiment of the present invention, dummy plugs (151a, 151b) connected to first through fourth active regions 110 through 140 may be disposed on the first through fourth active regions 110 through 140 between a first gate electrode 210 and a second gate electrode 310.

For example, a first dummy plug 151a is formed on a first impurity region 114 to be connected to the first active region 110. A second dummy plug 151b is formed on a third impurity region 116 to be connected to the first active region 110.

In the drawing, both the first dummy plug 151a and the second dummy plug 151b are illustrated. However, the present invention is not limited thereto, and only one of the first dummy plug 151a and the second dummy plug 151b can be formed.

Since the first impurity region 114 is not electrically connected to a wiring line to which a voltage or current is supplied from an external source or a wiring line which supplies a voltage or current to an external destination, no contact connected to a wiring line is formed on each of the first dummy plug 151a and the second dummy plug 151b.

Figure 8:
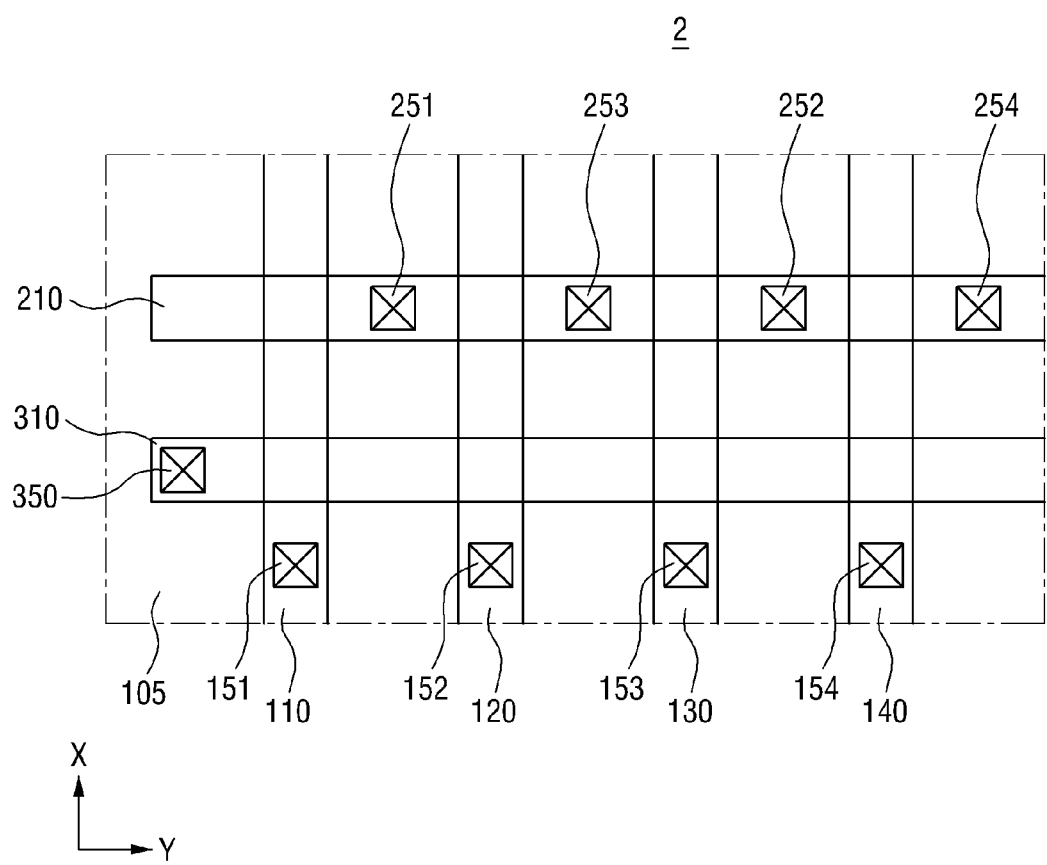
FIG. 8 is a layout view of a nonvolatile memory device according to a second embodiment of the present invention.

FIG. 8 is a layout view of a nonvolatile memory device 2 according to a second embodiment of the present invention. For simplicity, the current embodiment will hereinafter be described, focusing mainly on differences with the embodiment of FIGS. 3 through 5.

Referring to FIG. 8, the nonvolatile memory device 2 according to the second embodiment of the present invention further includes a (1_3)th strap contact 253 and a (1_4)th strap contact 254.

The (1_3)th strap contact 253 connects a first wiring line 230 and a first gate electrode 210. The (1_4)th strap contact 254 also connects the first wiring line 230 and the first gate electrode 210.

The (1_3)th strap contact 253 is formed between a second active region 120 and a third active region 130. The (1_3)th strap contact 253 is formed on the first gate electrode 210 between the second active region 120 and the third active region 130.

The (1_4)th strap contact 254 is not formed between a first active region 110 and a fourth active region 140. For example, the (1_4)th strap contact 254 may be formed between the fourth active region 140 and an active region most adjacent to the fourth active region 140 (to the right of strap contact 254 and not shown in FIG. 8). The (1_4)th strap contact 254 is formed on the first gate electrode 210 protruding from the fourth active region 140.

The first strap contacts 251 through 254 are formed not on the first through fourth active regions 110 through 140 but on a field insulating layer 105 between the first through fourth active regions 110 through 140.

The (1_1)th strap contact 251 corresponds to an antifuse memory cell defined by the first active region 110, and the (1_2)th strap contact 253 corresponds to an antifuse memory cell defined by the second active region 120. Therefore, one first strap contact may be formed in each of antifuse memory cells that share the first gate electrode 210.

In FIG. 8, no strap contact is formed at an end of the first gate electrode 210 which protrudes from the first active region 110 in a second direction Y. However, the present invention is not limited thereto.

As shown in FIG. 8, the strap contacts connected to the first gate electrode 210 may include at least 3 strap contacts, wherein a second strap contact is between a first strap contact and a third contact such that the first strap contact is at one side of the second contact, and the third strap contact is at the other side of the second contact. In an embodiment such as shown in FIG. 8, one transistor is positioned between two directly adjacent strap contacts. Also, though not shown, additional active regions and strap contacts, and thus additional transistors and antifuse memory cells may be included in an antifuse memory cell array such as shown in FIG. 8. For example, the pattern may continue toward the right in FIG. 8, in one embodiment, up to the other end of the first gate electrode 210.

Figure 9A:
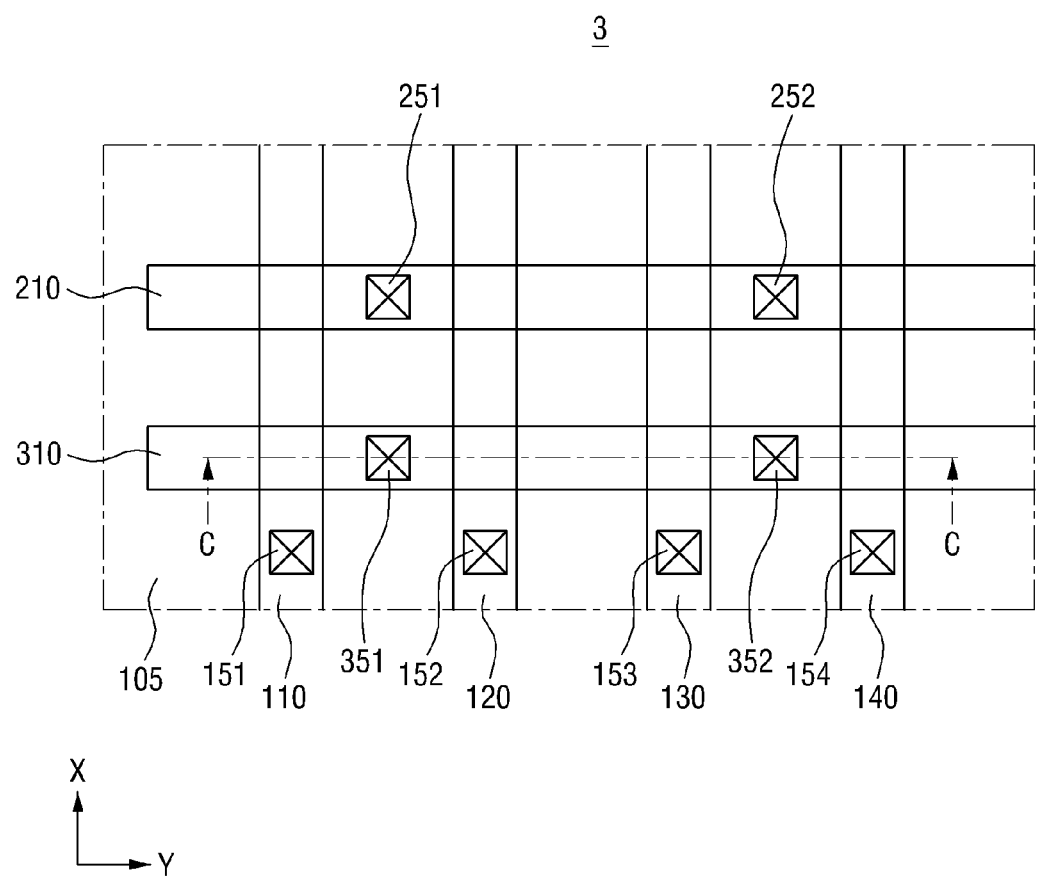
FIGS. 9A and 9B are views illustrating a nonvolatile memory device according to a third embodiment of the present invention.
Figure 9B:
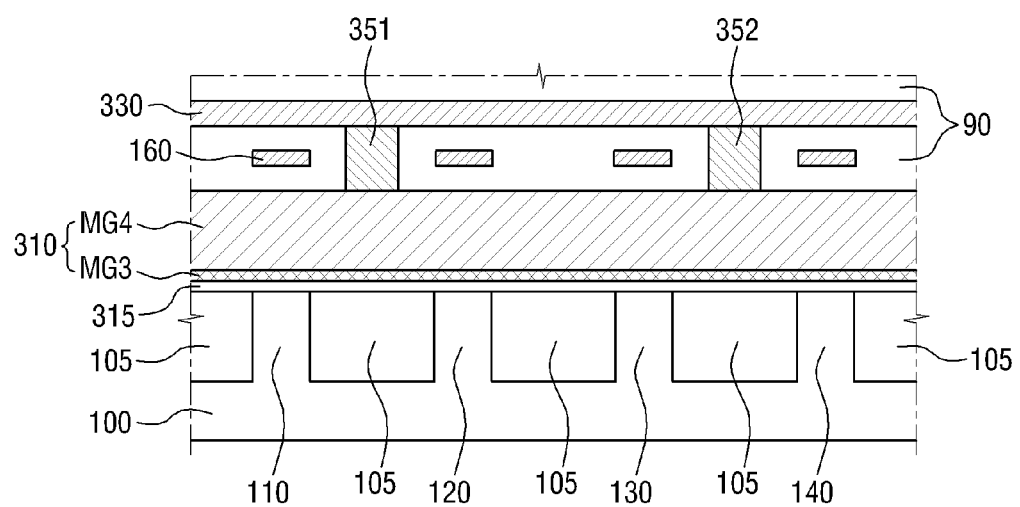

FIGS. 9A and 9B are views illustrating a nonvolatile memory device according to a third embodiment of the present invention. For simplicity, the current embodiment will hereinafter be described, focusing mainly on differences with the embodiment of FIGS. 3 through 5.

FIG. 9A is a layout view of a nonvolatile memory device 3 according to a third embodiment of the present invention. FIG. 9B is a cross-sectional view taken along the line C-C of FIG. 9A. In the layout view of FIG. 9A, active regions, gate electrodes, and contacts only are illustrated.

Referring to FIGS. 9A and 9B, the nonvolatile memory device 3 according to the third embodiment of the present invention further includes a second wiring line 330, a (2_1)th strap contact 351, and a (2_2)th strap contact 352.

The second wiring line 330 is formed on a second gate electrode 310. The second wiring line 330 extends along the second gate electrode 310 in a second direction Y.

In one embodiment, the second wiring line 330 is arranged to apply a uniform voltage to the second gate electrode 310. The second wiring line 330 may be a word line WL described above with reference to FIG. 2. Alternatively, the second wiring line 330 may be a connecting line which connects the second gate electrode 310 to the word line WL.

The second wiring line 330 may include, but is not limited to, Al or Cu.

The (2_1)th strap contact 351 (also described as a first 2th strap contact) connects the second wiring line 330 and the second gate electrode 310. The (2_2)th strap contact 352 (also described as a second 2th strap contact) connects the second wiring line 330 and the second gate electrode 310. For example, the second gate electrode 310 is electrically connected to the second wiring line 330 by a plurality of second strap contacts 351 and 352.

The (2_1)th strap contact 351 is formed between a first active region 110 and a second active region 120. The (2_2)th strap contact 352 is formed between a third active region 130 and a fourth active region 140. The (2_1)th strap contact 351 is formed on the second gate electrode 310 between the first active region 110 and the second active region 120, and the (2_2)th strap contact 352 is formed on the second gate electrode 310 between the third active region 130 and the fourth active region 140.

In one embodiment, the (2_1)th strap contact 351 and the (2_2)th strap contact 352 are formed not on the first through fourth active regions 110 through 140 but on a field insulating layer 105.

The (2_1)th strap contact 351 may be shared by two antifuse memory cells defined respectively by the first active region 110 and the second active region 120, and the (2_2)th strap contact 352 may be shared by two antifuse memory cells defined respectively by the third active region 130 and the fourth active region 140.

Therefore, two antifuse memory cells defined respectively by the first active region 110 and the second active region 120 share the (1_1)th strap contact 251 and the (2_1)th strap contact 351. In addition, two antifuse memory cells defined respectively by the third active region 130 and the fourth active region 140 share the (1_2)th strap contact 252 and the (2_2)th strap contact 352.

The (1_1)th strap contact 251 and the (2_1)th strap contact 351 are disposed between the first active region 110 and the second active region 120 and are arranged in a first direction X. In addition, the (1_2)th strap contact 252 and the (2_2)th strap contact 352 are disposed between the third active region 130 and the fourth active region 140 and are arranged in the first direction X.

Though not shown, additional active regions and strap contacts, and thus additional transistors and antifuse memory cells, may be included in an antifuse memory cell array such as shown in FIGS. 9a and 9b. For example, the pattern may continue toward the right in these figures, in one embodiment, up to the other end of the first gate electrode 210 and second gate electrode 310.

Figure 10:
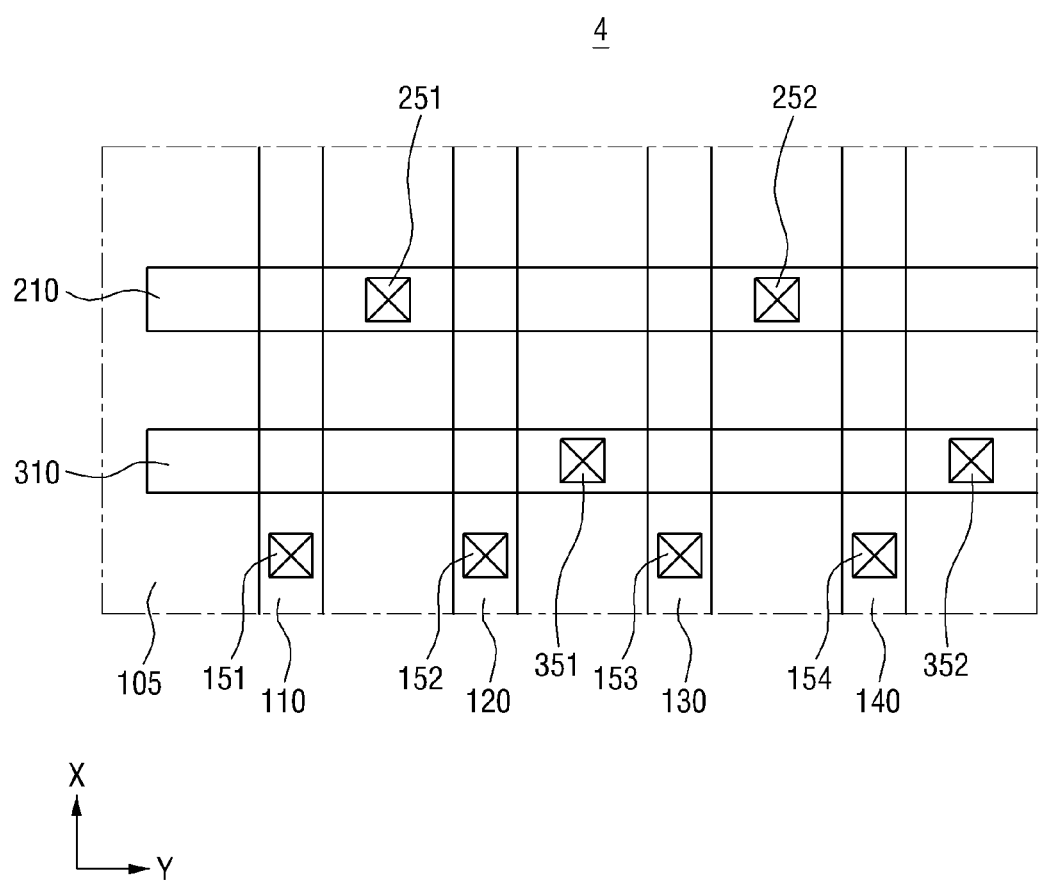
FIGS. 10 through 30 are layout views of nonvolatile memory devices according to fourth through twenty-fourth embodiments of the present invention.

FIG. 10 is a layout view of a nonvolatile memory device 4 according to a fourth embodiment of the present invention. For simplicity, the current embodiment will hereinafter be described, focusing mainly on differences with the embodiment of FIGS. 9A and 9B.

Referring to FIG. 10, in the nonvolatile memory device 4 according to the fourth embodiment of the present invention, a (2_1)th strap contact 351 is formed between a second active region 120 and a third active region 130. The (2_1)th strap contact 351 is formed on a second gate electrode 310 between the second active region 120 and the third active region 130.

In addition, a (2_2)th strap contact 352 is not formed between a first active region 110 and a fourth active region 140. For example, the (2_2)th strap contact 352 may be formed between the fourth active region 140 and an active region most adjacent to the fourth active region 140. The (2_2)th strap contact 352 is formed on the second gate electrode 310 protruding from the fourth active region 140.

In the nonvolatile memory device 4 according to the fourth embodiment of the present invention, no strap contact connected to a second wiring line 330 is formed between the first active region 110 and the second active region 120 and between the third active region 130 and the fourth active region 140.

In FIG. 10, no strap contact is formed at an end of the second gate electrode 310 which protrudes from the first active region 110 in a second direction Y. However, the present invention is not limited thereto.

Figure 11:
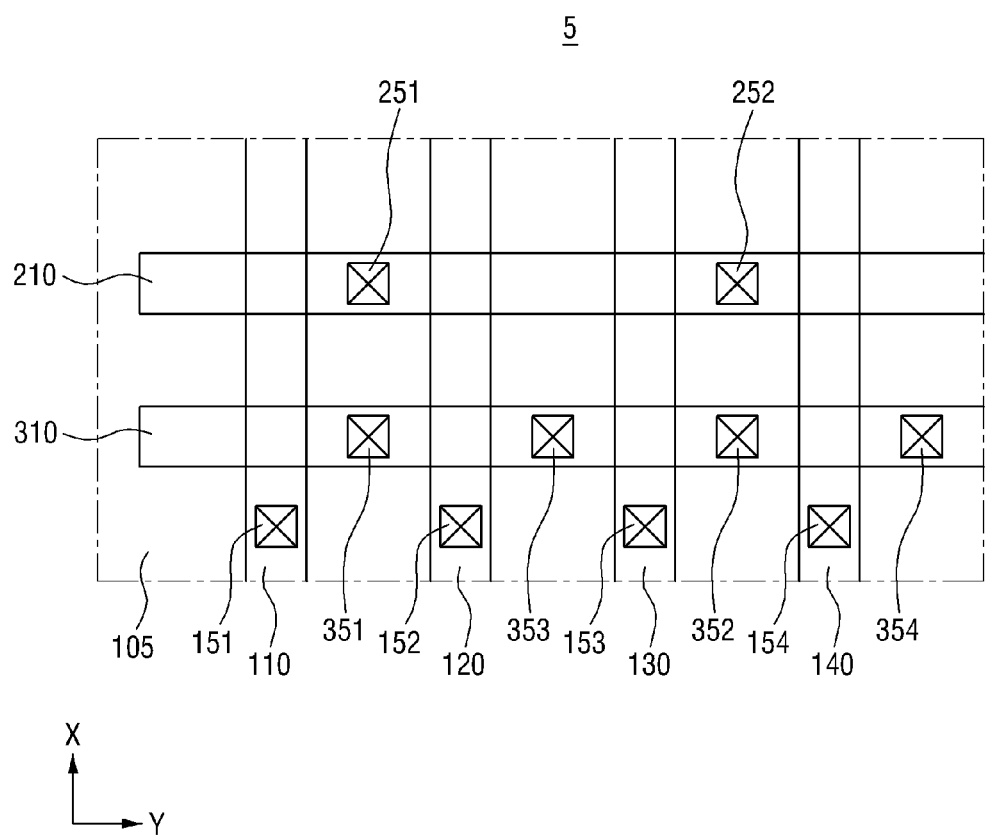

FIG. 11 is a layout view of a nonvolatile memory device 5 according to a fifth embodiment of the present invention. For simplicity, the current embodiment will hereinafter be described, focusing mainly on differences with the embodiment of FIGS. 9A and 9B.

Referring to FIG. 11, the nonvolatile memory device 5 according to the fifth embodiment of the present invention further includes a (2_3)th strap contact 353 and a (2_4)th strap contact 354.

Each of the (2_3)th strap contact 353 and the (2_4)th strap contact 354 connects a second wiring line 330 and a second gate electrode 310.

The (2_3)th strap contact 353 is formed between a second active region 120 and a third active region 130. The (2_4)th strap contact 354 is not formed between a first active region 110 and a fourth active region 140. For example, the (2_4)th strap contact 354 may be formed between the fourth active region 140 and an active region most adjacent to the fourth active region 140.

In the nonvolatile memory device 5 according to the fifth embodiment of the present invention, each of first strap contacts 251 and 253 is shared by adjacent antifuse memory cells, but the second strap contacts 351 through 354 correspond to a plurality of antifuse memory cells, respectively.

That is, in two adjacent antifuse memory cells, a first gate electrode 210 is connected to one first strap contact (251, 252), and the second gate electrode 310 is connected to two second strap contacts (351, 352, 353, 354).

In FIG. 11, no strap contact is formed at an end of the second gate electrode 310 which protrudes from the first active region 110 in a second direction Y. However, the present invention is not limited thereto.

Figure 12:
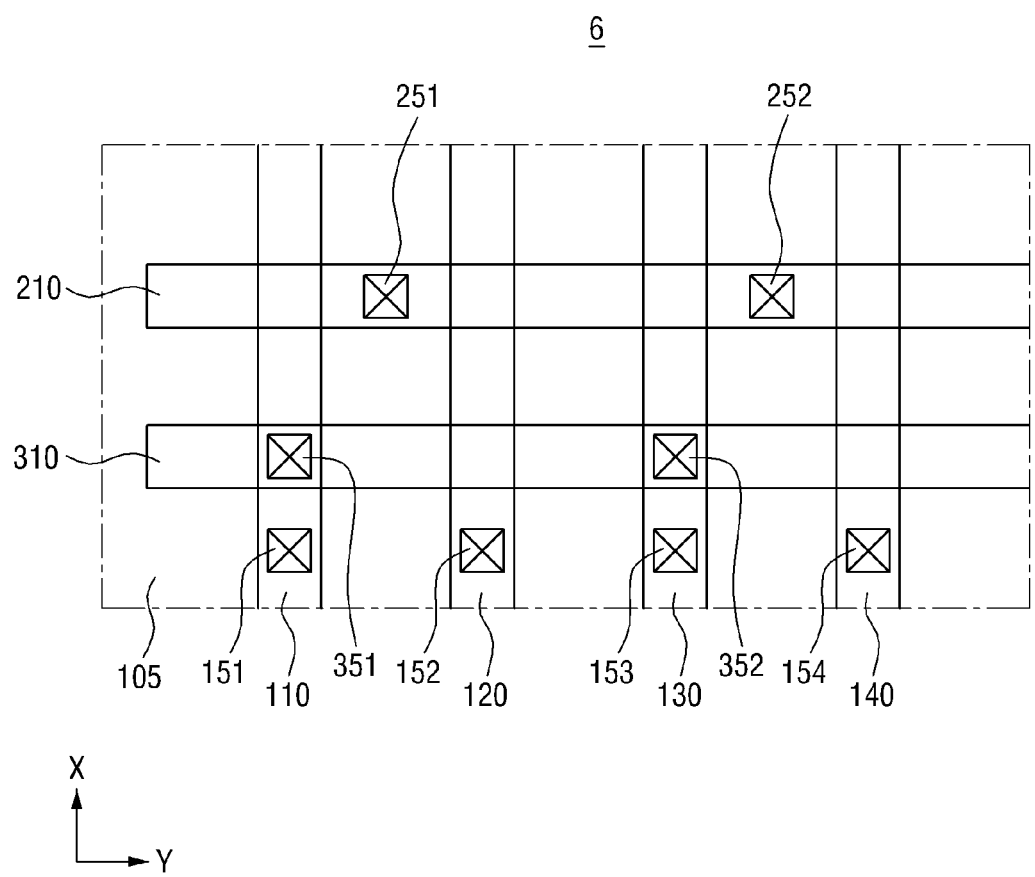

FIG. 12 is a layout view of a nonvolatile memory device 6 according to a sixth embodiment of the present invention. For simplicity, the current embodiment will hereinafter be described, focusing mainly on differences with the embodiment of FIGS. 9A and 9B.

Referring to FIG. 12, in the nonvolatile memory device 6 according to the sixth embodiment of the present invention, a (2_1)th strap contact 351 is formed on an area in which a first active region 110 and a second gate electrode 310 overlap each other. A (2_2)th strap contact 352 is formed on an area in which a third active region 130 and a second gate electrode 310 overlap each other.

In the non-volatile memory device 6 according to the sixth embodiment of the present invention, a (1_1)th strap contact 251 and a (1_2)th strap contact 252 are formed not on first through fourth active regions 110 through 140 but on a field insulating layer 105. However, the (2_1)th strap contact 351 and the (2_2)th strap contact 352 are formed on the first active region 110 and the third active region 130, respectively.

Figure 13:
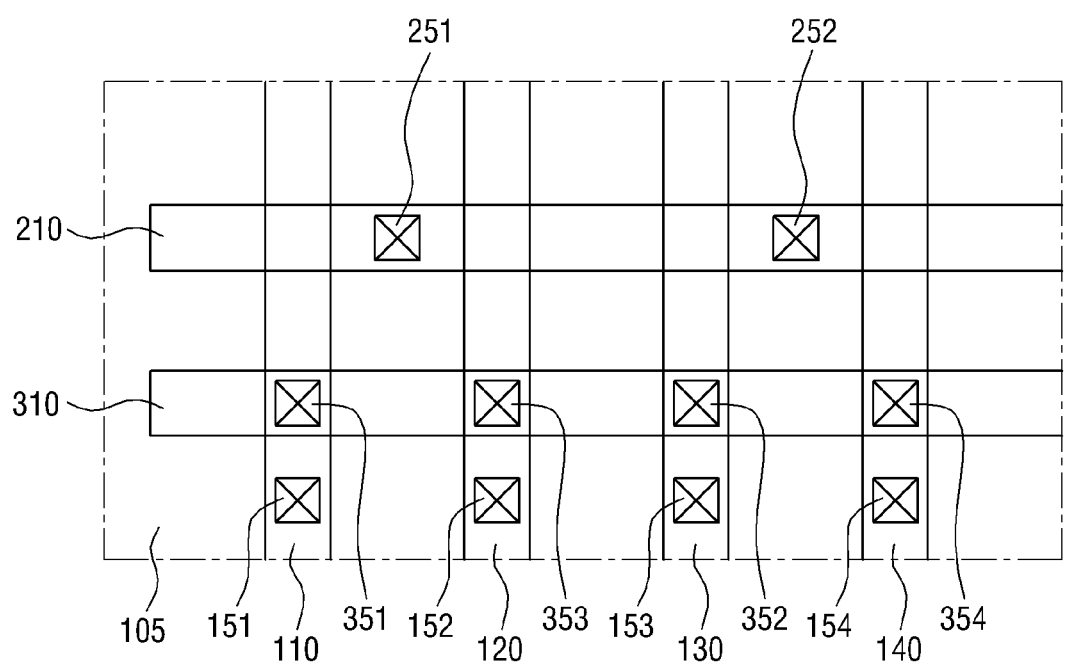

FIG. 13 is a layout view of a nonvolatile memory device 7 according to a seventh embodiment of the present invention. For simplicity, the current embodiment will hereinafter be described, focusing mainly on differences with the embodiment of FIG. 12.

Referring to FIG. 13, the nonvolatile memory device 7 according to the seventh embodiment of the present invention further includes a (2_3)th strap contact 353 and a (2_4)th strap contact 354.

Each of the (2_3)th strap contact 353 and the (2_4)th strap contact 354 connects a second wiring line 330 and a second gate electrode 310.

The (2_3)th strap contact 353 is formed on an area in which a second active region 120 and the second gate electrode 310 overlap each other. The (2_2)th strap contact 354 is formed on an area in which a fourth active region 140 and the second gate electrode 310 overlap each other.

Figure 14:
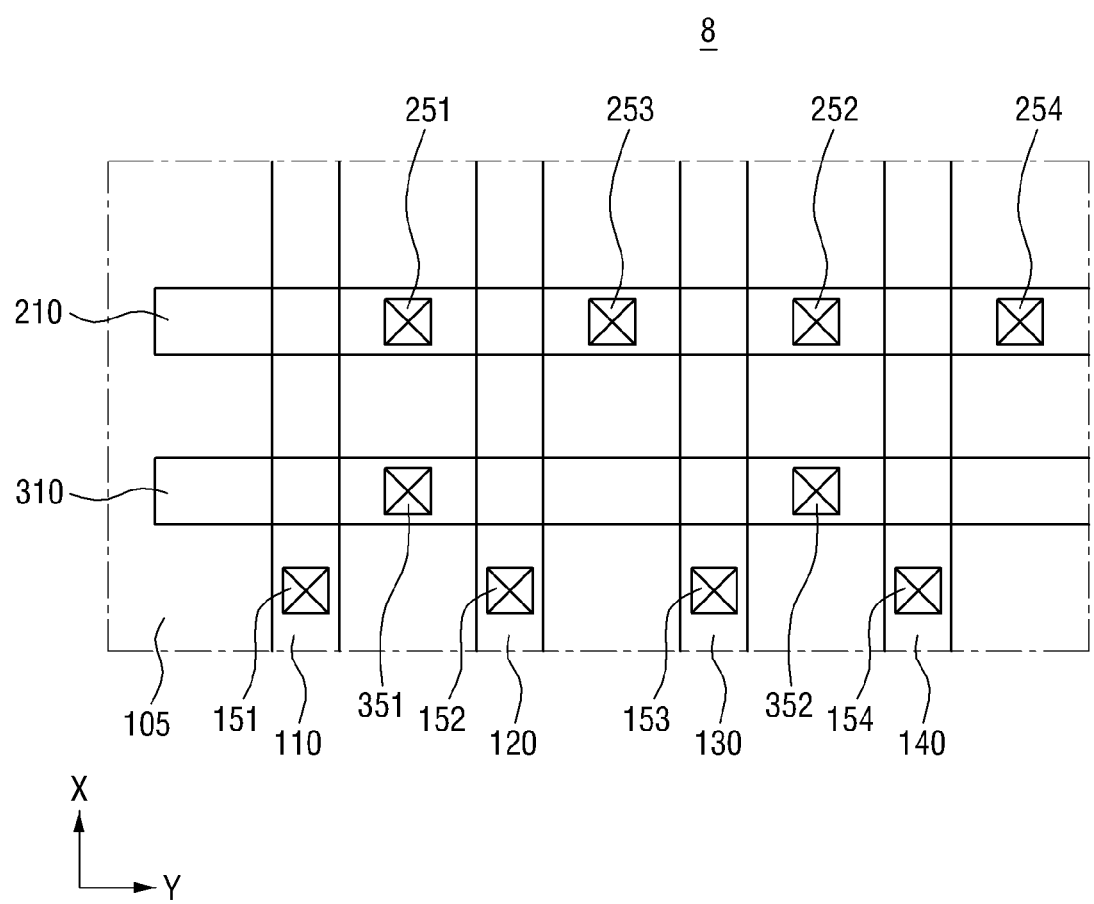

FIG. 14 is a layout view of a nonvolatile memory device 8 according to an eighth embodiment of the present invention. For simplicity, the current embodiment will hereinafter be described, focusing mainly on differences with the embodiment of FIGS. 9A and 9B.

Referring to FIG. 14, the nonvolatile memory device 8 according to the eighth embodiment of the present invention further includes a (1_3)th strap contact 253 and a (1_4)th strap contact 254.

The (1_3)th strap contact 253 connects a first wiring line 230 and a first gate electrode 210. The (1_4)th strap contact 254 also connects the first wiring line 230 and the first gate electrode 210.

The (1_3)th strap contact 253 is formed between a second active region 120 and a third active region 130. The (1_4)th strap contact 254 is not formed between a first active region 110 and a fourth active region 140. For example, the (1_4)th strap contact 254 may be formed between the fourth active region 140 and an active region most adjacent to the fourth active region 140.

In the nonvolatile memory device 8 according to the eighth embodiment of the present invention, each of second strap contacts 351 and 352 is shared by adjacent antifuse memory cells, but the first strap contacts 251 through 254 correspond to a plurality of antifuse memory cells, respectively.

That is, in two adjacent antifuse memory cells, a second gate electrode 310 is connected to one second strap contact (351, 352), and the first gate electrode 210 is connected to two first strap contacts (251, 252, 253, 254).

In FIG. 14, no strap contact is formed at an end of the first gate electrode 210 which protrudes from the first active region 110 in a second direction Y. However, the present invention is not limited thereto.

Figure 15:
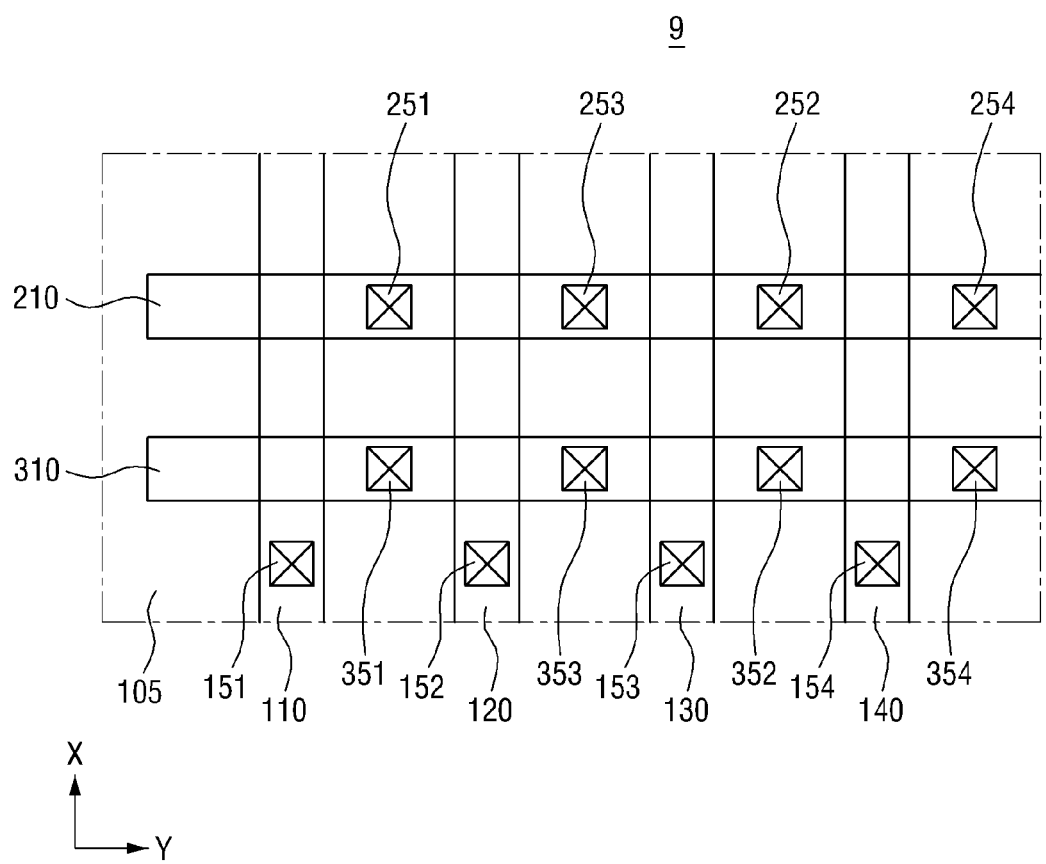

FIG. 15 is a layout view of a nonvolatile memory device 9 according to a ninth embodiment of the present invention. For simplicity, the current embodiment will hereinafter be described, focusing mainly on differences with the embodiment of FIG. 14.

Referring to FIG. 15, the nonvolatile memory device 9 according to the ninth embodiment of the present invention further includes a (2_3)th strap contact 353 and a (2_4)th strap contact 354.

The (2_3)th strap contact 353 is formed between a second active region 120 and a third active region 130. The (2_4)th strap contact 354 is not formed between a first active region 110 and a fourth active region 140. For example, the (2_4)th strap contact 354 may be formed between the fourth active region 140 and an active region most adjacent to the fourth active region 140.

In the nonvolatile memory device 9 according to the ninth embodiment of the present invention, one first strap contact (251, 252, 253, 254) connected to a first gate electrode 210 and one second strap contact (351, 352, 353, 354) connected to a second gate electrode 310 are formed in each antifuse memory cell.

Figure 16:
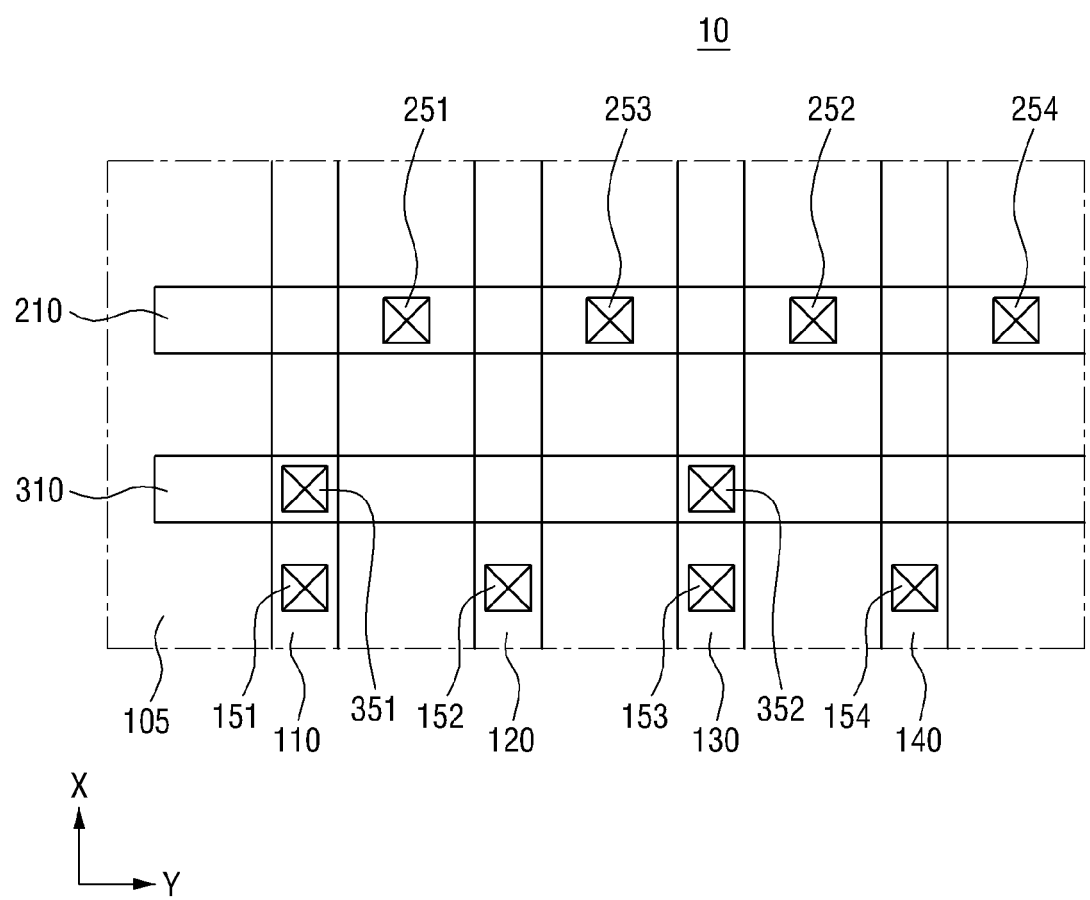

FIG. 16 is a layout view of a nonvolatile memory device 10 according to a tenth embodiment of the present invention. For simplicity, the current embodiment will hereinafter be described, focusing mainly on differences with the embodiment of FIG. 14.

Referring to FIG. 16, in the nonvolatile memory device 10 according to the tenth embodiment of the present invention, a (2_1)th strap contact 351 is formed on an area in which a first active region 110 and a second gate electrode 310 overlap each other.

A (2_2)th strap contact 352 is formed on an area in which a third active region 130 and the second gate electrode 310 overlap each other.

Figure 17:
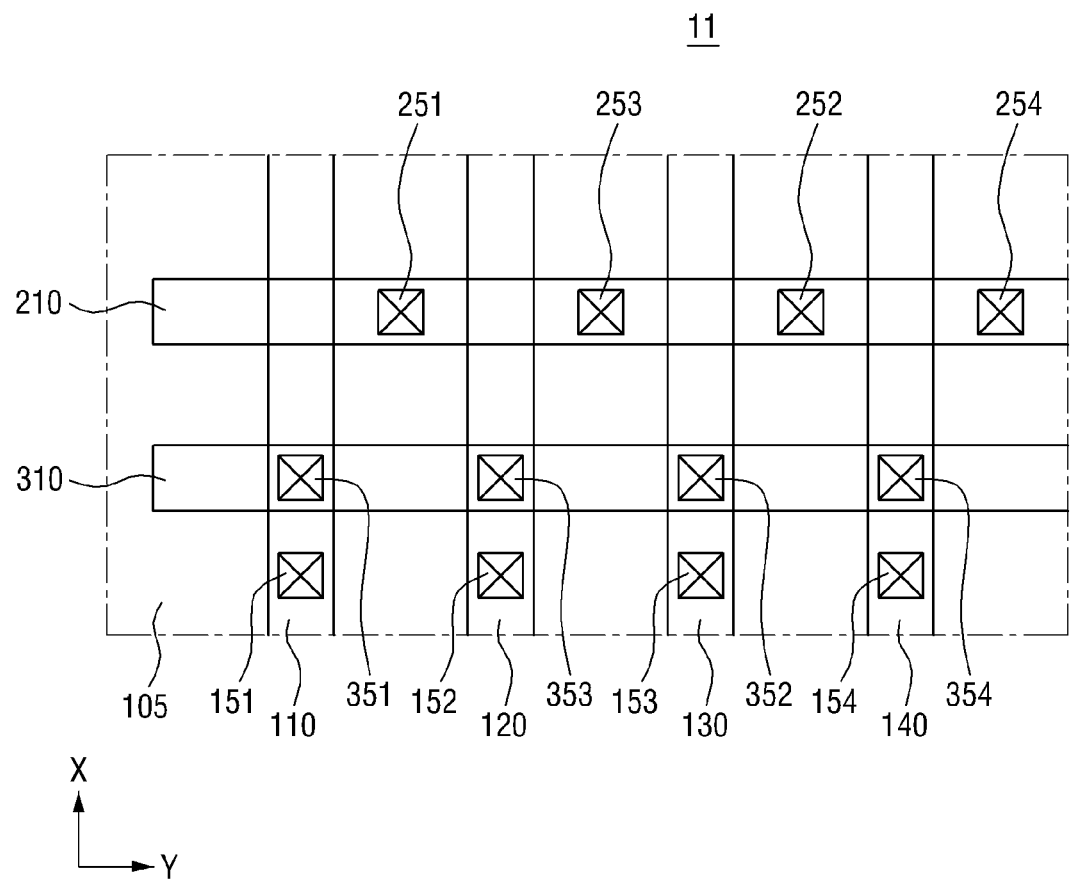

FIG. 17 is a layout view of a nonvolatile memory device 11 according to an eleventh embodiment of the present invention. For simplicity, the current embodiment will hereinafter be described, focusing mainly on differences with the embodiment of FIG. 16.

Referring to FIG. 17, the nonvolatile memory device 11 according to the eleventh embodiment of the present invention further includes a (2_3)th strap contact 353 and a (2_4)th strap contact 354, The (2_3)th strap contact 353 is formed on an area in which a second active region 120 and a second gate electrode 310 overlap each other. The (2_4)th strap contact 354 is formed on an area in which a fourth active region 140 and the second gate electrode 310 overlap each other.

Figure 18:
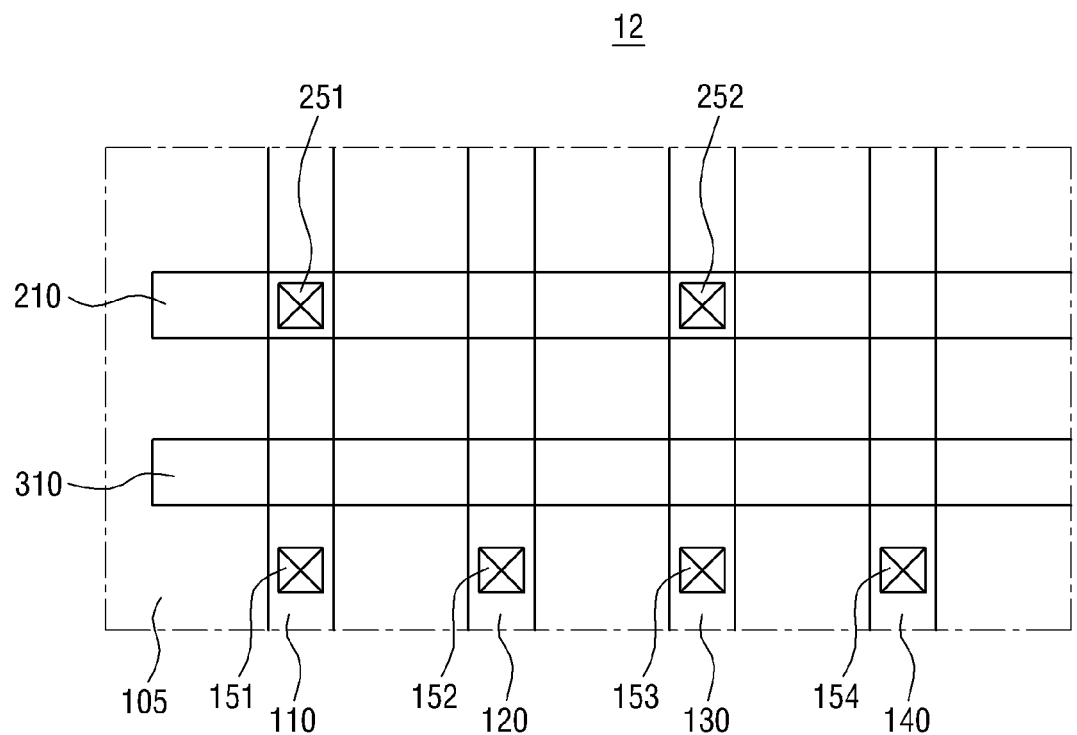

FIG. 18 is a layout view of a nonvolatile memory device 12 according to a twelfth embodiment of the present invention. For simplicity, the current embodiment will hereinafter be described, focusing mainly on differences with the embodiment of FIGS. 3 through 5.

Referring to FIG. 18, in the nonvolatile memory device 12 according to the twelfth embodiment of the present invention, a (1_1)th strap contact 251 is formed on an area in which a first active region 110 and a first gate electrode 210 overlap each other.

A (1_2)th strap contact 252 is formed on an area in which a third active region 130 and the first gate electrode 210 overlap each other.

The first strap contacts 251 and 252 are formed on not all of the areas in which the first gate electrode 210 overlaps the first through fourth active regions 110 through 140.

Figure 19:
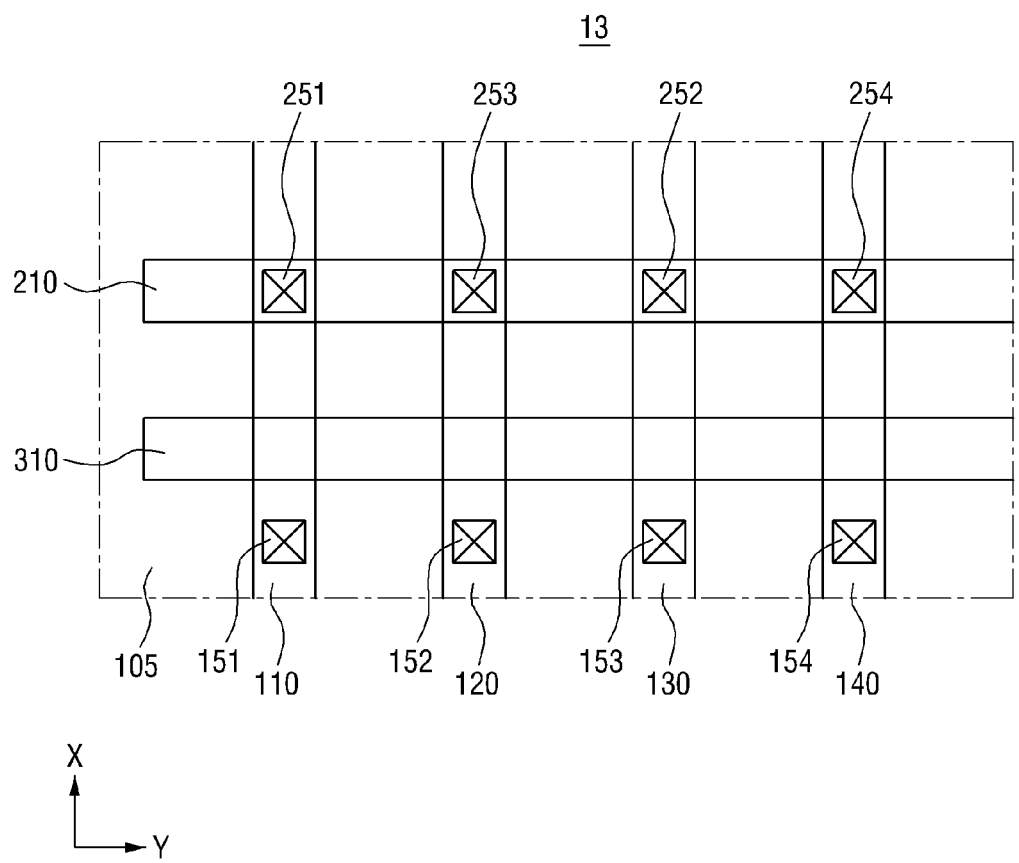

FIG. 19 is a layout view of a nonvolatile memory device 13 according to a thirteenth embodiment of the present invention. For simplicity, the current embodiment will hereinafter be described, focusing mainly on differences with the embodiment of FIG. 18.

Referring to FIG. 19, the nonvolatile memory device 13 according to the thirteenth embodiment of the present invention further includes a (1_3)th strap contact 253 and a (1_4)th strap contact 254.

The (1_3)th strap contact 253 is formed on an area in which a second active region 120 and a first gate electrode 210 overlap each other. The (1_4)th strap contact 254 is formed on an area in which a fourth active region 140 and the first gate electrode 210 overlap each other.

The first strap contacts 251, 252, 253 and 254 are formed on all of the areas in which the first gate electrode 210 overlaps the first through fourth active regions 110 through 140.

Figure 20:
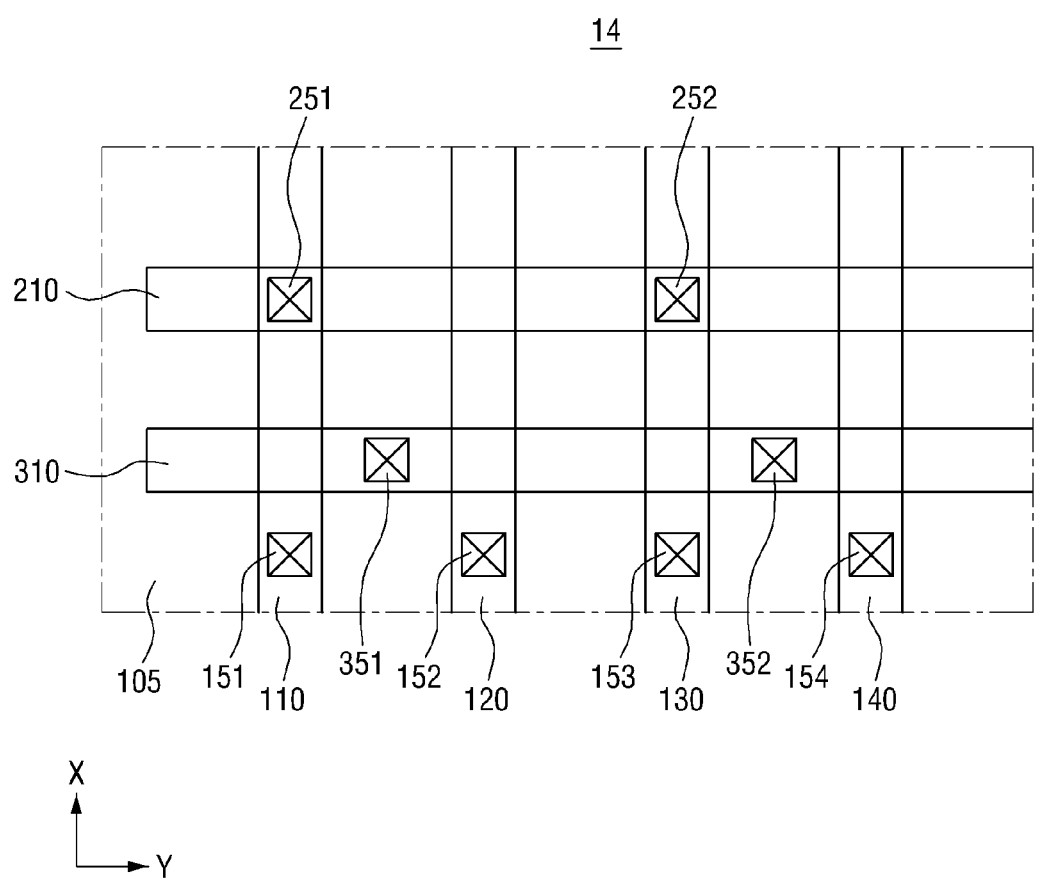

FIG. 20 is a layout view of a nonvolatile memory device 14 according to a fourteenth embodiment of the present invention. For simplicity, the current embodiment will hereinafter be described, focusing mainly on differences with the embodiment of FIGS. 9A and 9B.

Referring to FIG. 20, in the nonvolatile memory device 14 according to the fourteenth embodiment of the present invention, a (1_1)th strap contact 251 is formed on an area in which a first active region 110 and a first gate electrode 210 overlap each other.

A (1_2)th strap contact 252 is formed on an area in which a third active region 130 and the first gate electrode 210 overlap each other.

Figure 21:
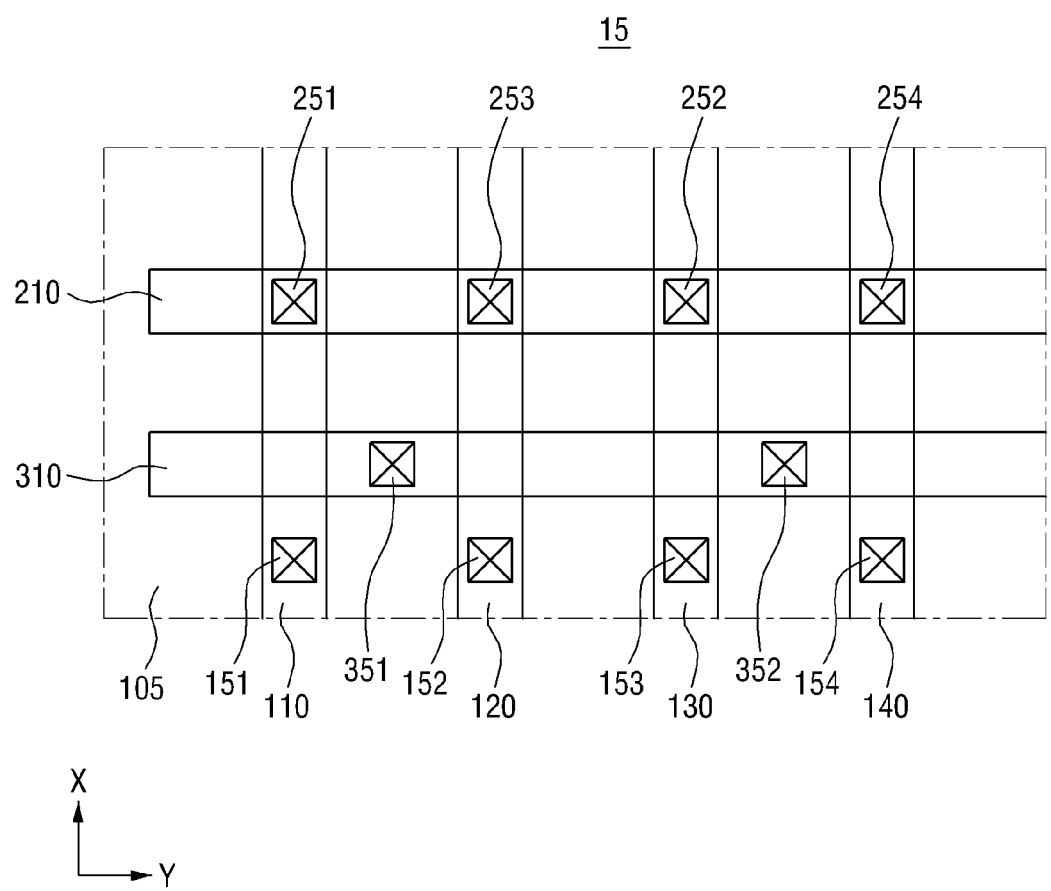

FIG. 21 is a layout view of a nonvolatile memory device 15 according to a fifteenth embodiment of the present invention. For simplicity, the current embodiment will hereinafter be described, focusing mainly on differences with the embodiment of FIG. 20.

Referring to FIG. 21, the nonvolatile memory device 15 according to the fifteenth embodiment of the present invention further includes a (1_3)th strap contact 253 and a (1_4)th strap contact 254.

The (1_3)th strap contact 253 is formed on an area in which a second active region 120 and a first gate electrode 210 overlap each other. The (1_4)th strap contact 254 is formed on an area in which a fourth active region 140 and the first gate electrode 210 overlap each other.

Figure 22:
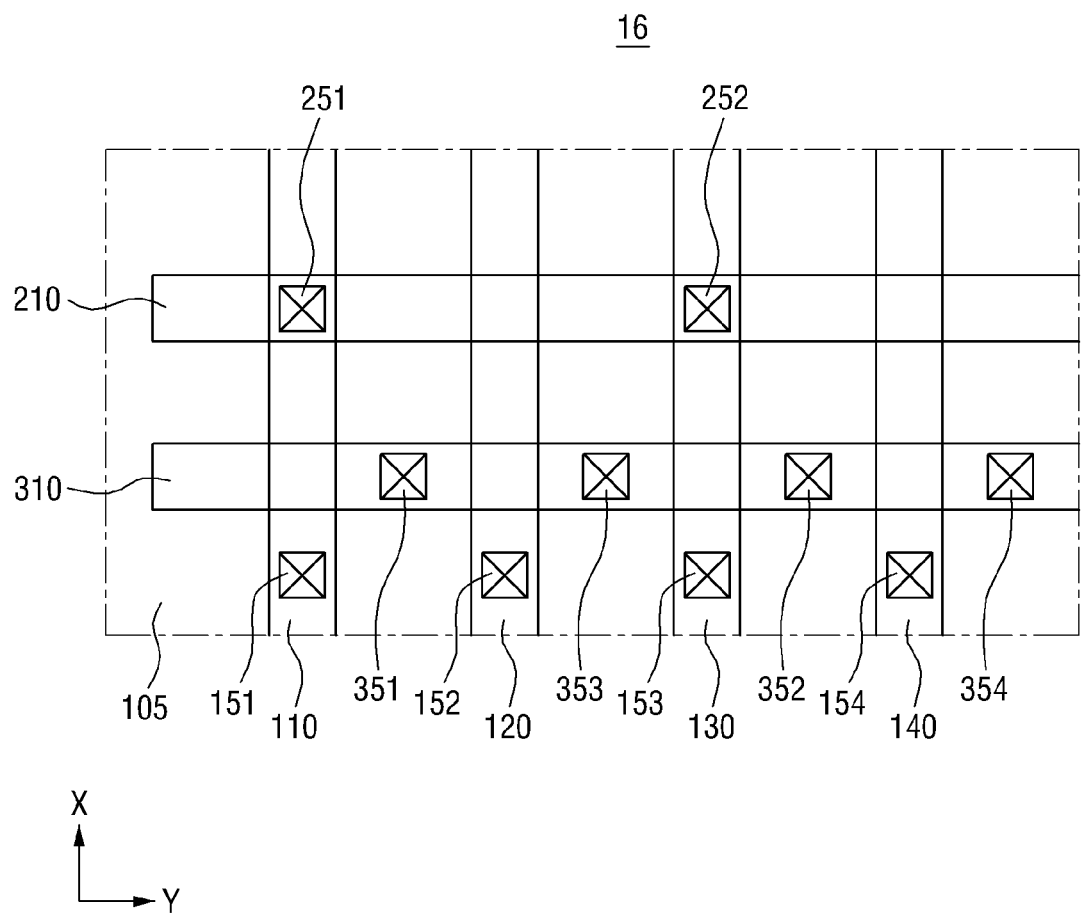

FIG. 22 is a layout view of a nonvolatile memory device 16 according to a sixteenth embodiment of the present invention. For simplicity, the current embodiment will hereinafter be described, focusing mainly on differences with the embodiment of FIG. 11.

Referring to FIG. 22, in the nonvolatile memory device 16 according to the sixteenth embodiment of the present invention, a (1_1)th strap contact 251 is formed on an area in which a first active region 110 and a first gate electrode 210 overlap each other.

A (1_2)th strap contact 252 is formed on an area in which a third active region 130 and the first gate electrode 210 overlap each other.

Figure 23:
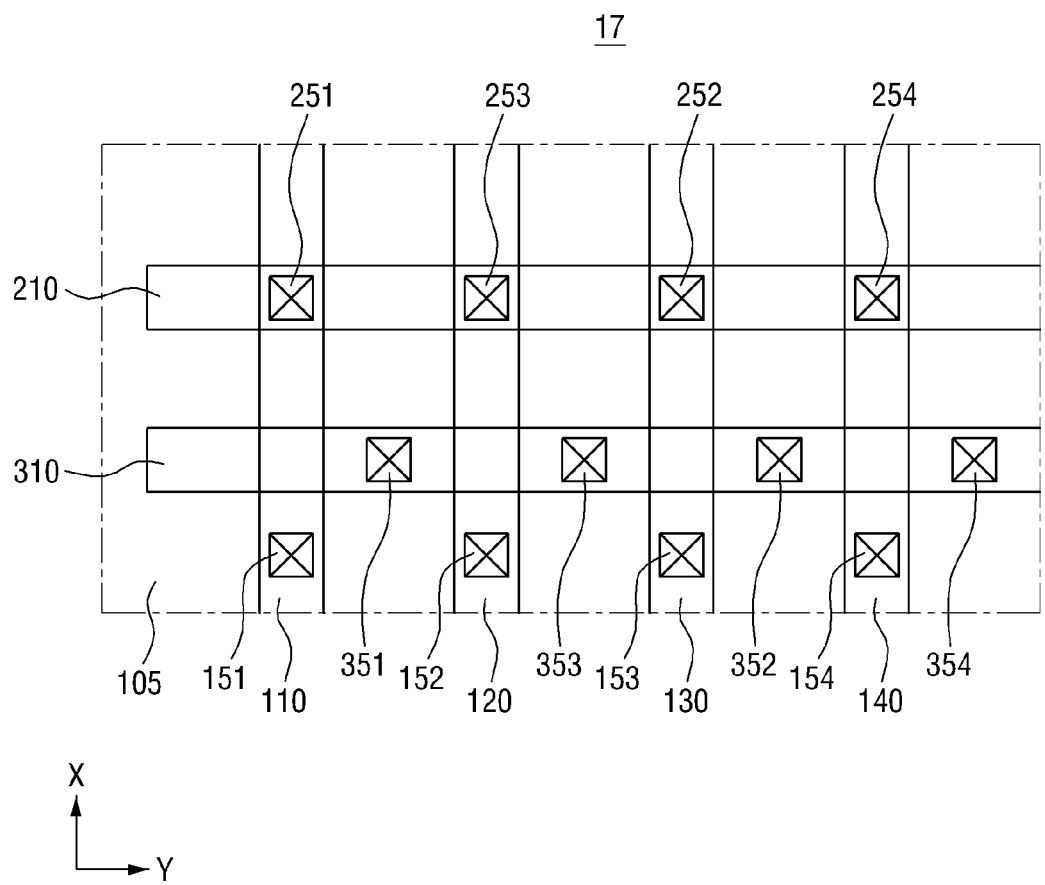

FIG. 23 is a layout view of a nonvolatile memory device 17 according to a seventeenth embodiment of the present invention. For simplicity, the current embodiment will hereinafter be described, focusing mainly on differences with the embodiment of FIG. 22.

Referring to FIG. 23, the nonvolatile memory device 17 according to the seventeenth embodiment of the present invention further includes a (1_3)th strap contact 253 and a (1_4)th strap contact 254.

The (1_3)th strap contact 253 is formed on an area in which a second active region 120 and a first gate electrode 210 overlap each other. The (1_4)th strap contact 254 is formed on an area in which a fourth active region 140 and the first gate electrode 210 overlap each other.

Nonvolatile memory devices according to eighteenth and nineteenth embodiments of the present invention will now be described with reference to FIGS. 24 and 25. For simplicity, the current embodiments will hereinafter be described, focusing mainly on differences with the embodiment of FIG. 20.

Figure 24:
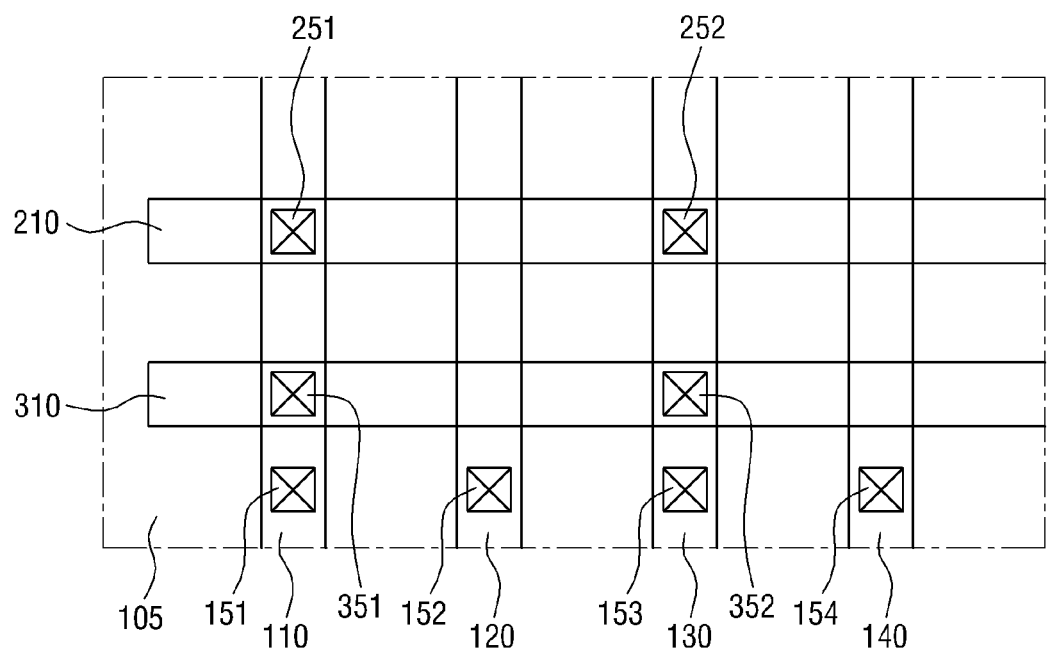

FIG. 24 is a layout view of a nonvolatile memory device 18 according to an eighteenth embodiment of the present invention. FIG. 25 is a layout view of a nonvolatile memory device 19 according to a nineteenth embodiment of the present invention.

Referring to FIG. 24, in the nonvolatile memory device 18 according to the eighteenth embodiment of the present invention, a (2_1)th strap contact 351 is formed on an area in which a first active region 110 and a second gate electrode 310 overlap each other.

A (2_2)th strap contact 352 is formed on an area in which a third active region 130 and the second gate electrode 310 overlap each other.

A (1_1)th strap contact 251 and the (2_1)th strap contact 351 are formed on the first active region 110 along a first direction X, and a (1_2)th strap contact 252 and the (2_2)th strap contact 352 are formed on the third active region 130 along the first direction X.

Figure 25:
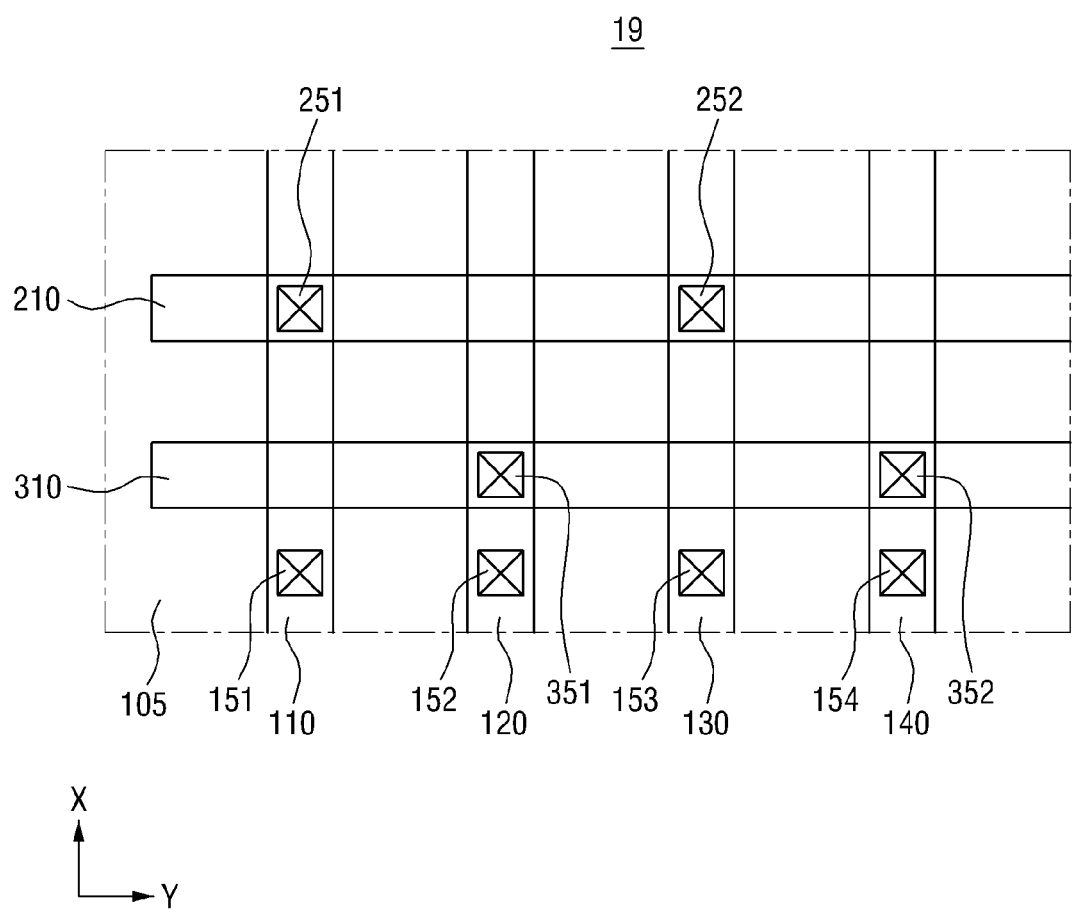

Referring to FIG. 25, in the nonvolatile memory device 19 according to the nineteenth embodiment of the present invention, a (2_1)th strap contact 351 is formed on an area in which a second active region 120 and a second gate electrode 310 overlap each other.

A (2_2)th strap contact 352 is formed on an area in which a fourth active region 140 and the second gate electrode 310 overlap each other.

That is, in an antifuse memory cell array which shares a first gate electrode 210 and the second gate electrode 310, a first strap contact 251 or 252 and the second strap contact 351 or 352 are not disposed on the same active region.

Figure 26:
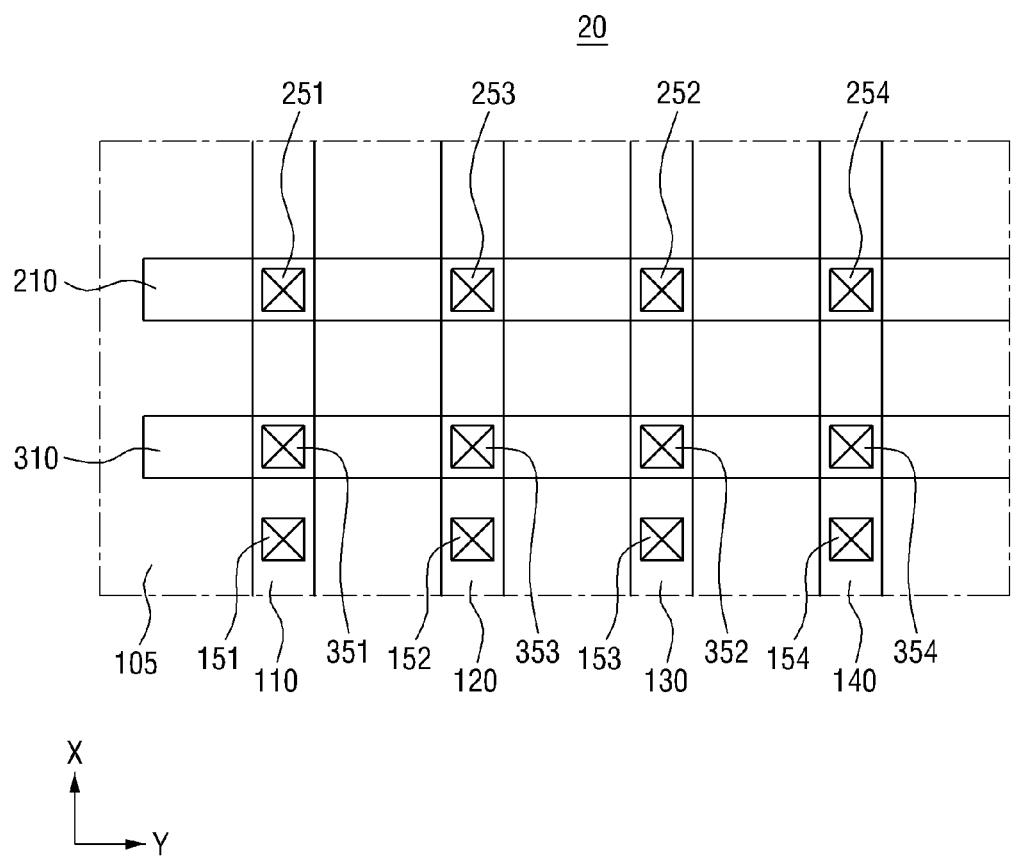

FIG. 26 is a layout view of a nonvolatile memory device 20 according to a twentieth embodiment of the present invention. For simplicity, the current embodiment will hereinafter be described, focusing mainly on differences with the embodiment of FIG. 24.

Referring to FIG. 26, the nonvolatile memory device 20 according to the twentieth embodiment of the present invention further includes a (1_3)th strap contact 253, a (1_4)th strap contact 254, a (2_3)th strap contact 353, a (2_4)th strap contact 354.

Each of the (1_3)th strap contact 253 and the (1_4)th strap contact 254 connects a first wiring line 230 and a first gate electrode 210. The (1_3)th strap contact 253 is formed on an area in which a second active region 120 and the first gate electrode 210 overlap each other. The (1_4)th strap contact 254 is formed on an area in which a fourth active region 140 and the first gate electrode 210 overlap each other.

Each of the (2_3)th strap contact 353 and the (2_4)th strap contact 354 connects a second wiring line 330 and a second gate electrode 310. The (2_3)th strap contact 353 is formed on an area in which the second active region 120 and the second gate electrode 310 overlap each other. The (2_4)th strap contact 354 is formed on an area in which the fourth active region 140 and the second gate electrode 310 overlap each other.

Figure 27:
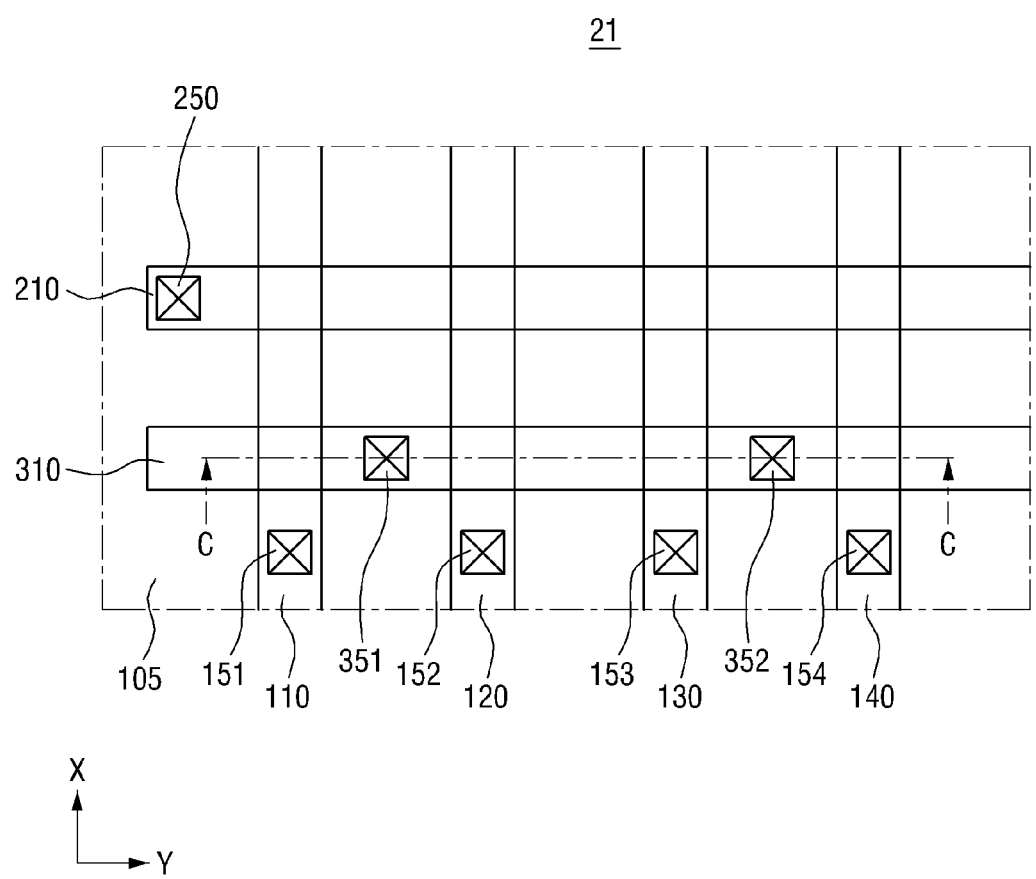

FIG. 27 is a layout diagram of a nonvolatile memory device 21 according to a twenty-first embodiment of the present invention. A cross-sectional view taken along the C-C of FIG. 27 is substantially the same as FIG. 9B.

Referring to FIG. 27, the nonvolatile memory device 21 according to the twenty-first embodiment of the present invention includes a first active region 110, a second active region 120, a third active region 130, a fourth active region 140, a first gate electrode 210, a second gate electrode 310, a second wiring line 330, a (2_1)th strap contact 351, and a (2_2)th strap contact 352.

The first through fourth active regions 110 through 140 may extend along a first direction X. In addition, the first through fourth active regions 110 through 140 may be arranged along a second direction Y. The first through fourth active regions 110 through 140 may be arranged sequentially along the second direction Y.

The first gate electrode 210 and the second gate electrode 310 are formed on the first through fourth active regions 110 through 140. The first gate electrode 210 and the second gate electrode 310 may extend along the second direction Y and intersect the first through fourth active regions 110 through 140.

The second gate electrode 310 is formed side by side with the first gate electrode 210. The first gate electrode 210 and the second gate electrode 310 are most adjacent to each other.

The second wiring line 330 is formed on the second gate electrode 310. The second wiring line 330 extends along the second gate electrode 310 in the second direction Y.

Each of the (2_1)th strap contact 351 and the (2_2)th strap contact 352 connects the second wiring line 330 and the second gate electrode 310. The second gate electrode 310 is electrically connected to the second wiring line 330 by a plurality of second strap contacts 351 and 352.

The (2_1)th strap contact 351 is formed between the first active region 110 and the second active region 120. The (2_2)th strap contact 352 is formed between the third active region 130 and the fourth active region 140.

The (2_1)th strap contact 351 may be shared by two antifuse memory cells defined respectively by the first active region 110 and the second active region 120, and the (2_2)th strap contact 352 may be shared by two antifuse memory cells defined respectively by the third active region 130 and the fourth active region 140.

A first normal contact 250 is formed on the first gate electrode 210 to be connected to the first gate electrode 210. The first normal contact 250 connects the first gate electrode 210 to a high-voltage line WP described above with reference to FIG. 2.

The high-voltage line WP which applies a gate voltage to the first gate electrode 210 is electrically connected to the first gate electrode 210 by the first normal contact 250. One first normal contact 250 may be connected to the first gate electrode 210. That is, unlike the second gate electrode 310, the first gate electrode 210 may be connected to the high-voltage line WP by one contact, that is, one first normal contact 250 connected to an end of the first gate electrode 210.

That is, no contact used to apply a gate voltage to the first gate electrode 210 is additionally formed between the first active region 110 and the fourth active region 140.

Figure 28:
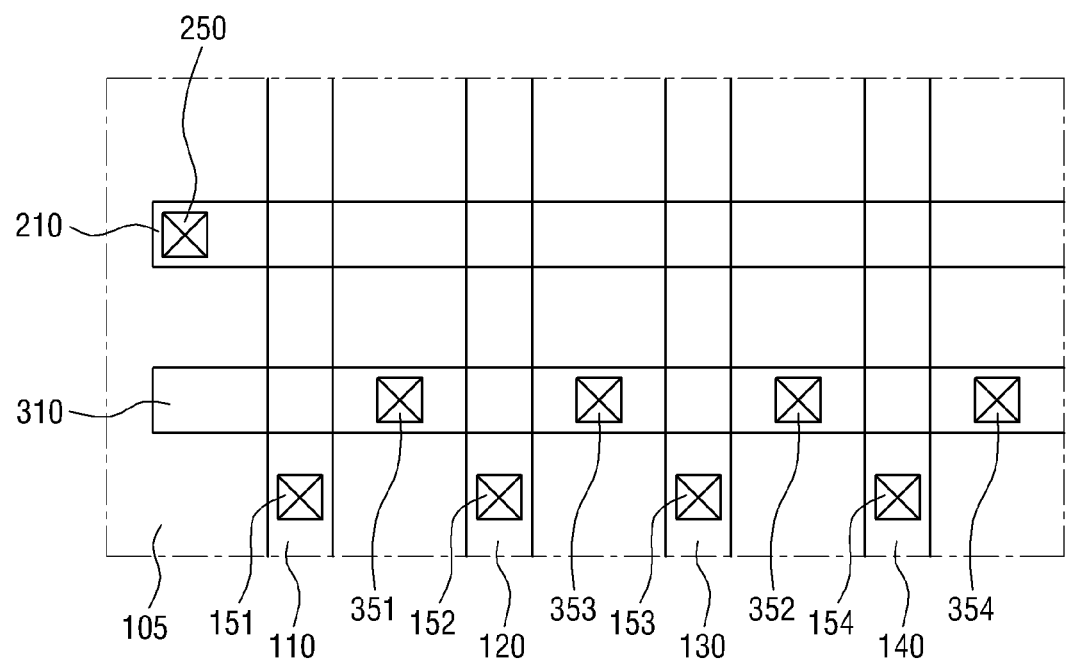

FIG. 28 is a layout view of a nonvolatile memory device 22 according to a twenty-second embodiment of the present invention. For simplicity, the current embodiment will hereinafter be described, focusing mainly on differences with the embodiment of FIG. 27.

Referring to FIG. 28, the nonvolatile memory device 22 according to the twenty-second embodiment of the present invention further includes a (2_3)th strap contact 353 and a (2_4)th strap contact 354.

Each of the (2_3)th strap contact 353 and the (2_4)th strap contact 354 connects a second wiring line 330 and a second gate electrode 310.

The (2_3)th strap contact 353 is formed between a second active region 120 and a third active region 130. The (2_3)th strap contact 353 is formed on the second gate electrode 310 between the second active region 120 and the third active region 130.

The (2_4)th strap contact 354 is not formed between a first active region 110 and a fourth active region 140. For example, the (2_4)th strap contact 354 may be formed between the fourth active region 140 and an active region most adjacent to the fourth active region 140.

In the nonvolatile memory device 22 according to the twenty-second embodiment of the present invention, one second strap contact (351, 352, 353, 354) may be formed in each of antifuse memory cells that share the second gate electrode 310.

In FIG. 28, no strap contact is formed at an end of the second gate electrode 310 which protrudes from the first active region 110 in a second direction Y. However, the present invention is not limited thereto.

Figure 29:
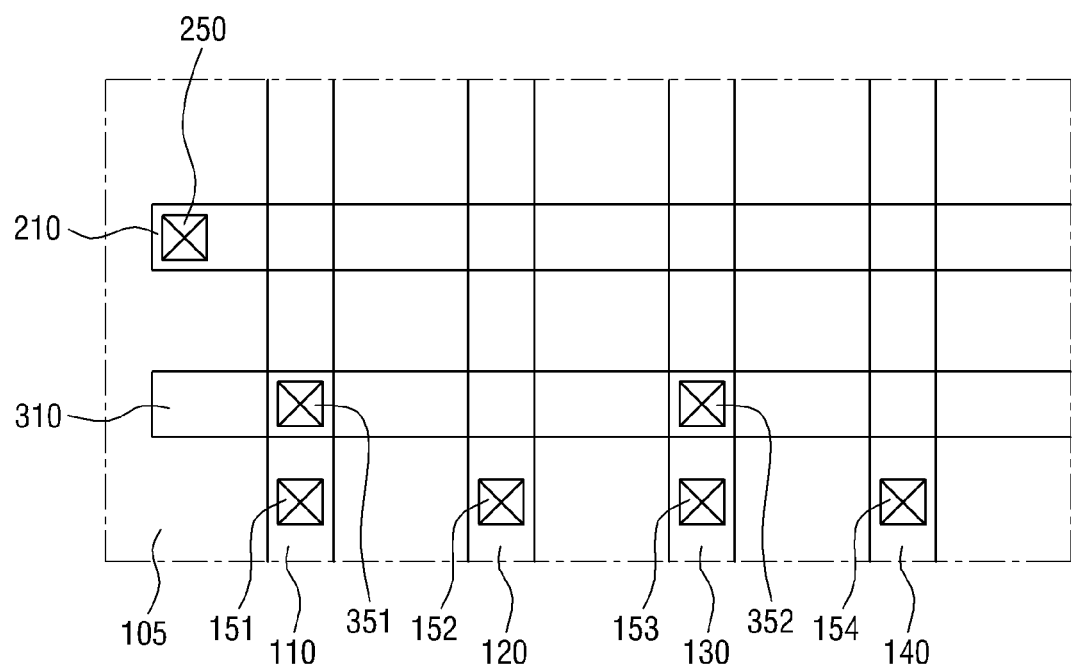

FIG. 29 is a layout view of a nonvolatile memory device 23 according to a twenty-third embodiment of the present invention. For simplicity, the current embodiment will hereinafter be described, focusing mainly on differences with the embodiment of FIG. 27.

Referring to FIG. 29, in the nonvolatile memory device 23 according to the twenty-third embodiment of the present invention, a (2_1)th strap contact 351 is formed on an area in which a first active region 110 and a second gate electrode 310 overlap each other.

A (2_2)th strap contact 352 is formed on an area in which a third active region 130 and the second gate electrode 310 overlap each other.

Figure 30:
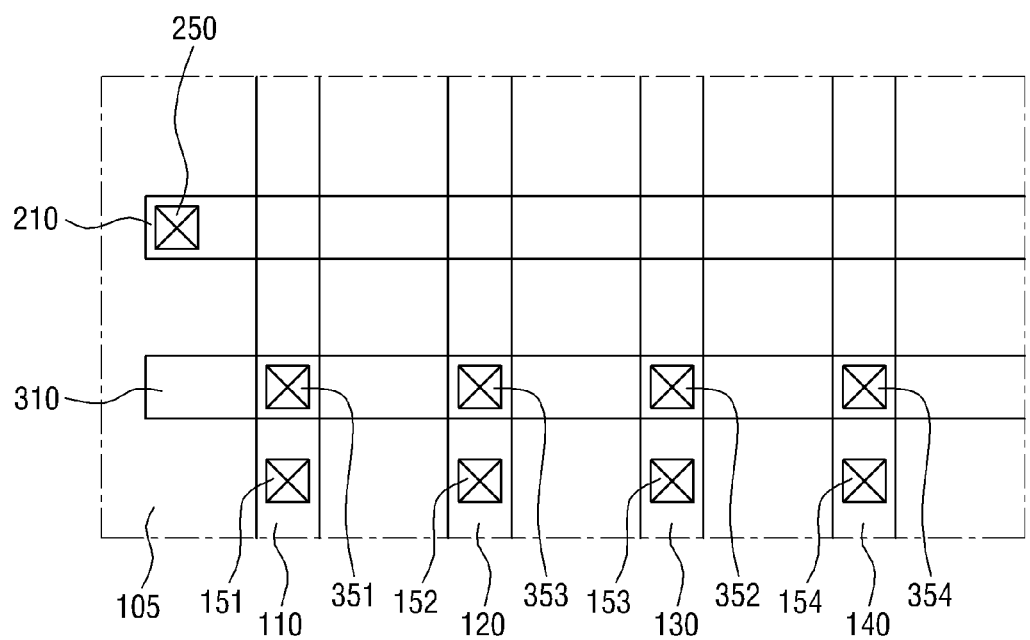

FIG. 30 is a layout view of a nonvolatile memory device 24 according to a twenty-fourth embodiment of the present invention. For simplicity, the current embodiment will hereinafter be described, focusing mainly on differences with the embodiment of FIG. 29.

Referring to FIG. 30, the nonvolatile memory device 24 according to the twenty-fourth embodiment of the present invention further includes a (2_3)th strap contact 353 and a (2_4)th strap contact 354.

The (2_3)th strap contact 353 is formed on an area in which a second active region 120 and a second gate electrode 310 overlap each other. The (2_4)th strap contact 354 is formed on an area in which a fourth active region 140 and the second gate electrode 310 overlap each other.

In embodiments (e.g., the first embodiment) of the present invention in which adjacent antifuse memory cells share a strap contact, the (1_1)th strap contact 251 is shared by two adjacent antifuse memory cells as described above. However, if an additional active region is formed between the second active region 120 and the third active region 130, the (1_1)th strap contact 251 may be shared by three or more antifuse memory cells.

Figure 31A:
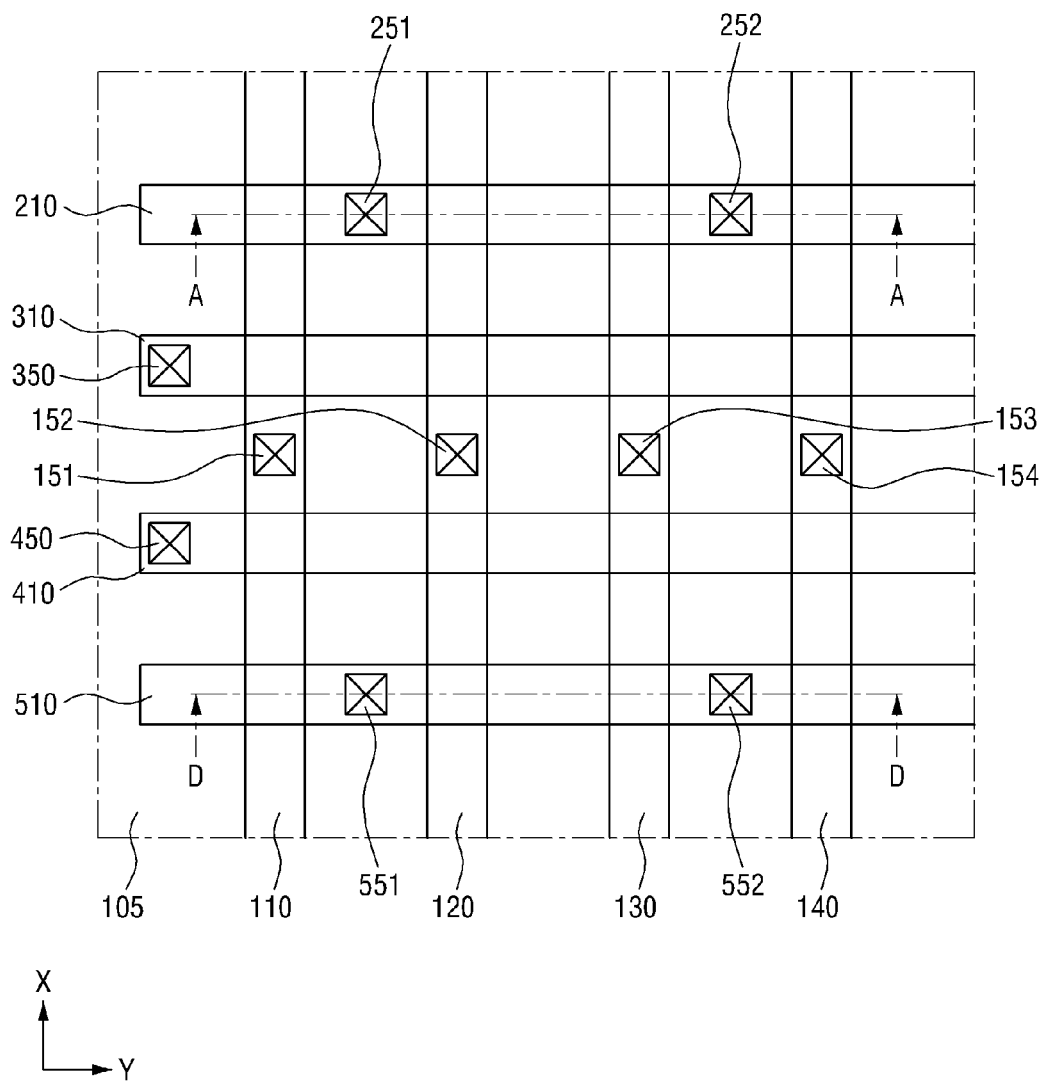
FIGS. 31A and 31B are views illustrating a nonvolatile memory device according to a twenty-fifth embodiment of the present invention.
Figure 31B:
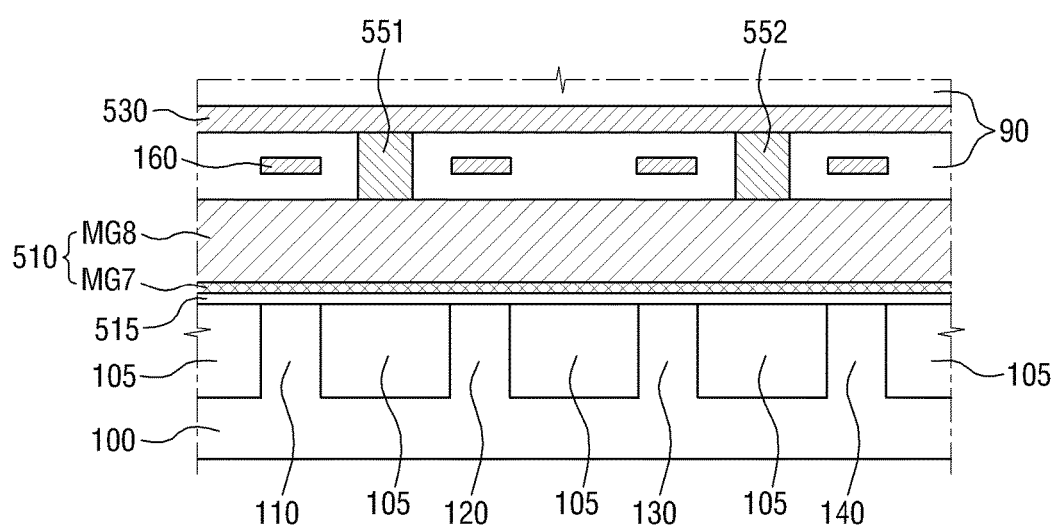

FIGS. 31A and 31B are views illustrating a nonvolatile memory device according to a twenty-fifth embodiment of the present invention. Specifically, FIG. 31A is a layout view of a nonvolatile memory device 25 according to a twenty-fifth embodiment of the present invention. FIG. 31B is a cross-sectional view taken along the line D-D of FIG. 31A.

In the layout view of FIG. 31A, active regions, gate electrodes, and contacts only are illustrated. A cross-sectional view taken along the line A-A of FIG. 31A is substantially the same as FIG. 4.

Referring to FIGS. 4, 31A and 31B, the nonvolatile memory device 25 according to the twenty-fifth embodiment of the present invention includes a first active region 110, a second active region 120, a third active region 130, a fourth active region 140, a first gate electrode 210, a second gate electrode 310, a third gate electrode 410, a fourth gate electrode 510, a first wiring line 230, a fourth wiring line 530, a (1_1)th strap contact 251, a (1_2)th strap contact 252, a (4_1)th strap contact 551, and a (4_2)th strap contact 552.

The first through fourth active regions 110 through 140 may extend along a first direction X. In addition, the first through fourth active regions 110 through 140 may be arranged along a second direction Y. The first through fourth active regions 110 through 140 may be arranged sequentially along the second direction Y.

A first bit line contact 151 is electrically connected to the first active region 110, and a second bit line contact 152 is electrically connected to the second active region 120. In addition, a third bit line contact 153 is electrically connected to the third active region 130, and a fourth bit line contact 154 is electrically connected to the fourth active region 140.

The first through fourth bit line contacts 151 through 154 may be arranged in a row along the second direction Y.

Each of the first through fourth gate electrodes 210 through 510 is formed on the first through fourth active regions 110 through 140. The first through fourth gate electrodes 210 through 510 extend along the second direction Y. Each of the first through fourth gate electrodes 210 through 510 may intersect the first through fourth active regions 110 through 140.

The first gate electrode 210 and the second gate electrode 310 are located on a side of the first through fourth bit line contacts 151 through 154 arranged in a row along the first direction X. In addition, the third gate electrode 410 and the fourth gate electrode 510 are located on the other side of the first through fourth bit line contacts 151 through 154 arranged in a row along the first direction X.

The first gate electrode 210 and the second gate electrode 310 are formed most adjacent to each other, and the third gate electrode 410 and the fourth gate electrode 510 are formed most adjacent to each other.

The first through fourth bit line contacts 151 through 154 are arranged in a row between the second gate electrode 310 and the third gate electrode 410. In addition, the first through fourth bit line contacts 151 through 154 arranged in a row, the second gate electrode 310, and the third gate electrode 410 are disposed between the first gate electrode 210 and the fourth gate electrode 510.

The third gate electrode 410 and the fourth gate electrode 510 are substantially the same as the first gate electrode 210, and thus a description thereof will be omitted.

The first wiring line 230 is formed on the first gate electrode 210, and the fourth wiring line 530 is formed on the fourth gate electrode 510. The first wiring line 230 may extend along the first gate electrode 210 in the second direction Y, and the fourth wiring line 530 may extend along the fourth gate electrode 510 in the second direction Y.

The first wiring line 230 may apply a uniform voltage to the first gate electrode 210, and the fourth wiring line 510 may apply a uniform voltage to the fourth gate electrode 510.

Each of the first wiring line 230 and the fourth wiring line 530 may be a high-voltage line WP described above with reference to FIG. 2. Alternatively, the first wiring line 230 and the fourth wiring line 530 may be connecting lines which respectively connect the first gate electrode 210 and the fourth gate electrode 510 to high-voltage lines WP.

Each of the first wiring line 230 and the fourth wiring line 530 may include, but is not limited to, Al or Cu.

Each of the (1_1)th strap contact 251 and the (1_2)th strap contact 252 connects the first wiring line 230 and the first gate electrode 210. Each of the (4_1)th strap contact 551 and the (4_2)th strap contact 552 connects the fourth wiring line 530 and the fourth gate electrode 510.

The first gate electrode 210 is electrically connected to the first wiring line 230 by a plurality of first strap contacts 251 and 252, and the fourth gate electrode 510 is electrically connected to the fourth wiring line 530 by a plurality of fourth strap contacts 551 and 552.

The (1_1)th strap contact 251 is formed between the first active region 110 and the second active region 120. The (1_2)th strap contact 252 is formed between the third active region 130 and the fourth active region 140.

The (4_1)th strap contact 551 is formed between the first active region 110 and the second active region 120. The (4_2)th strap contact 552 is formed between the third active region 130 and the fourth active region 140.

The (1_1)th strap contact 251 and the (4_1)th strap contact 551 may be shared by two antifuse memory cells defined respectively by the first active region 110 and the second active region 120, and the (1_2)th strap contact 252 and the (4_2)th strap contact 552 may be shared by two antifuse memory cells defined respectively by the third active region 130 and the fourth active region 140.

A second normal contact 350 is formed on the second gate electrode 310 to be connected to the second gate electrode 310. A third normal contact 450 is formed on the third gate electrode 410 to be connected to the third gate electrode 410. The second normal contact 350 and the third normal contact 450 respectively connect the second gate electrode 310 and the third gate electrode 410 to word lines WL described above with reference to FIG. 2.

One second normal contact 350 may be connected to the second gate electrode 310. In addition, one third normal contact 450 may be connected to the third gate electrode 410. That is, unlike the first gate electrode 210, the second gate electrode 310 may receive a gate voltage from one contact, that is, one second normal contact 350 connected to an end of the second gate electrode 310. In addition, unlike the fourth gate electrode 510, the third gate electrode 410 may receive a gate voltage from one contact, that is, one third normal contact 450 connected to an end of the third gate electrode 410.

Figure 32A:
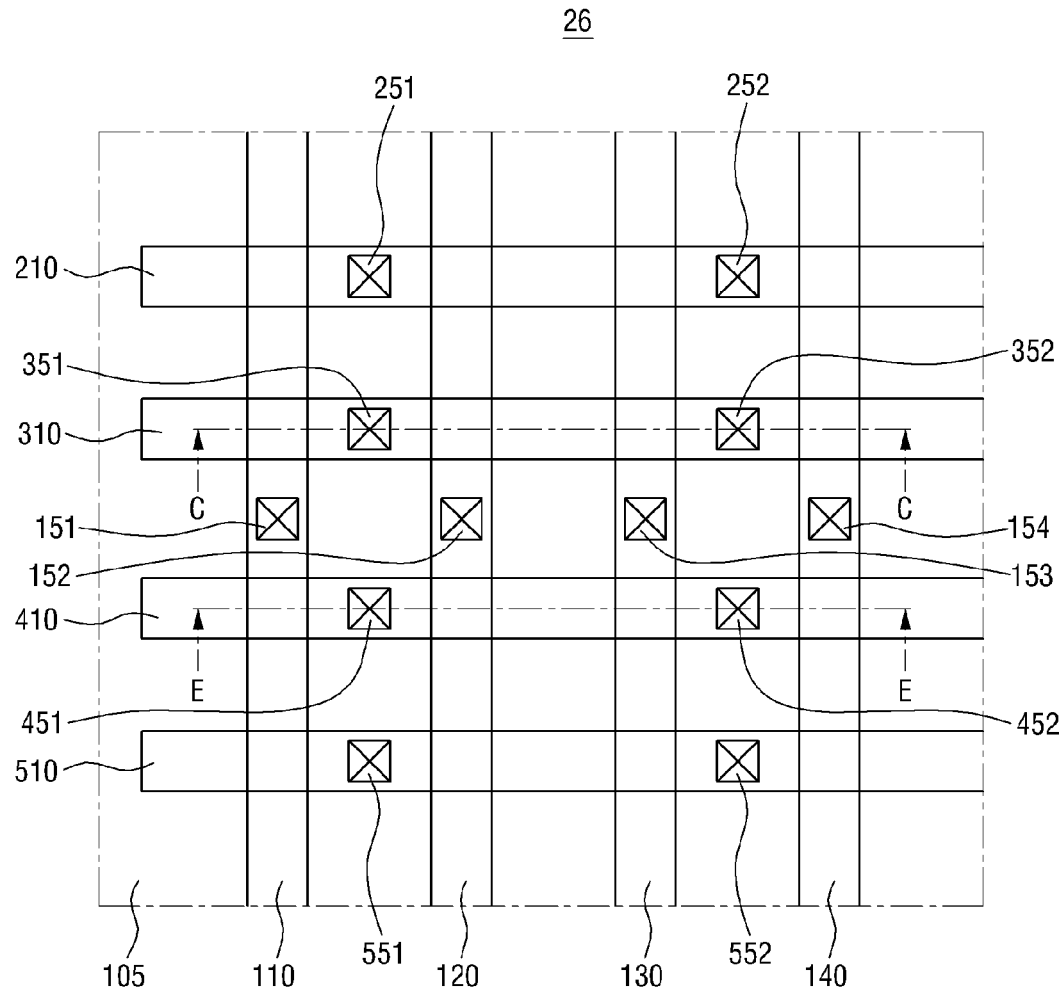
FIGS. 32A and 32B are views illustrating a nonvolatile memory device according to a twenty-sixth embodiment of the present invention.
Figure 32B:
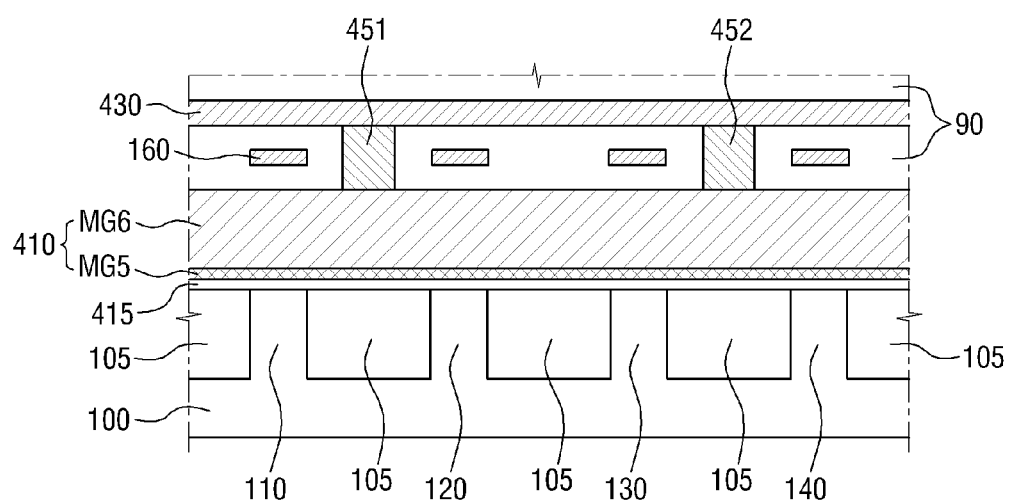

FIGS. 32A and 32B are views illustrating a nonvolatile memory device according to a twenty-sixth embodiment of the present invention. For simplicity, the current embodiment will hereinafter be described, focusing mainly on differences with the embodiment of FIGS. 31A and 31B.

Specifically, FIG. 32A is a layout view of a nonvolatile memory device 26 according to a twenty-sixth embodiment of the present invention. FIG. 32B is a cross-sectional view taken along the line E-E of FIG. 32A. A cross-sectional view taken along the line C-C of FIG. 32A is substantially the same as FIG. 9B.

Referring to FIGS. 9B, 32A and 32B, the nonvolatile memory device 26 according to the twenty-sixth embodiment of the present invention further includes a second wiring line 330, a third wiring line 430, a (2_1)th strap contact 351, a (2_2)th strap contact 352, a (3_1)th strap contact 451, and a (3_2)th strap contact 452.

The second wiring line 330 is formed on a second gate electrode 310, and the third wiring line 430 is formed on a third gate electrode 410. The second wiring line 330 may extend along the second gate electrode 310 in a second direction Y, and the third wiring line 430 may extend along the third gate electrode 410 in the second direction Y.

The second wiring line 330 may apply a uniform voltage to the second gate electrode 310, and the third wiring line 430 may apply a uniform voltage to the third gate electrode 410.

Each of the second wiring line 330 and the third wiring line 430 may be a word line WL described above with reference to FIG. 2. Alternatively, the second wiring line 330 may be a connecting line which connects the second gate electrode 310 to a word line WL, and the third wiring line 430 may be a connecting line which connects the third gate electrode 410 to a word line WL.

Each of the (2_1)th strap contact 351 and the (2_2)th strap contact 352 connects the second wiring line 330 and the second gate electrode 310. Each of the (3_1)th strap contact 451 and the (3_2)th strap contact 452 connects the third wiring line 430 and the third gate electrode 410.

The second gate electrode 310 is electrically connected to the second wiring line 330 by a plurality of second strap contacts 351 and 352, and the third gate electrode 410 is electrically connected to the third wiring line 430 by a plurality of third strap contacts 451 and 452.

Each of the (2_1)th strap contact 351 and the (3_1)th strap contact 451 is formed between a first active region 110 and a second active region 120. Each of the (2_2)th strap contact 352 and the (3_2)th strap contact 452 is formed between a third active region 130 and a fourth active region 140.

In FIG. 32A, the (1_1)th through (4_1)th strap contacts 251 through 551 are arranged in a row along a first direction, and the (1_2)th through (4_2)th strap contacts 252 through 552 are arranged in a row along the first direction X. In addition, no strap contact is formed between the second active region 120 and the third active region 130.

Nonvolatile memory devices according to twenty-seventh through twenty-ninth embodiments of the present invention will now be described with reference to FIGS. 33 through 35. For simplicity, the current embodiments will hereinafter be described, focusing mainly on differences with the embodiment of FIGS. 32A and 32B.

Figure 33:
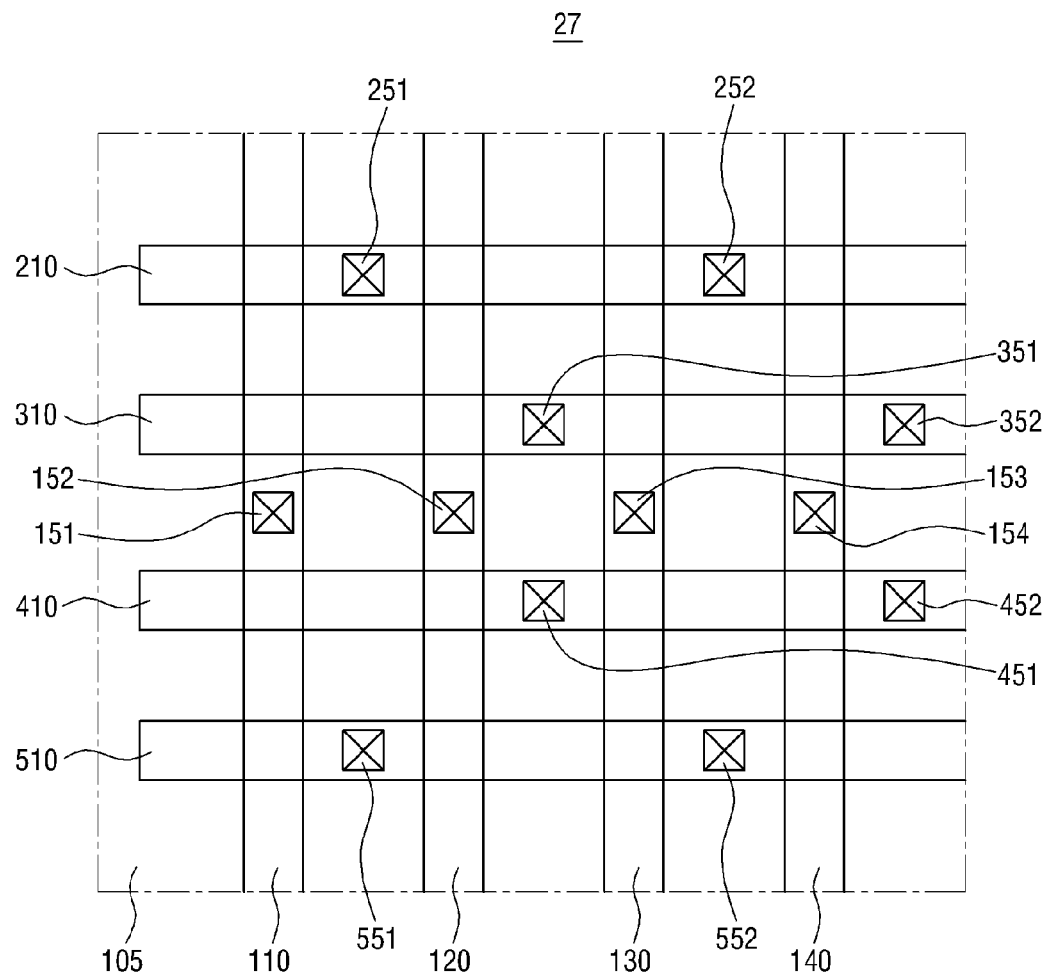
FIGS. 33 through 65 are layout views of nonvolatile memory devices according to twenty-seventh through fifty-ninth embodiments of the present invention.

FIG. 33 is a layout view of a nonvolatile memory device 27 according to a twenty-seventh embodiment of the present invention. FIG. 34 is a layout view of a nonvolatile memory device 28 according to a twenty-eighth embodiment of the present invention. FIG. 35 is a layout view of a nonvolatile memory device 29 according to a twenty-ninth embodiment of the present invention.

Referring to FIG. 33, in the nonvolatile memory device 27 according to the twenty-seventh embodiment of the present invention, each of a (2_1)th strap contact 351 and a (3_1)th strap contact 451 is formed between a second active region 120 and a third active region 130.

In addition, each of a (2_2)th strap contact 352 and a (3_2)th strap contact 452 is not formed between a first active region 110 and a fourth active region 140. For example, each of the (2_2)th strap contact 352 and the (3_2)th strap contact 452 may be formed between the fourth active region 140 and an active region most adjacent to the fourth active region 140.

In the nonvolatile memory device 27 according to the twenty-seventh embodiment of the present invention, no strap contact connected to each of a second wiring line 330 and a third wiring line 430 is formed between the first active region 110 and the second active region 120 or between the third active region 130 and the fourth active region 140.

In FIG. 33, no strap contact is formed at an end of a second gate electrode 310 which protrudes from the first active region 110 in a second direction Y and at an end of a third gate electrode 410 which protrudes from the first active region 110 in the second direction Y. However, the present invention is not limited thereto.

Figure 34:
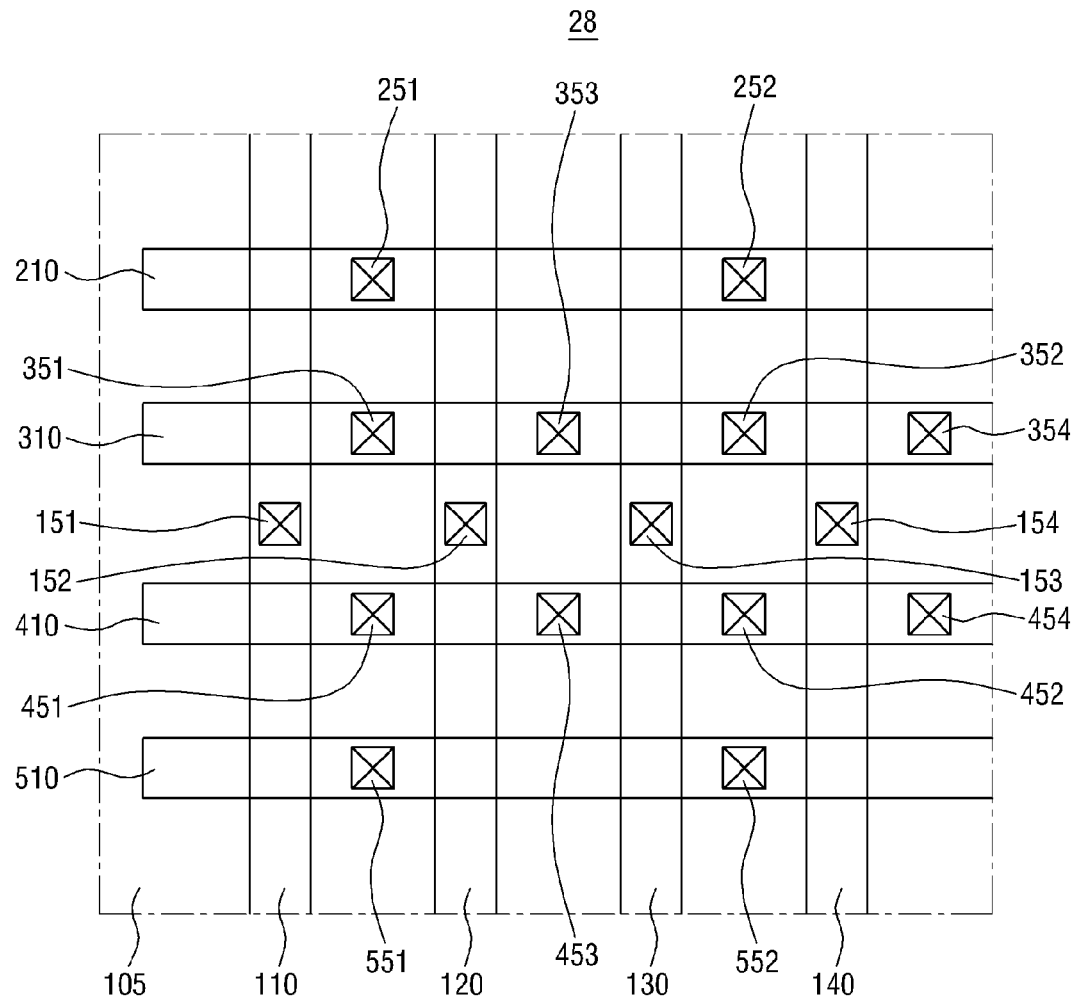

Referring to FIG. 34, the nonvolatile memory device 28 according to the twenty-eighth embodiment of the present invention further includes a (2_3)th strap contact 353, a (2_4)th strap contact 354, a (3_3)th strap contact 453, and a (3_4)th strap contact 454.

Each of the (2_3)th strap contact 353 and the (2_4)th strap contact 354 connects a second wiring line 330 and a second gate electrode 310, and the (3_3)th strap contact 453 and the (3_4)th strap contact 454 connects a third wiring line 430 and a third gate electrode 410.

Each of the (2_3)th strap contact 353 and the (3_3)th strap contact 453 is formed between a second active region 120 and a third active region 130. Each of the (2_4)th strap contact 354 and the (3_4)th strap contact 454 is not formed between a first active region 110 and a fourth active region 140. For example, each of the (2_4)th strap contact 354 and the (3_4)th strap contact 454 may be formed between the fourth active region 140 and an active region most adjacent to the fourth active region 140.

In FIG. 34, no strap contact is formed at an end of the second gate electrode 310 which protrudes from the first active region 110 in a second direction Y and at an end of the third gate electrode 410 which protrudes from the first active region 110 in the second direction Y. However, the present invention is not limited thereto.

Figure 35:
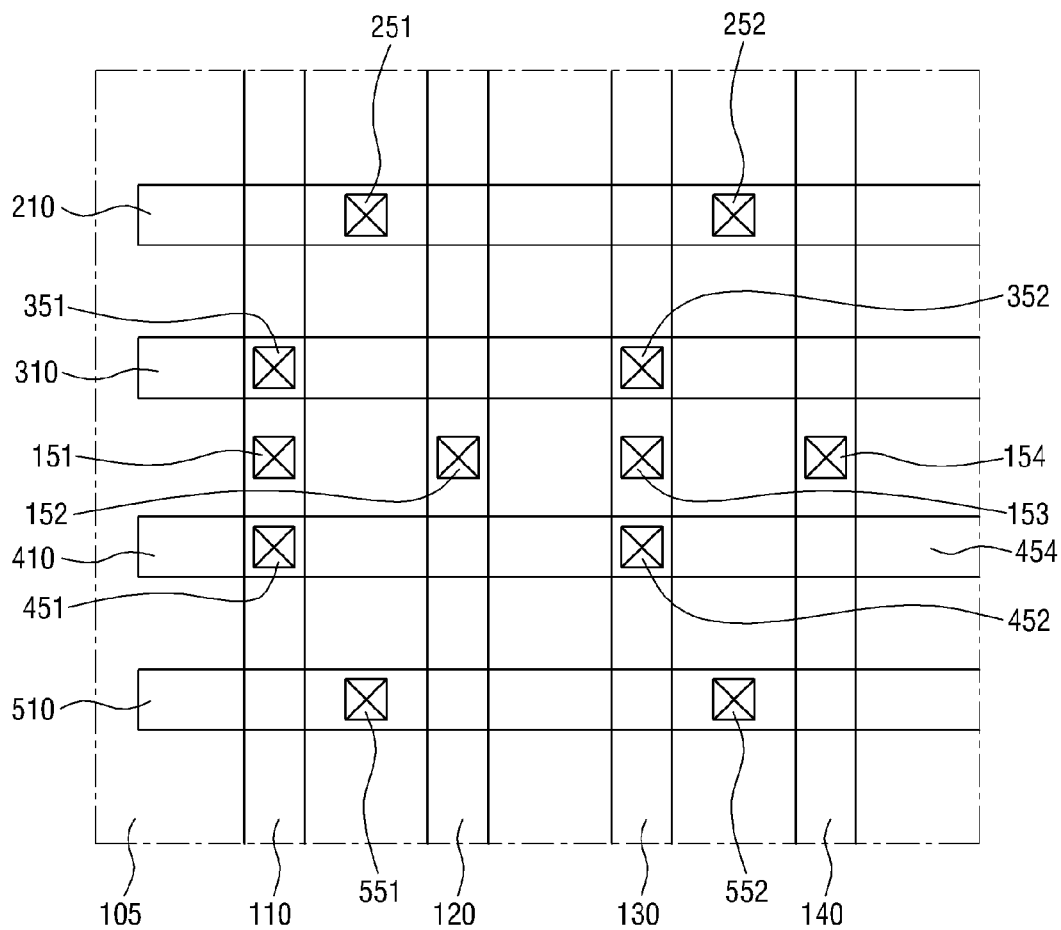

Referring to FIG. 35, in the nonvolatile memory device 29 according to the twenty-ninth embodiment of the present invention, a (2_1)th strap contact 351 is formed on an area in which a first active region 110 and a second gate electrode 310 overlap each other. A (2_2)th strap contact 352 is formed on an area in which a third active region 130 and a second gate electrode 310 overlap each other.

In addition, a (3_1)th strap contact 451 is formed on an area in which the first active region 110 and a third gate electrode 410 overlap each other. A (3_2)th strap contact 452 is formed on an area in which the third active region 130 and the third gate electrode 410 overlap each other.

Nonvolatile memory devices according thirtieth and thirty-first embodiments of the present invention will now be described with reference to FIGS. 36 and 37. For simplicity, the current embodiments will hereinafter be described, focusing mainly on differences with the embodiment of FIG. 35.

Figure 36:
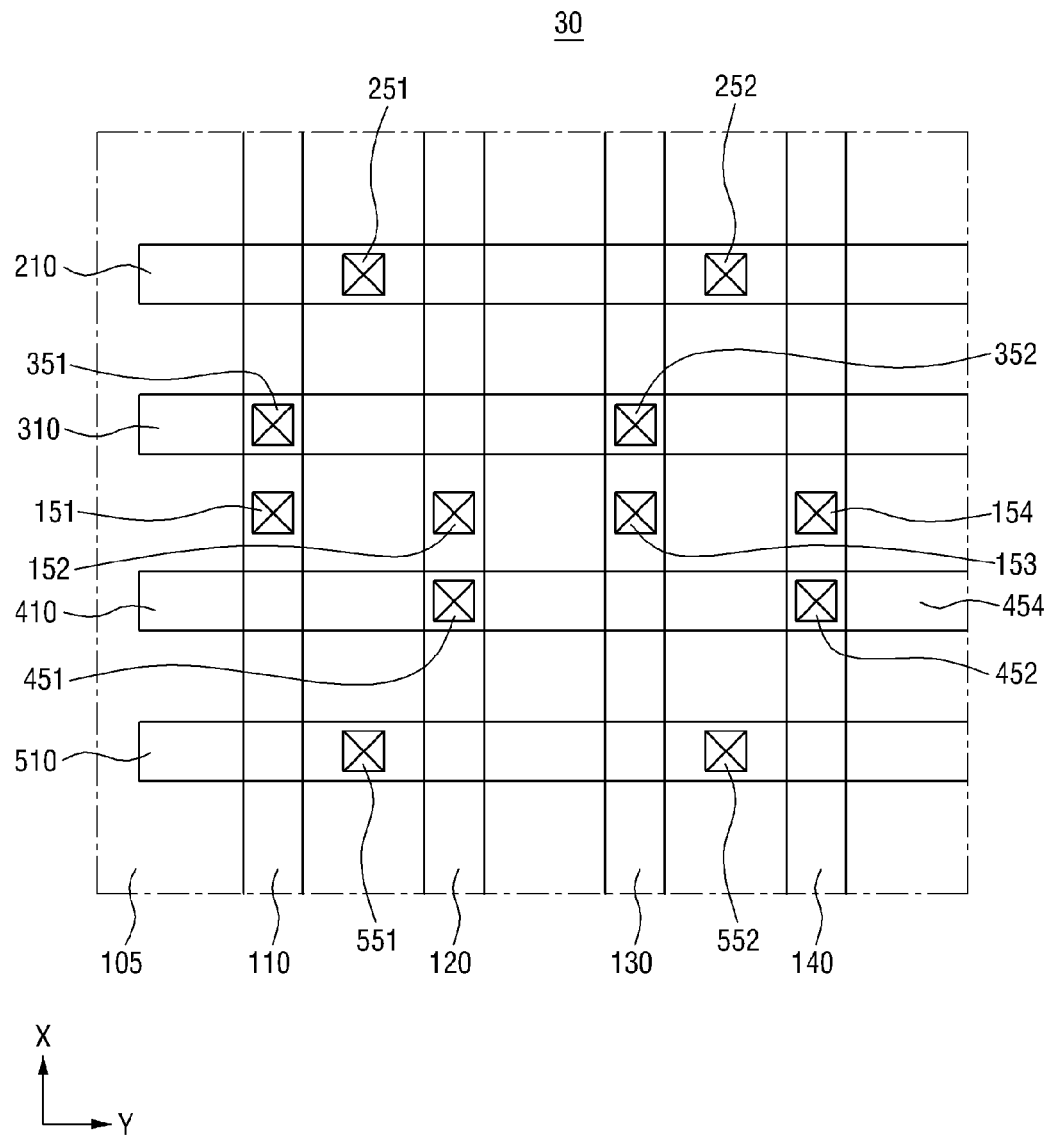

FIG. 36 is a layout view of a nonvolatile memory device 30 according to a thirtieth embodiment of the present invention. FIG. 37 is a layout view of a nonvolatile memory device 31 according to a thirty-first embodiment of the present invention.

Referring to FIG. 36, in the nonvolatile memory device 30 according to the thirtieth embodiment of the present invention, a (3_1)th strap contact 451 is formed on an area in which a second active region 120 and a third gate electrode 410 overlap each other. A (3_2)th strap contact 452 is formed on an area in which a fourth active region 140 and the third gate electrode 410 overlap each other.

A (1_1)th strap contact 251 and a (4_1)th strap contact 551 are formed symmetrical to each other with respect to first through fourth bit line contacts 151 through 154 arranged in a row. However, a (2_1)th strap contact 351 and the (3_1)th strap contact 451 are not formed symmetrical to each other with respect to the first through fourth bit line contacts 151 through 154 arranged in a row.

Figure 37:
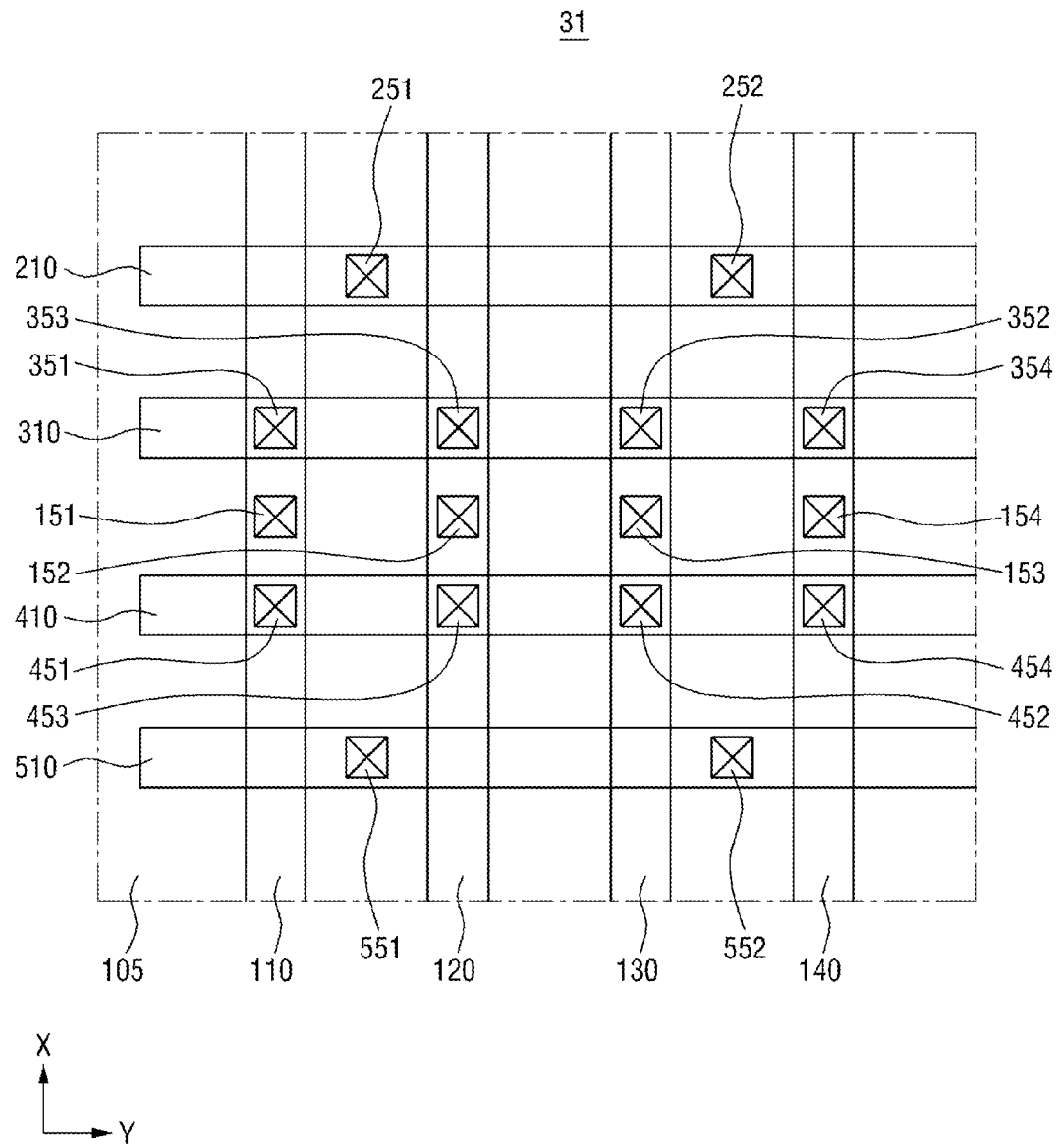

Referring to FIG. 37, the nonvolatile memory device 31 according to the thirty-first embodiment of the present invention further includes a (2_3)th strap contact 353, a (2_4)th strap contact 354, a (3_3)th strap contact 453, and a (3_4)th strap contact 454.

The (2_3)th strap contact 353 is formed on an area in which a second active region 120 and a second gate electrode 310 overlap each other. The (3_3)th strap contact 453 is formed on an area in which the second active region 120 and a third gate electrode 410 overlap each other.

The (2_4)th strap contact 354 is formed on an area in which a fourth active region 140 and the second gate electrode 310 overlap each other. The (3_4)th strap contact 454 is formed on an area in which the fourth active region 140 and the third gate electrode 410 overlap each other.

The second strap contacts 351 through 354 are respectively formed on areas in which the second gate electrode 310 overlaps the active regions 110 through 140, and the third strap contacts 451 through 454 are respectively formed on areas in which the third gate electrode 410 overlaps the active regions 110 through 140.

Figure 38:
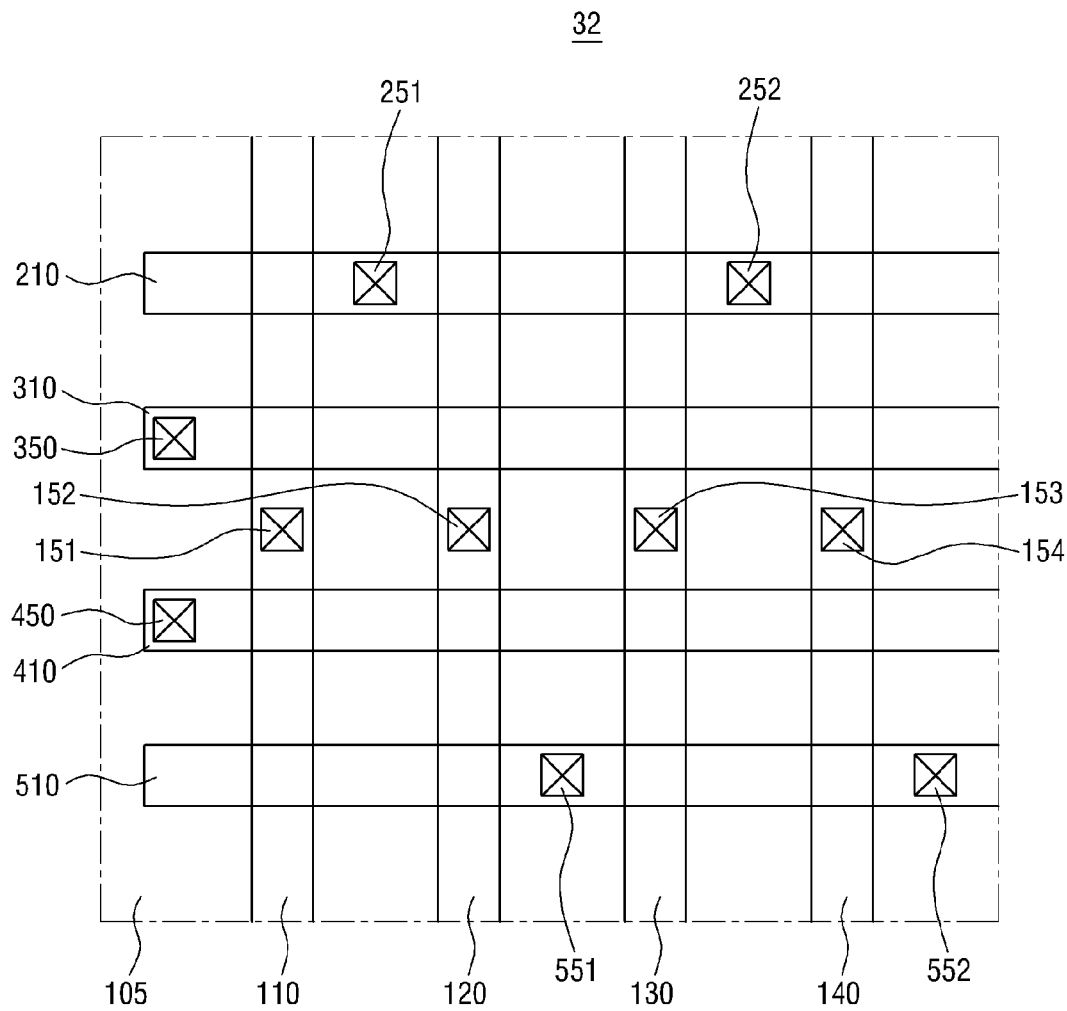

FIG. 38 is a layout view of a nonvolatile memory device 32 according to a thirty-second embodiment of the present invention. For simplicity, the current embodiment will hereinafter be described, focusing mainly on differences with the embodiment of FIGS. 31A and 31B.

Referring to FIG. 38, in the nonvolatile memory device 32 according to the thirty-second embodiment of the present invention, a (4_1)th strap contact 551 is formed between a second active region 120 and a third active region 130.

A (4_2)th strap contact 552 is not formed between a first active region 110 and a fourth active region 140. For example, the (4_2)th strap contact 552 may be formed between the fourth active region 140 and an active region most adjacent to the fourth active region 140.

That is, a (1_1)th strap contact 251 and the (4_1)th strap contact 551 are not formed symmetrical to each other with respect to first through fourth bit line contacts 151 through 154 arranged in a row.

In FIG. 38, no strap contact is formed at an end of a fourth gate electrode 510 which protrudes from the first active region 110 in a second direction Y. However, the present invention is not limited thereto.

Figure 39:
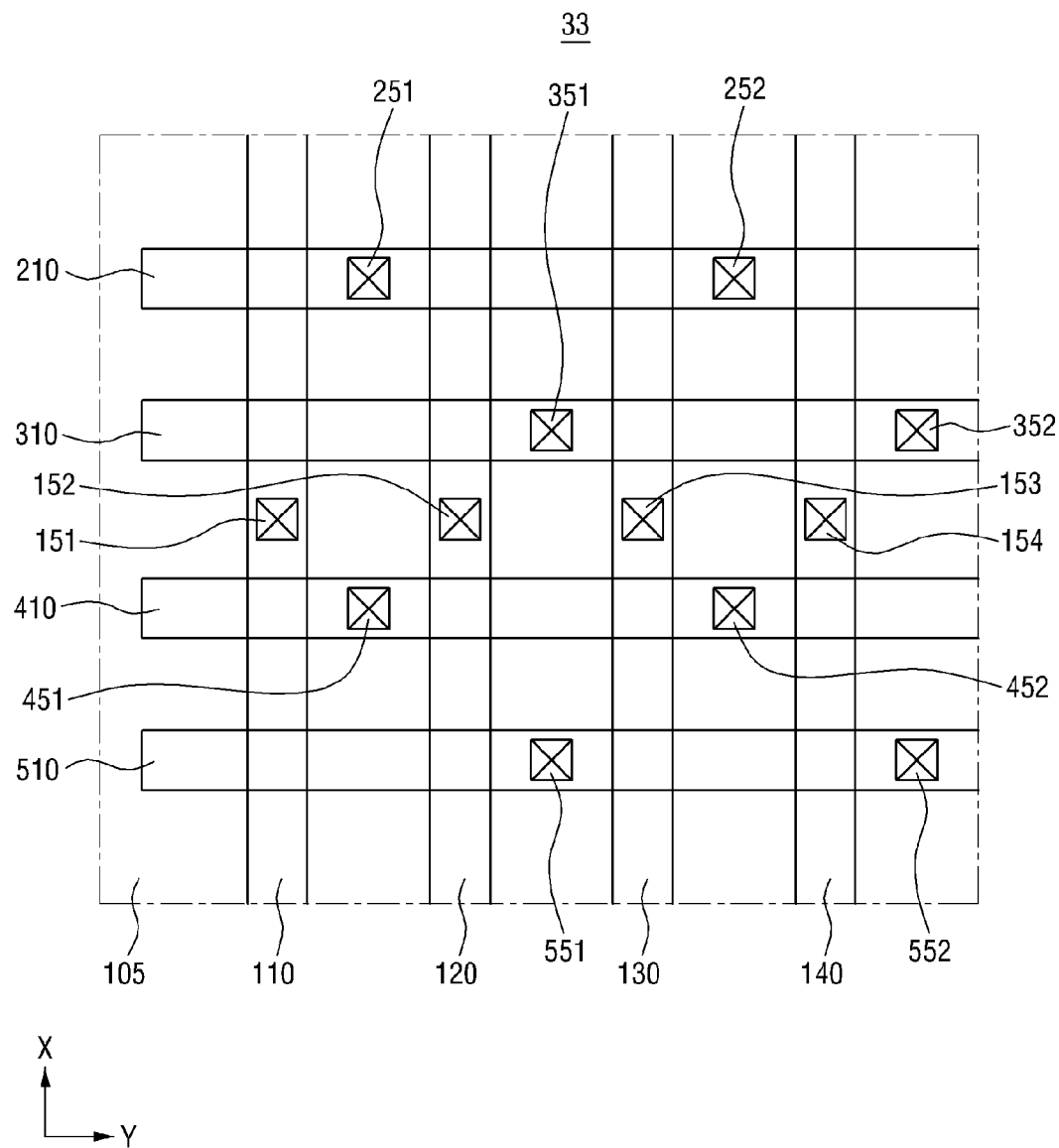

FIG. 39 is a layout view of a nonvolatile memory device 33 according to a thirty-third embodiment of the present invention. For simplicity, the current embodiment will hereinafter be described, focusing mainly on differences with the embodiment of FIGS. 32A and 32B.

Referring to FIG. 39, in the nonvolatile memory device 33 according to the thirty-third embodiment of the present invention, each of a (2_1)th strap contact 351 and a (4_1)th strap contact 551 is formed between a second active region 120 and a third active region 130.

A (2_2)th strap contact 352 and a (4_2)th strap contact 552 are not formed between a first active region 110 and a fourth active region 140. For example, each of the (2_2)th strap contact 352 and the (4_2)th strap contact 552 may be formed between the fourth active region 140 and an active region most adjacent to the fourth active region 140.

In FIG. 39, no strap contact is formed at an end of a second gate electrode 310 which protrudes from a first active region 110 in a second direction Y and at an end of a fourth gate electrode 510 which protrudes from the first active region 110 in the second direction Y. However, the present invention is not limited thereto.

Nonvolatile memory devices according thirty-fourth and thirty-sixth embodiments of the present invention will now be described with reference to FIGS. 40 through 42. For simplicity, the thirty-fourth embodiment will be described, focusing mainly on differences with the embodiment of FIG. 34. The thirty-fifth embodiment will be described, focusing mainly on differences with the embodiment of FIG. 35. The thirty-sixth embodiment will be described, focusing mainly on differences with the embodiment of FIG. 37.

Figure 40:
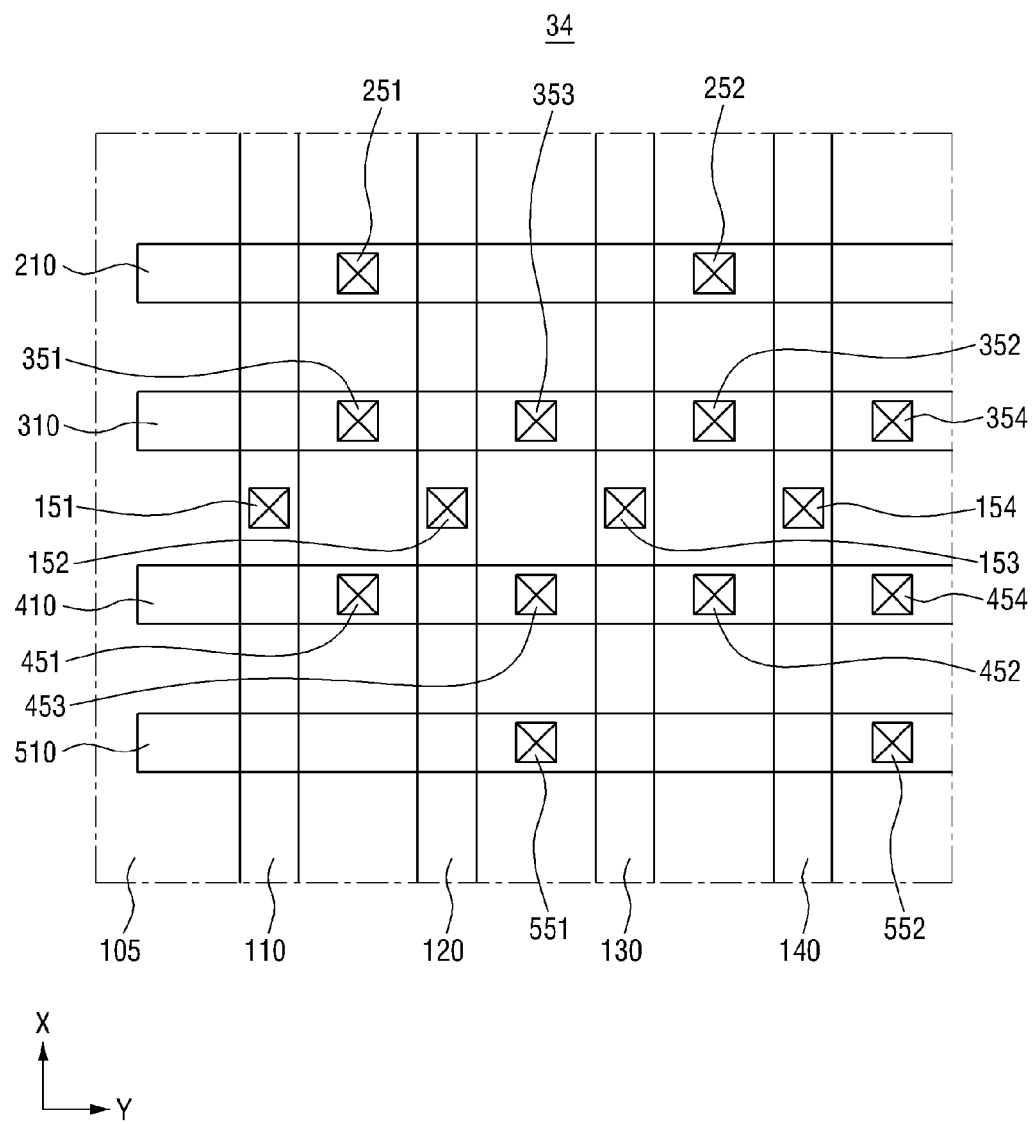
Figure 41:
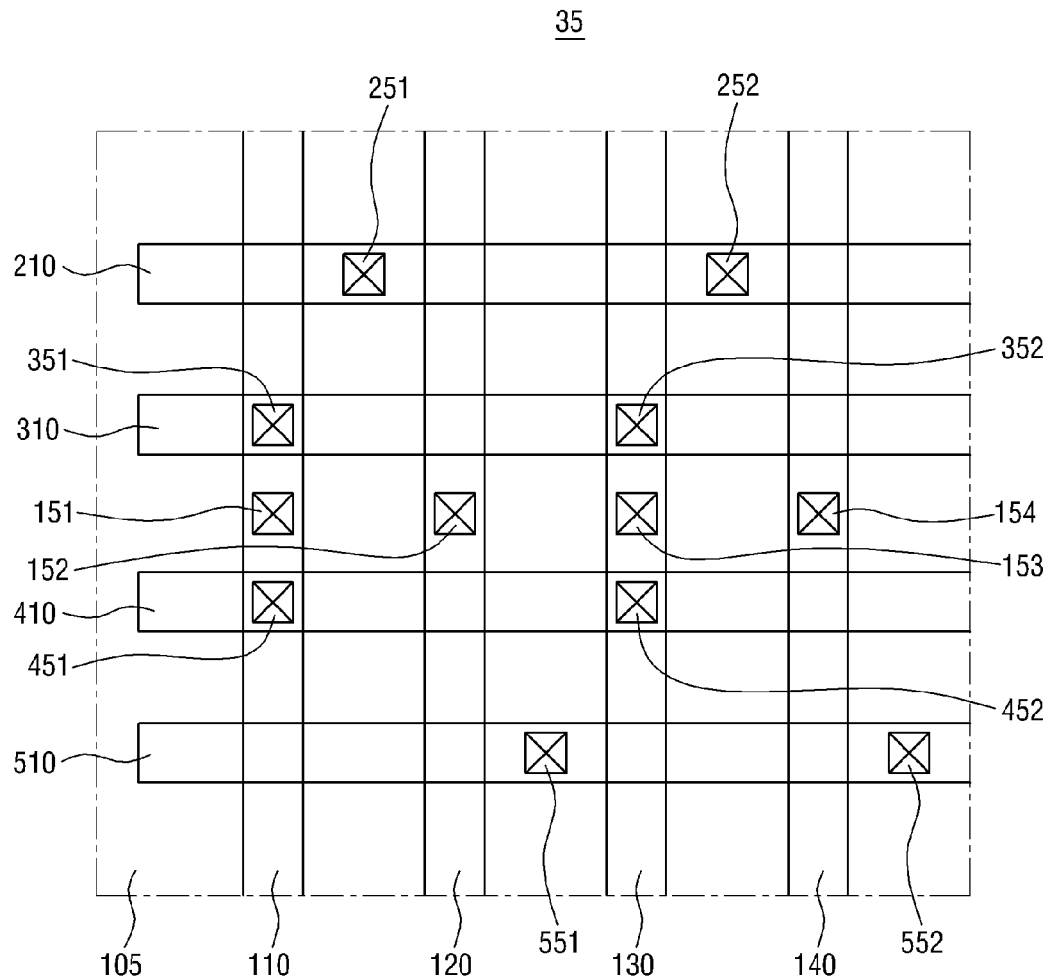
Figure 42:
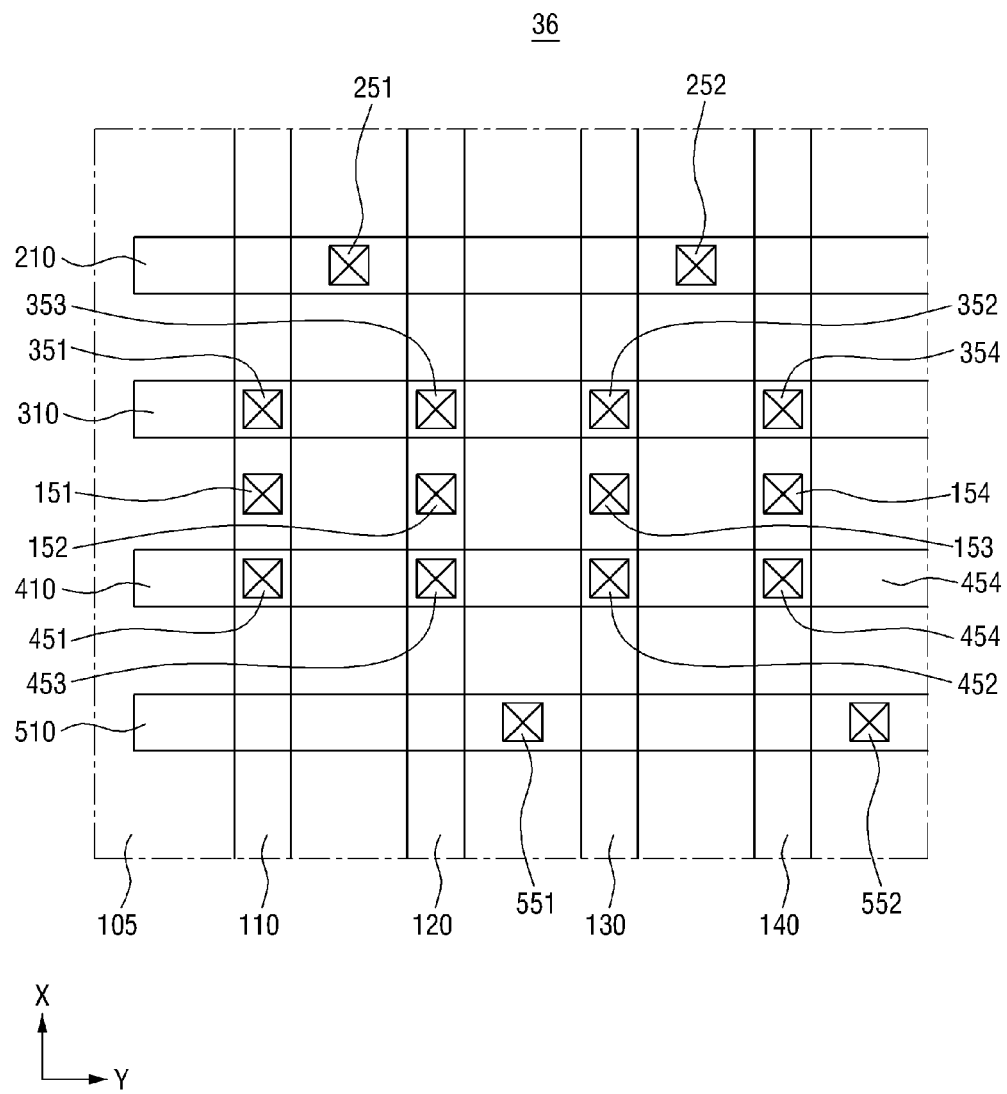

FIGS. 40 through 42 are layout views of nonvolatile memory devices 34 through 36 according to thirty-fourth through thirty-sixth embodiments of the present invention.

Referring to FIGS. 40 through 42, in the nonvolatile memory devices 34 through 36 according to the thirty-fourth through thirty-sixth embodiments of the present invention, a (4_1)th strap contact 551 is formed between a second active region 120 and a third active region 130.

A (4_2)th strap contact 552 is not formed between a first active region 110 and a fourth active region 140. For example, the (4_2)th strap contact 552 may be formed between the fourth active region 140 and an active region most adjacent to the fourth active region 140.

In FIGS. 40 through 42, no strap contact is formed at an end of a fourth gate electrode 510 which protrudes from the first active region 110 in a second direction Y. However, the present invention is not limited thereto.

Further, in FIG. 41, a (3_1)th strap contact 451 can also be formed on an area in which the second active region 120 and a third gate electrode 410 overlap each other, and a (3_2)th strap contact 452 can also be formed on an area in which the fourth active region 140 and the third gate electrode 410 overlap each other. That is, the positional relationship between second strap contacts 351 and 352 and the third strap contacts 451 and 452 can be changed.

Figure 43:
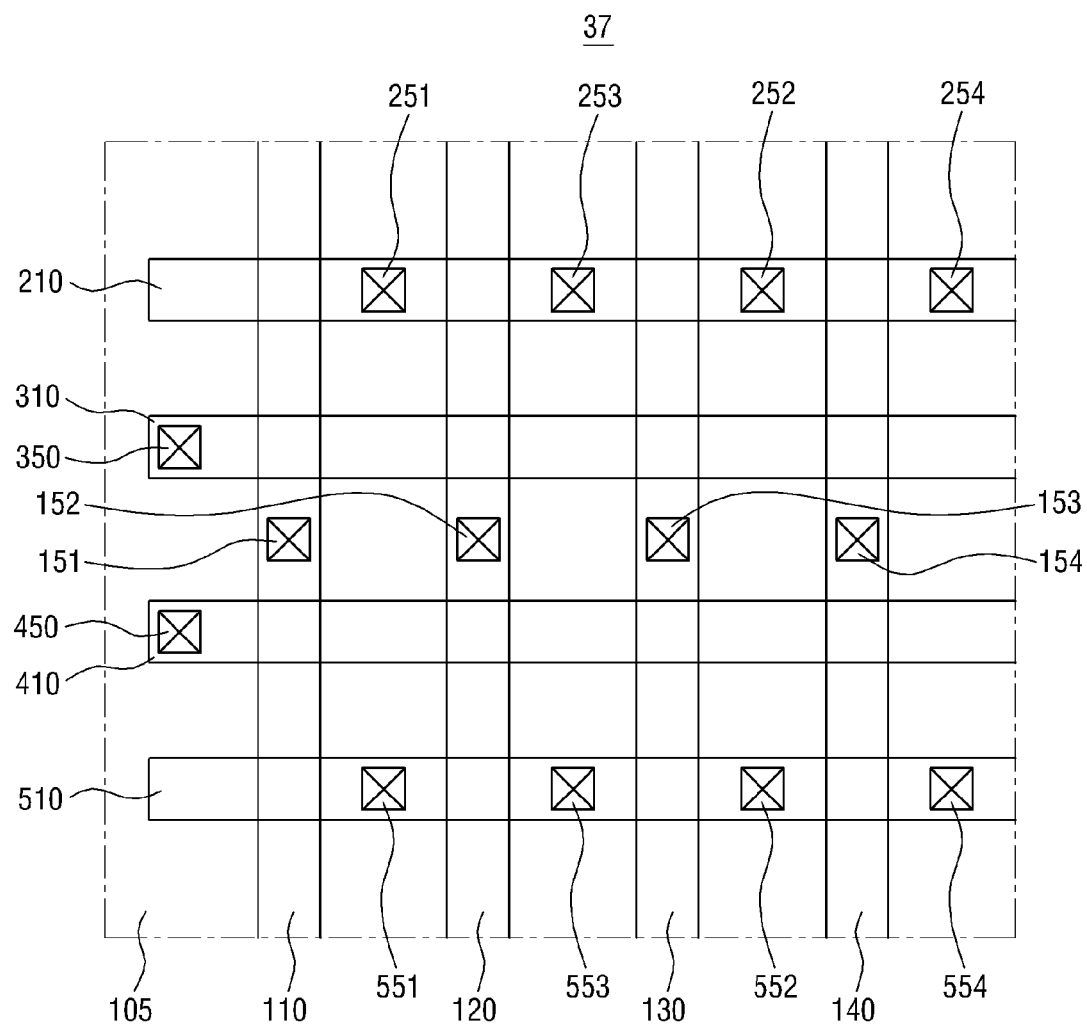

FIG. 43 is a layout view of a nonvolatile memory device 37 according to a thirty-seventh embodiment of the present invention. For simplicity, the current embodiment will hereinafter be described, focusing mainly on differences with the embodiment of FIGS. 31A and 31B.

Referring to FIG. 43, the nonvolatile memory device 37 according to the thirty-seventh embodiment of the present invention further includes a (1_3)th strap contact 253, a (1_4)th strap contact 254, a (4_3)th strap contact 553, and a (4_4)th strap contact 554.

Each of the (1_3)th strap contact 253 and the (4_3)th strap contact 553 is formed between a second active region 120 and a third active region 130. Each of the (1_4)th strap contact 254 and the (4_4)th strap contact 554 is not formed between a first active region 110 and a fourth active region 140. For example, each of the (1_4)th strap contact 254 and the (4_4)th strap contact 554 may be formed between the fourth active region 140 and an active region most adjacent to the fourth active region 140.

In FIG. 43, no strap contact is formed at an end of a first gate electrode 210 which protrudes from the first active region 110 in a second direction Y and at an end of a fourth gate electrode 510 which protrudes from the first active region 110 in the second direction Y. However, the present invention is not limited thereto.

Figure 44:
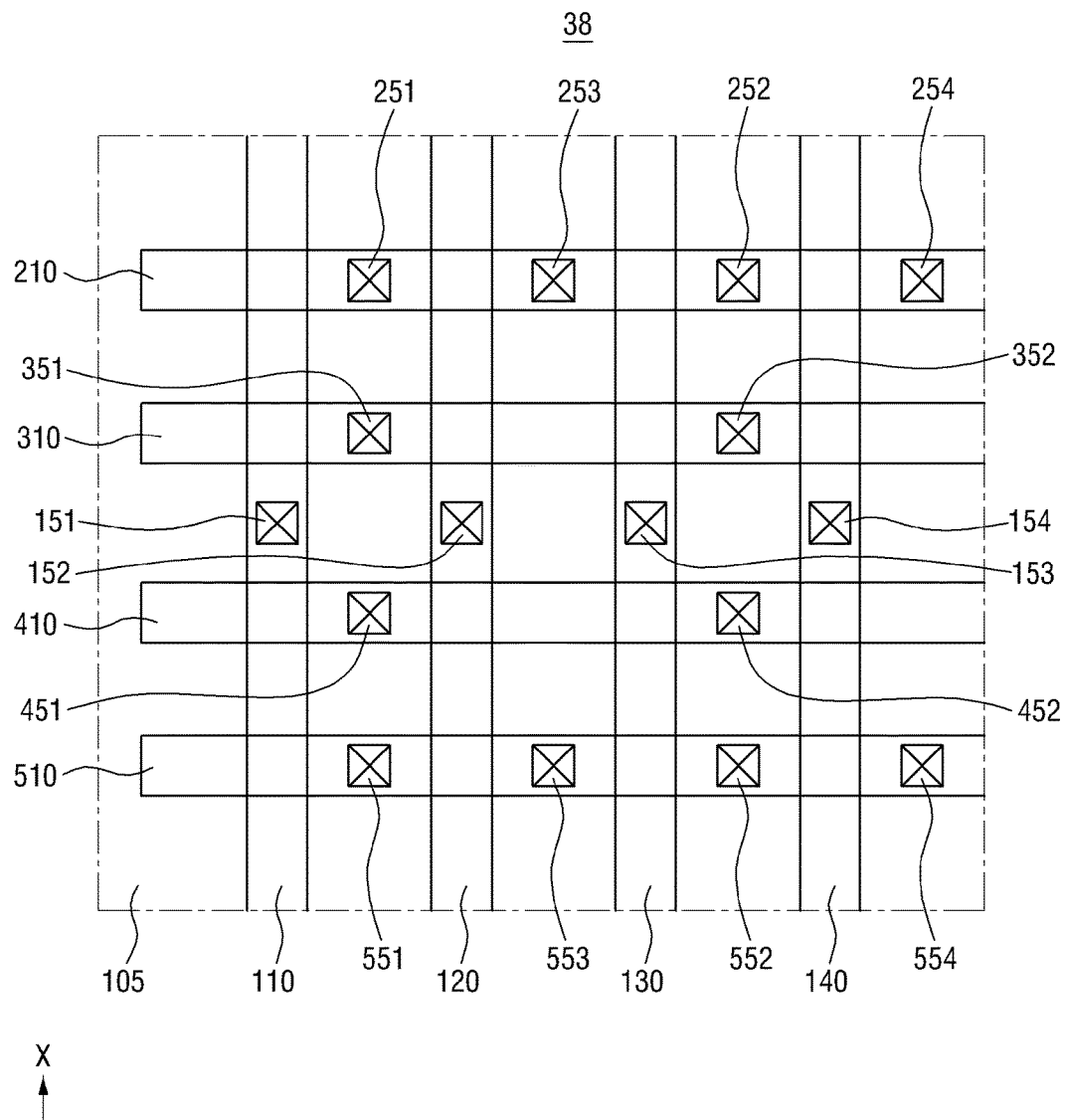

FIG. 44 is a layout view of a nonvolatile memory device 38 according to a thirty-eighth embodiment of the present invention. For simplicity, the current embodiment will hereinafter be described, focusing mainly on differences with the embodiment of FIGS. 32A and 32B.

Referring to FIG. 44, the nonvolatile memory device 38 according to the thirty-eighth embodiment of the present invention further includes a (1_3)th strap contact 253, a (1_4)th strap contact 254, a (4_3)th strap contact 553, and a (4_4)th strap contact 554.

Each of the (1_3)th strap contact 253 and the (4_3)th strap contact 553 is formed between a second active region 120 and a third active region 130.

Each of the (1_4)th strap contact 254 and the (4_4)th strap contact 554 is not formed between a first active region 110 and a fourth active region 140. For example, each of the (1_4)th strap contact 254 and the (4_4)th strap contact 554 may be formed between the fourth active region 140 and an active region most adjacent to the fourth active region 140.

Nonvolatile memory devices according thirty-ninth and forty-first embodiments of the present invention will now be described with reference to FIGS. 45 through 47. For simplicity, the current embodiments will hereinafter be described, focusing mainly on differences with the embodiment of FIG. 44.

Figure 45:
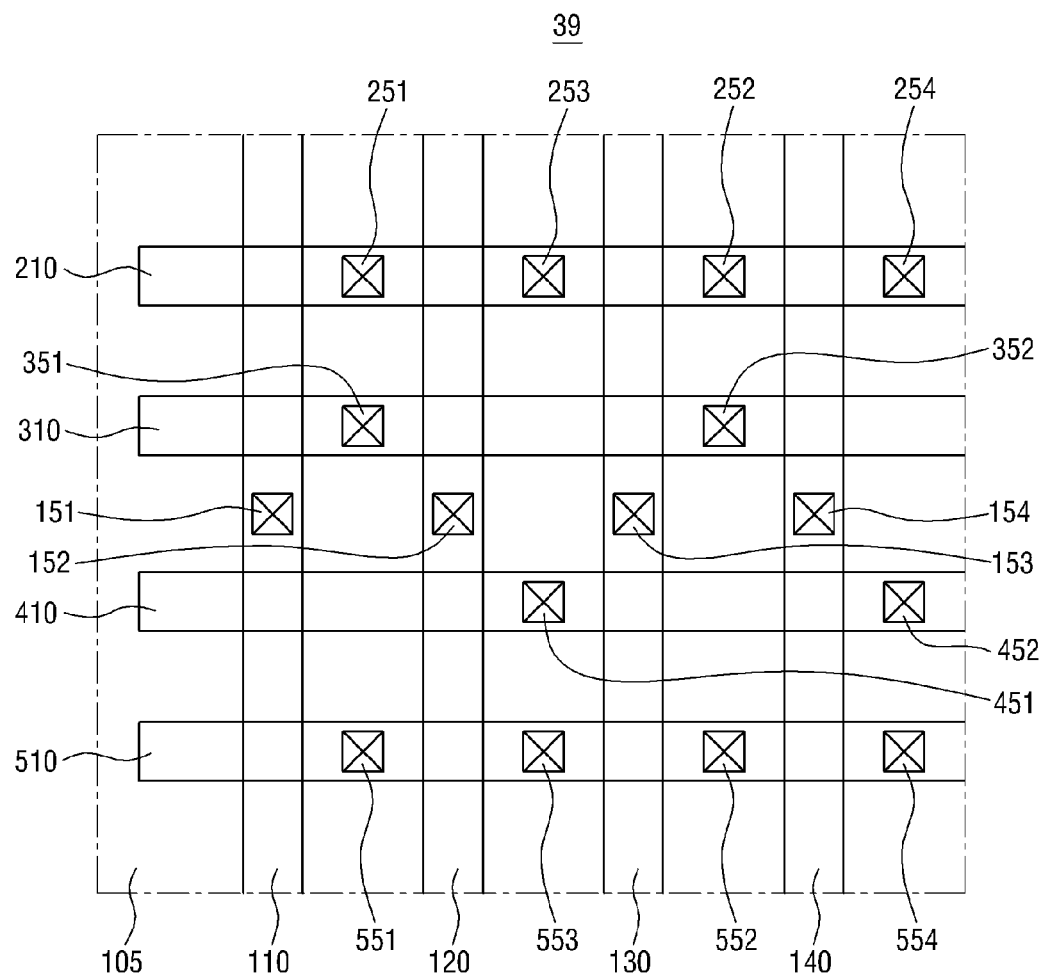
Figure 46:
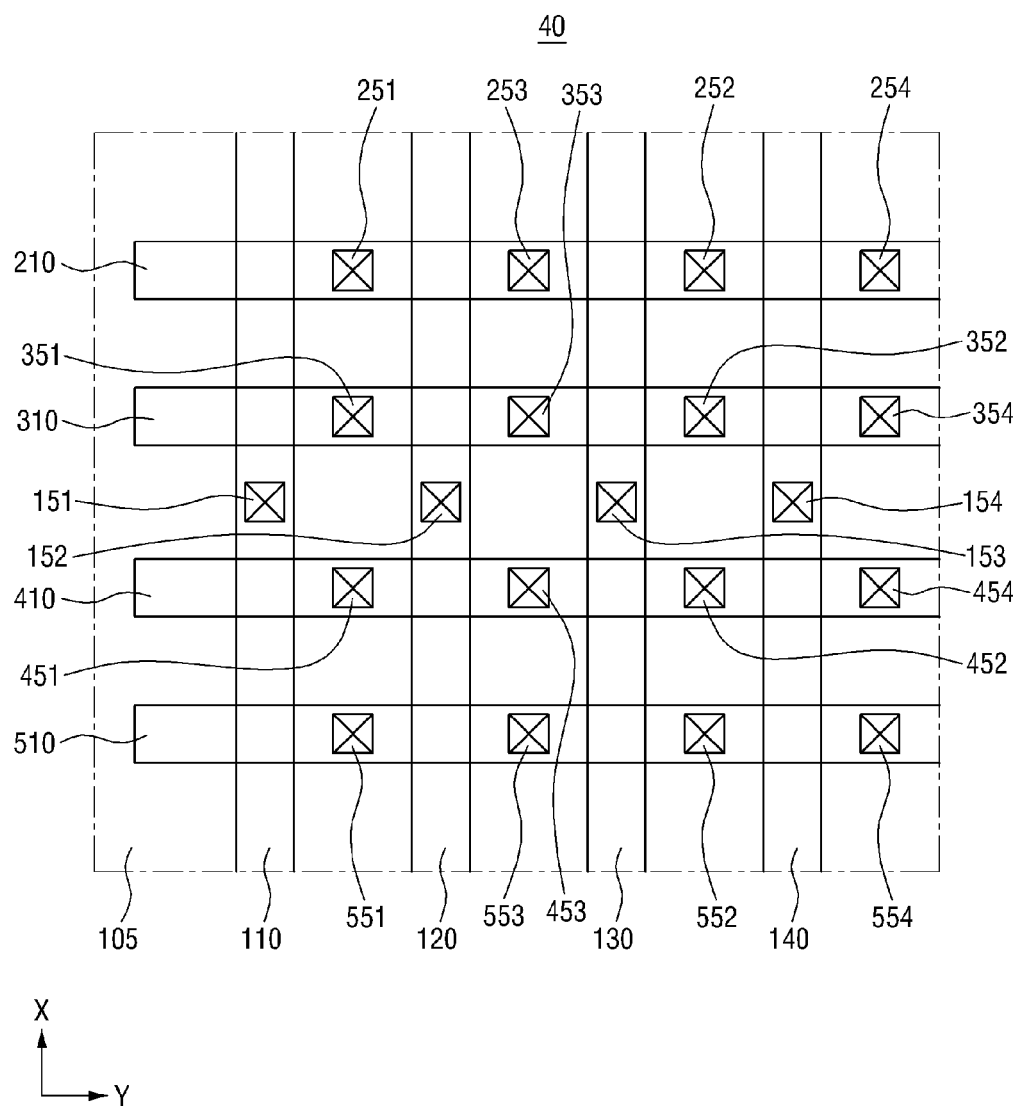
Figure 47:
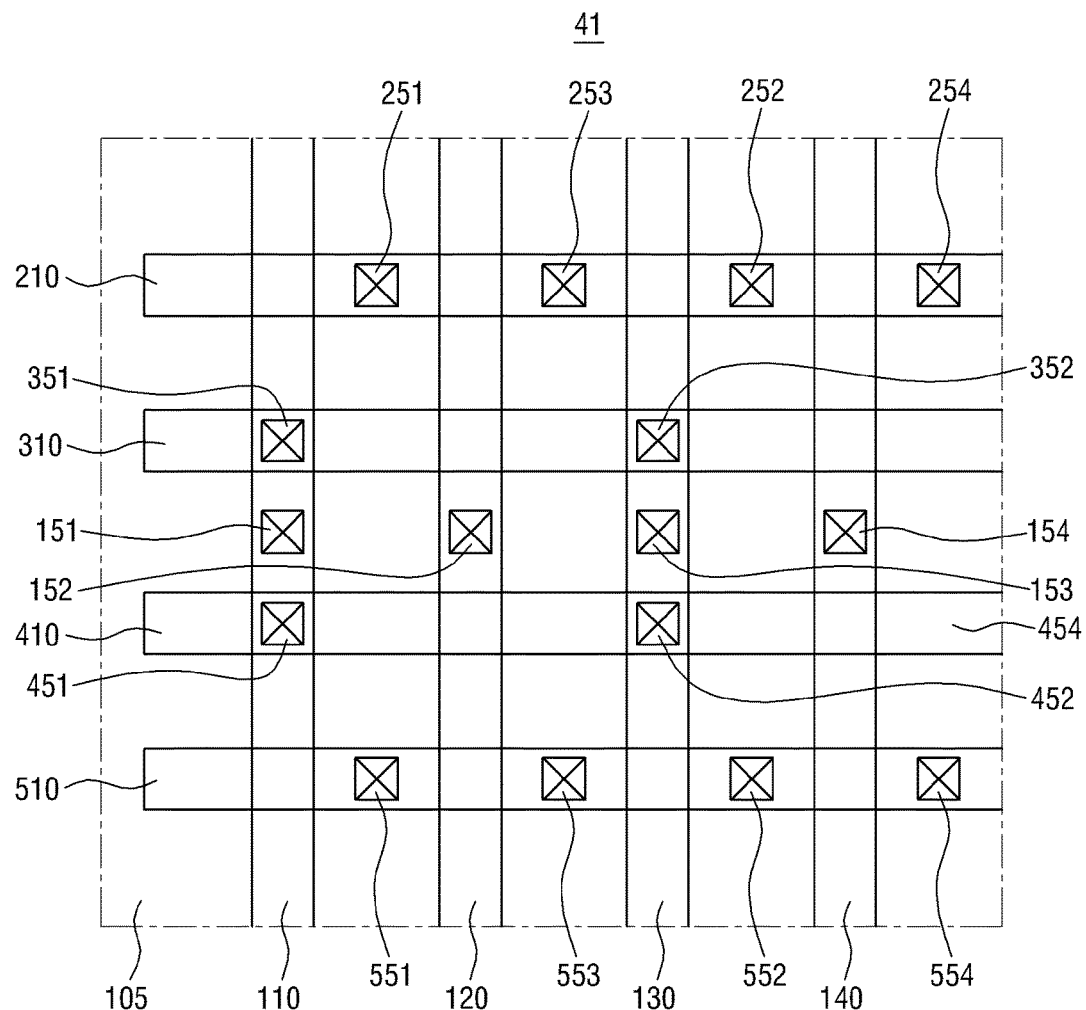

FIGS. 45 through 47 are layout views of nonvolatile memory devices 39 through 41 according to thirty-ninth through forty-first embodiments of the present invention.

Referring to FIG. 45, in the nonvolatile memory device 39 according to the thirty-ninth embodiment of the present invention, a (3_1)th strap contact 451 is formed between a second active region 120 and a third active region 130.

A (3_2)th strap contact 452 is not formed between a first active region 110 and a fourth active region 140. For example, the (3_2)th strap contact 452 may be formed between the fourth active region 140 and an active region most adjacent to the fourth active region 140.

In FIG. 45, no strap contact is formed at an end of a third gate electrode 410 which protrudes from the first active region 110 in a second direction Y. However, the present invention is not limited thereto.

Referring to FIG. 46, the nonvolatile memory device 40 according to the fortieth embodiment of the present invention further includes a (2_3)th strap contact 353, a (2_4)th strap contact 354, a (3_3)th strap contact 453, and a (3_4)th strap contact 454.

Each of the (2_3)th strap contact 353 and the (3_3)th strap contact 453 is formed between a second active region 120 and a third active region 130.

Each of the (2_4)th strap contact 354 and the (3_4)th strap contact 454 is not formed between a first active region 110 and a fourth active region 140. For example, each of the (2_4)th strap contact 354 and the (3_4)th strap contact 454 may be formed between the fourth active region 140 and an active region most adjacent to the fourth active region 140.

Referring to FIG. 47, in the nonvolatile memory device 41 according to the forty-first embodiment of the present invention, a (2_1)th strap contact 351 is formed on an area in which a first active region 110 and a second gate electrode 310 overlap each other. A (2_2)th strap contact 352 is formed on an area in which a third active region 130 and the second gate electrode 310 overlap each other.

In addition, a (3_1)th strap contact 451 is formed on an area in which the first active region 110 and a third gate electrode 410 overlap each other. A (3_2)th strap contact 452 is formed on an area in which the third active region 130 and the third gate electrode 410 overlap each other.

Further, in FIG. 47, the (3_1)th strap contact 451 can also be formed on an area in which a second active region 120 and the third gate electrode 410 overlap each other, and the (3_2)th strap contact 452 can also formed on an area in which the fourth active region 140 and the third gate electrode 410 overlap each other. That is, the positional relationship between the second strap contacts 351 and 352 and the third strap contacts 451 and 452 can be changed.

Figure 48:
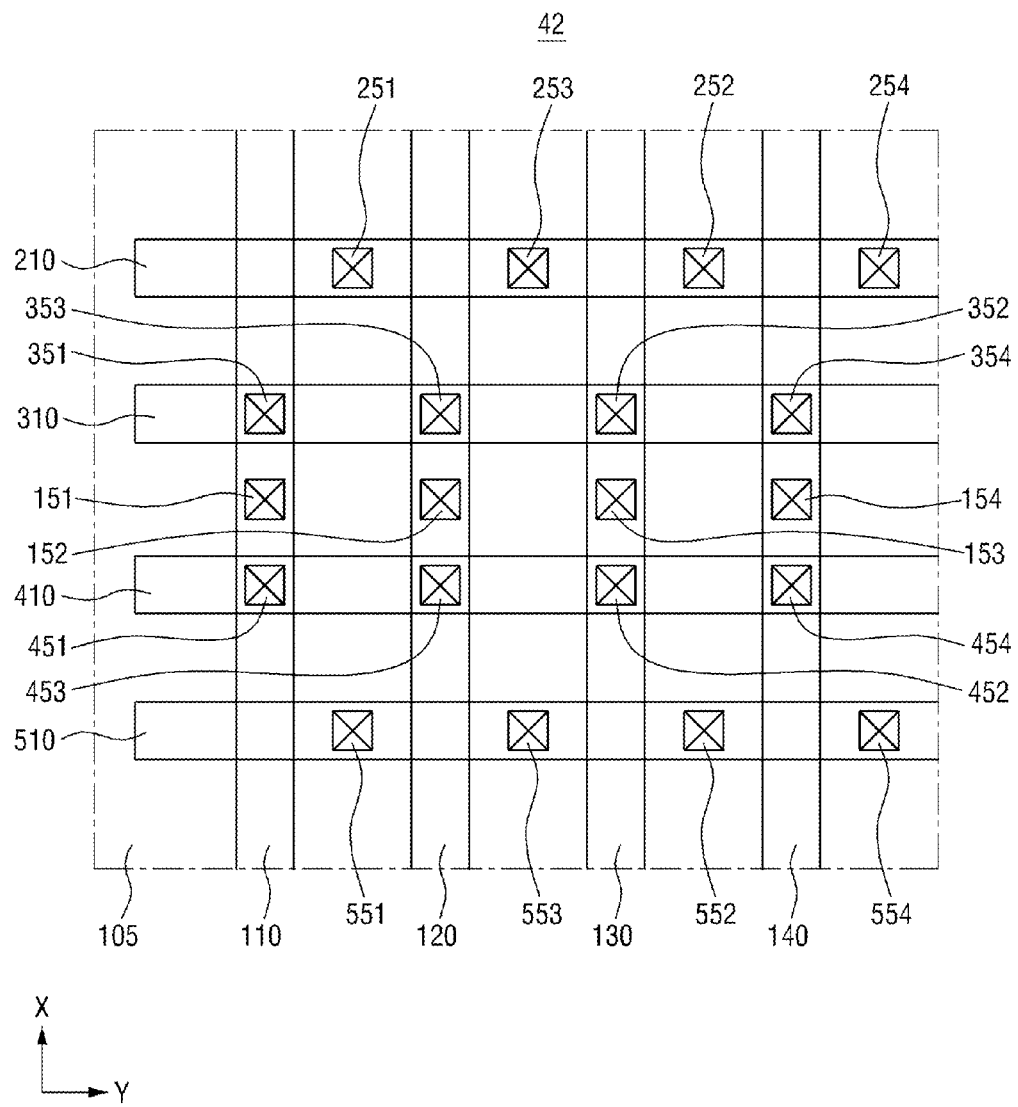

FIG. 48 is a layout view of a nonvolatile memory device 42 according to a forty-second embodiment of the present invention. For simplicity, the current embodiment will hereinafter be described, focusing mainly on differences with the embodiment of FIG. 47.

Referring to FIG. 48, the nonvolatile memory device 42 according to the forty-second embodiment of the present invention further includes a (2_3)th strap contact 353, a (2_4)th strap contact 354, a (3_3)th strap contact 453, and a (3_4)th strap contact 454.

The (2_3)th strap contact 353 is formed on an area in which a second active region 120 and a second gate electrode 310 overlap each other. The (3_3)th strap contact 453 is formed on an area in which the second active region 120 and a third gate electrode 410 overlap each other.

The (2_4)th strap contact 354 is formed on an area in which a fourth active region 140 and the second gate electrode 310 overlap each other. The (3_4)th strap contact 454 is formed on an area in which the fourth active region 140 and the third gate electrode 410 overlap each other.

Figure 49:
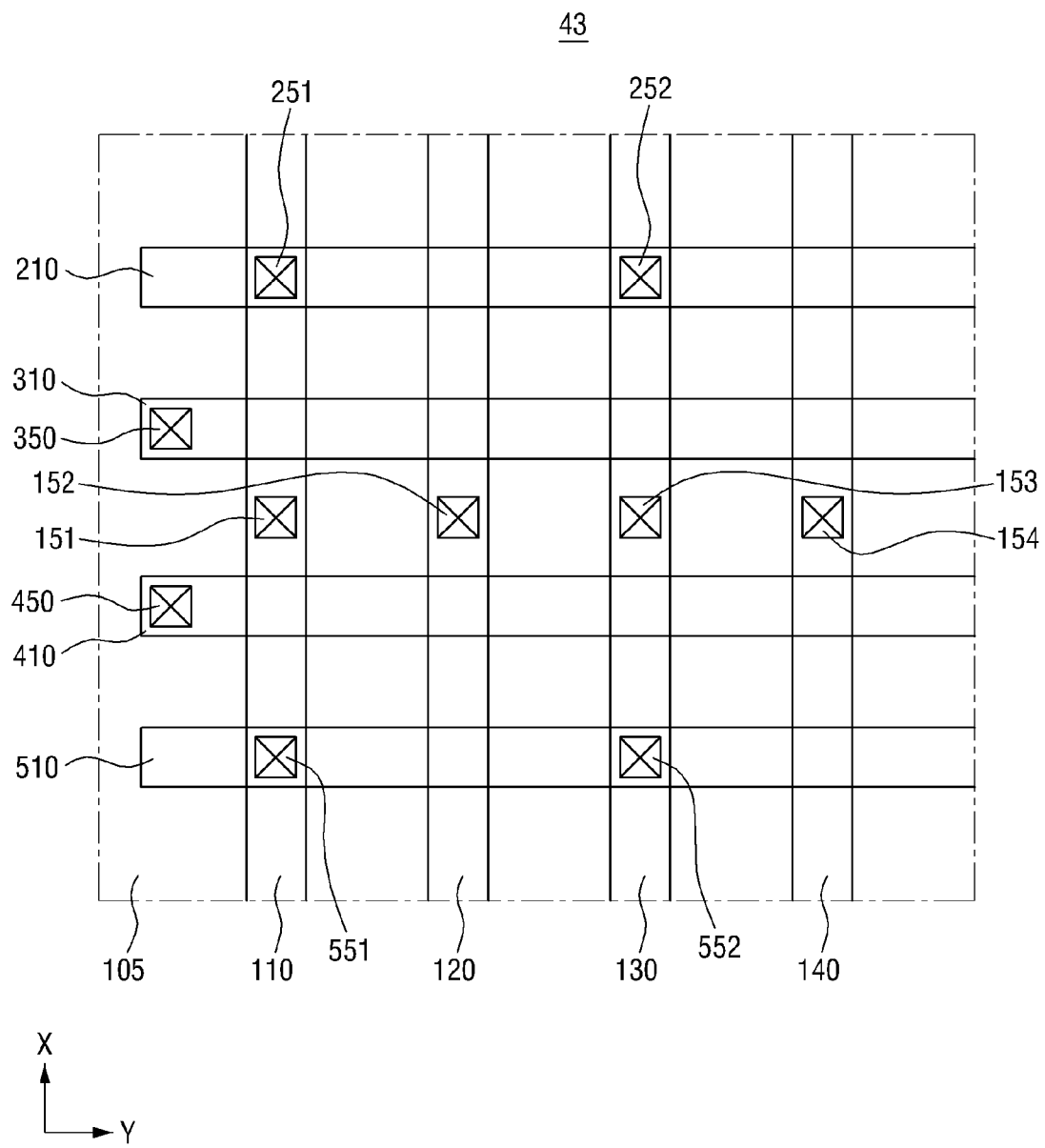

FIG. 49 is a layout view of a nonvolatile memory device 43 according to a forty-third embodiment of the present invention. For simplicity, the current embodiment will hereinafter be described, focusing mainly on differences with the embodiment of FIGS. 31A and 31B.

Referring to FIG. 49, in the nonvolatile memory device 43 according to the forty-third embodiment of the present invention, a (1_1)th strap contact 251 is formed on an area in which a first gate electrode 210 and a first active region 110 overlap each other. A (1_2)th strap contact 252 is formed on an area in which the first gate electrode 210 and a third active region 130 overlap each other.

In addition, a (4_1)th strap contact 551 is formed on an area in which a fourth gate electrode 510 and the first active region 110 overlap each other. A (4_2)th strap contact 552 is formed on an area in which the fourth gate electrode 510 and the third active region 130 overlap each other.

Further, in FIG. 49, the (4_1)th strap contact 551 can also be formed on an area in which a second active region 120 and the fourth gate electrode 510 overlap each other, and the (4_2)th strap contact 552 can also formed on an area in which a fourth active region 140 and the fourth gate electrode 510 overlap each other. That is, the positional relationship between the first strap contacts 251 and 252 and the fourth strap contacts 551 and 552 can be changed.

Figure 50:
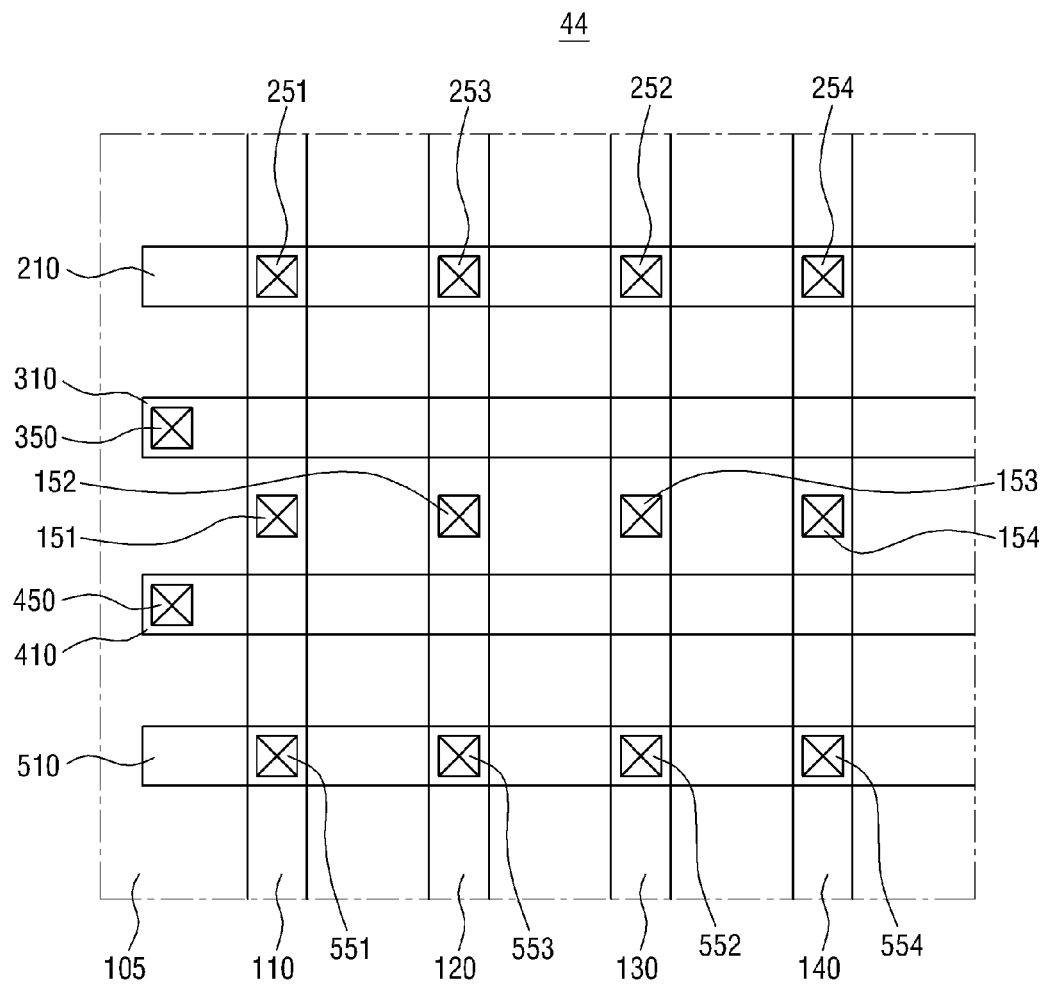

FIG. 50 is a layout view of a nonvolatile memory device 44 according to a forty-fourth embodiment of the present invention. For simplicity, the current embodiment will hereinafter be described, focusing mainly on differences with the embodiment of FIG. 49.

Referring to FIG. 50, the nonvolatile memory device 44 according to the forty-fourth embodiment of the present invention further includes a (1_3)th strap contact 253, a (1_4)th strap contact 254, a (4_3)th strap contact 553, and a (4_4)th strap contact 554.

The (1_3)th strap contact 253 is formed on an area in which a first gate electrode 210 and a second active region 120 overlap each other. The (1_4)th strap contact 254 is formed on an area in which the first gate electrode 210 and a fourth active region 140 overlap each other.

The (4_3)th strap contact 553 is formed on an area in which a fourth gate electrode 510 and the second active region 120 overlap each other. The (4_4)th strap contact 554 is formed on an area in which the fourth gate electrode 510 and the fourth active region 140 overlap each other.

Figure 51:
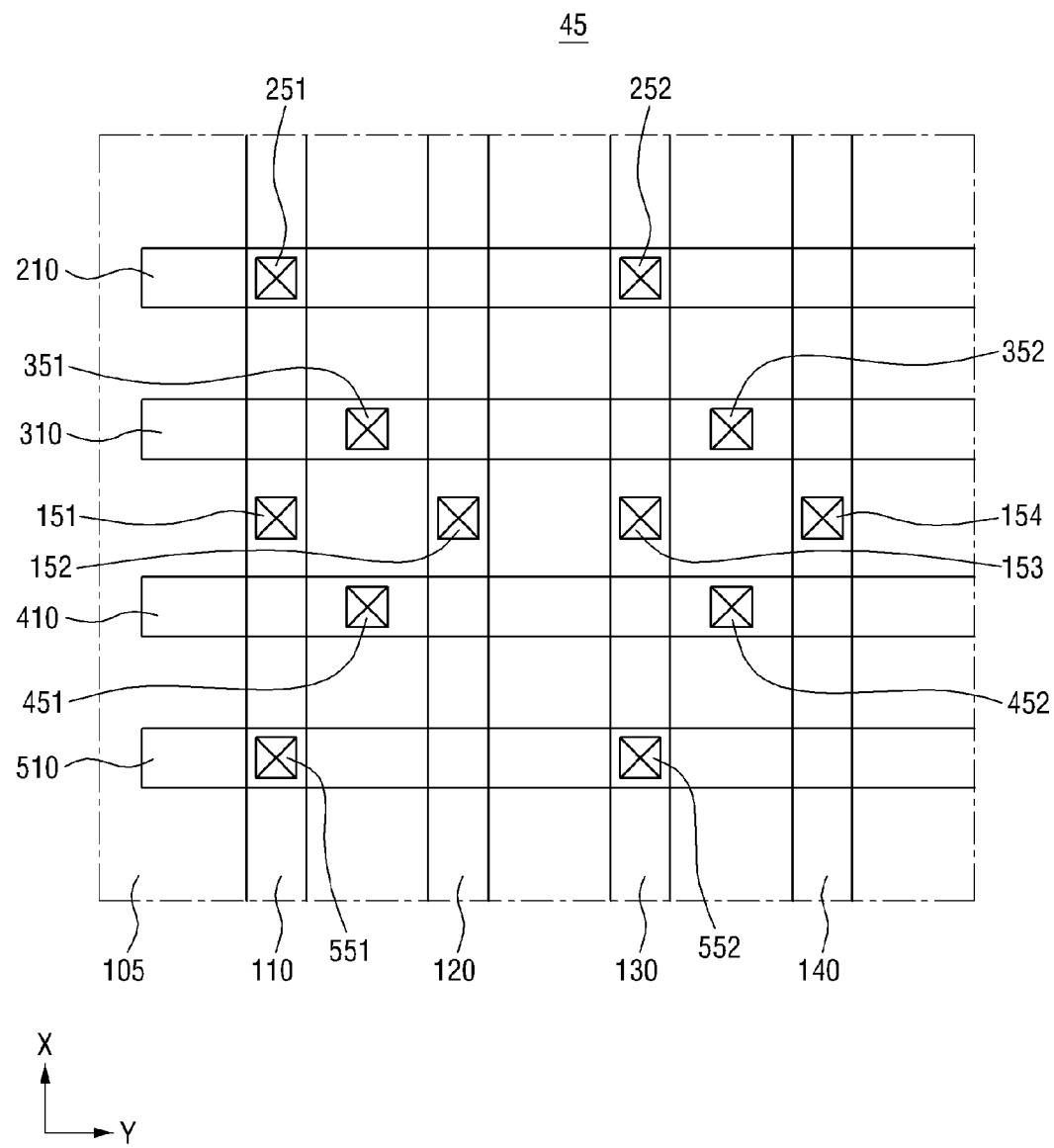

FIG. 51 is a layout view of a nonvolatile memory device 45 according to a forty-fifth embodiment of the present invention. For simplicity, the current embodiment will hereinafter be described, focusing mainly on differences with the embodiment of FIGS. 32A and 32B.

Referring to FIG. 51, in the nonvolatile memory device 45 according to the forty-fifth embodiment of the present invention, a (1_1)th strap contact 251 is formed on an area in which a first gate electrode 210 and a first active region 110 overlap each other. A (1_2)th strap contact 252 is formed on an area in which the first gate electrode 210 and a third active region 130 overlap each other.

In addition, a (4_1)th strap contact 551 is formed on an area in which a fourth gate electrode 510 and the first active region 110 overlap each other. A (4_2)th strap contact 552 is formed on an area in which the fourth gate electrode 510 and the third active region 130 overlap each other.

Figure 52:
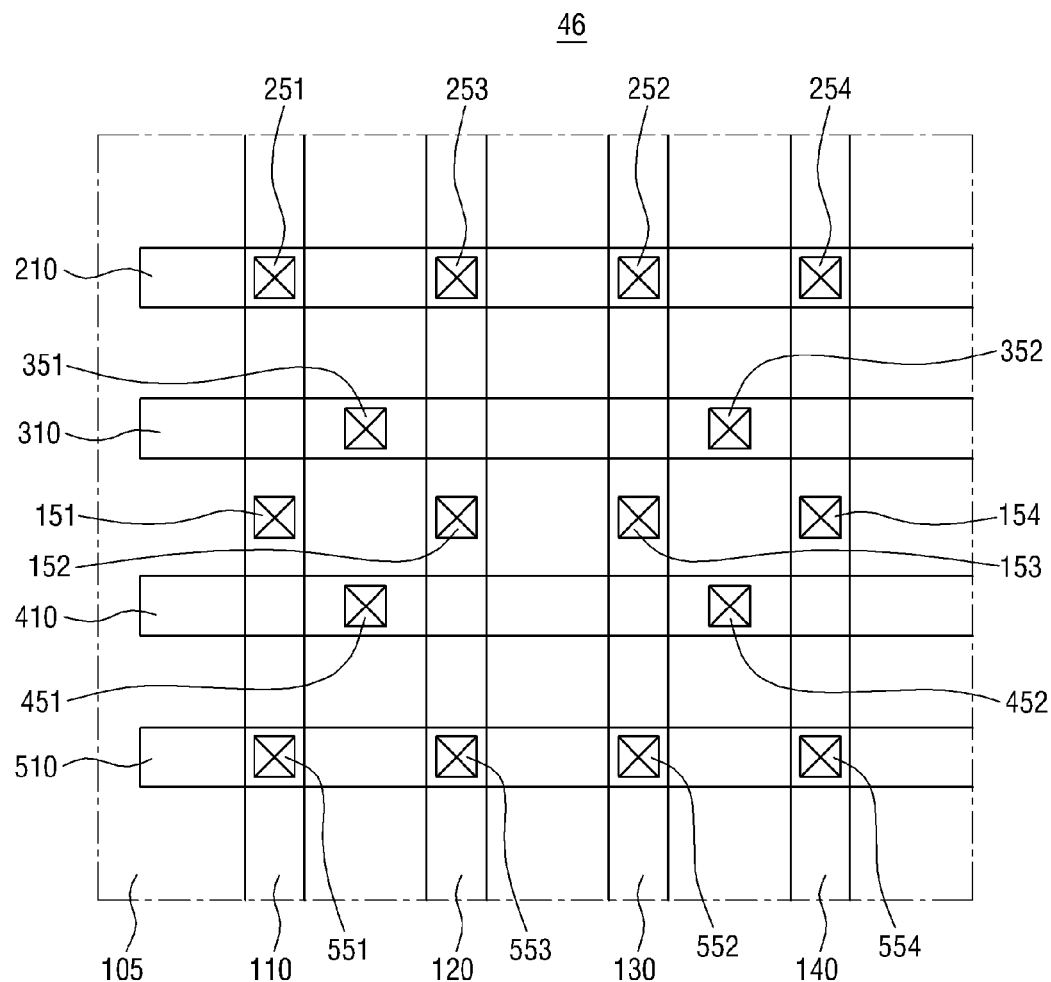

FIG. 52 is a layout view of a nonvolatile memory device 46 according to a forty-sixth embodiment of the present invention. For simplicity, the current embodiment will hereinafter be described, focusing mainly on differences with the embodiment of FIG. 51.

Referring to FIG. 52, the nonvolatile memory device 46 according to the forty-sixth embodiment of the present invention further includes a (1_3)th strap contact 253, a (1_4)th strap contact 254, a (4_3)th strap contact 553, and a (4_4)th strap contact 554.

The (1_3)th strap contact 253 is formed on an area in which a second active region 120 and a first gate electrode 210 overlap each other. The (4_3)th strap contact 553 is formed on an area in which the second active region 120 and a fourth gate electrode 510 overlap each other.

The (1_4)th strap contact 254 is formed on an area in which a fourth active region 140 and the first gate electrode 210 overlap each other. The (4_4)th strap contact 554 is formed on an area in which the fourth active region 140 and the fourth gate electrode 510 overlap each other.

Nonvolatile memory devices according forty-seventh through fiftieth embodiments of the present invention will now be described with reference to FIGS. 53 through 56. For simplicity, the forty-seventh and forty-ninth embodiments will be described, focusing mainly on differences with the embodiment of FIG. 51. The forty-eighth and fiftieth embodiments will be described, focusing mainly on differences with the embodiment of FIG. 52.

FIGS. 53 through 56 are layout views of nonvolatile memory devices 47 through 50 according to forty-seventh through fiftieth embodiments of the present invention.

Figure 53:
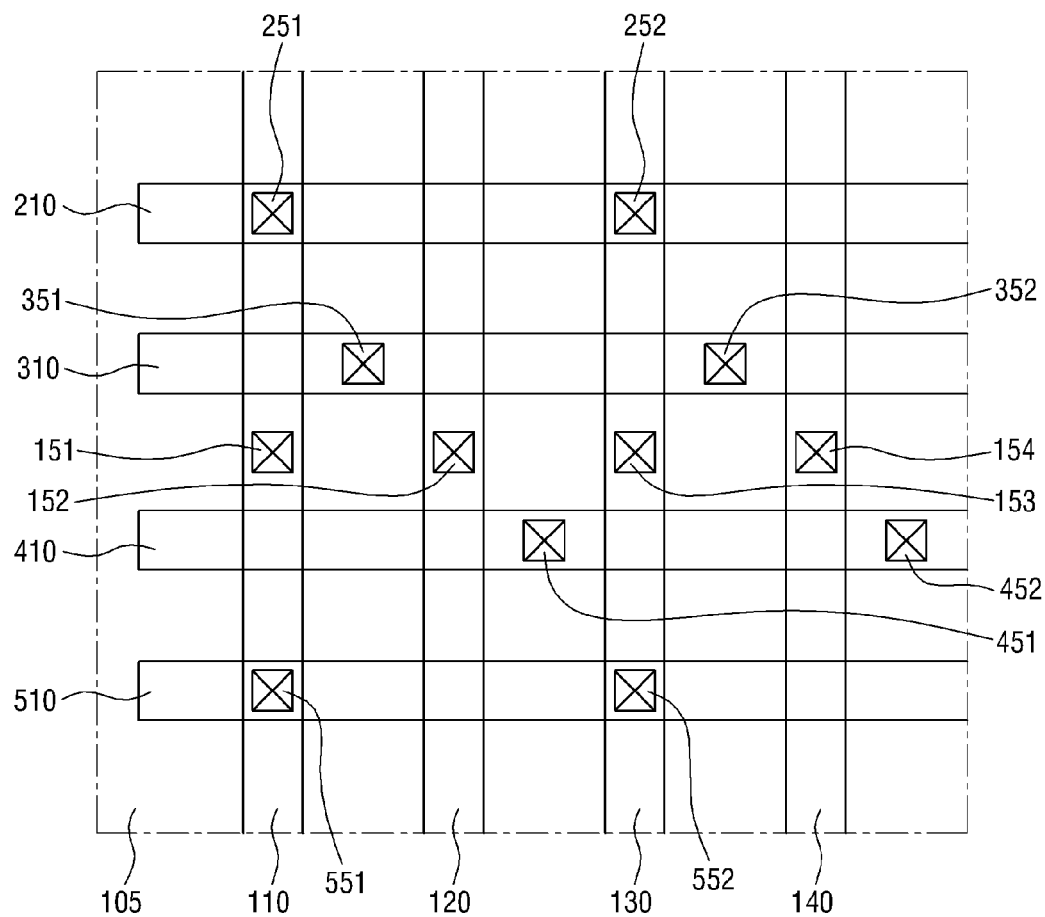
Figure 54:
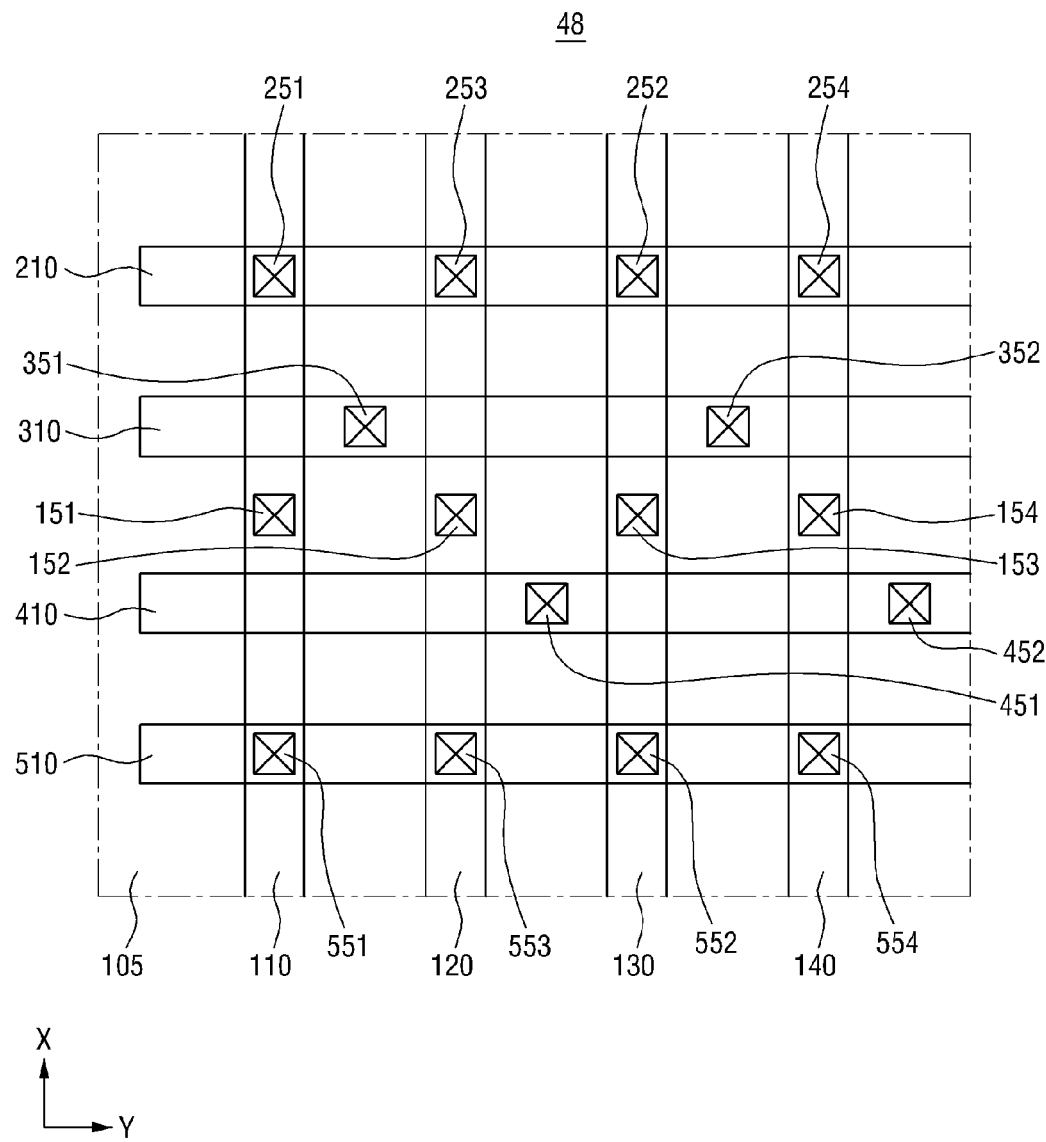

Referring to FIGS. 53 and 54, in the nonvolatile memory devices 47 and 48 according to the forty-seventh and forty-eighth embodiments of the present invention, a (3_1)th strap contact 451 is formed between a second active region 120 and a third active region 130.

A (3_2)th strap contact 452 is not formed between a first active region 110 and a fourth active region 140. For example, the (3_2)th strap contact 452 may be formed between the fourth active region 140 and an active region most adjacent to the fourth active region 140.

In FIGS. 53 and 54, no strap contact is formed at an end of a third gate electrode 410 which protrudes from the first active region 110 in a second direction Y. However, the present invention is not limited thereto.

Figure 55:
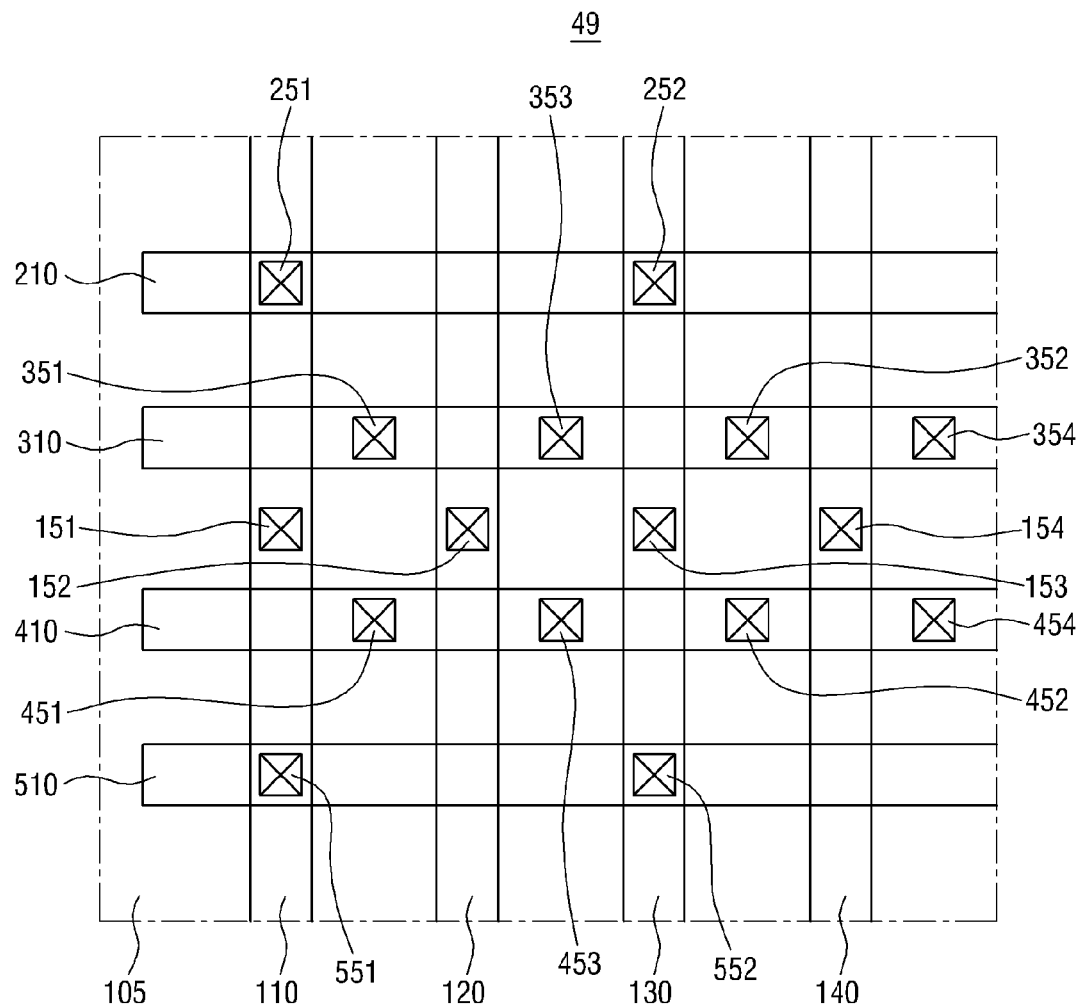
Figure 56:
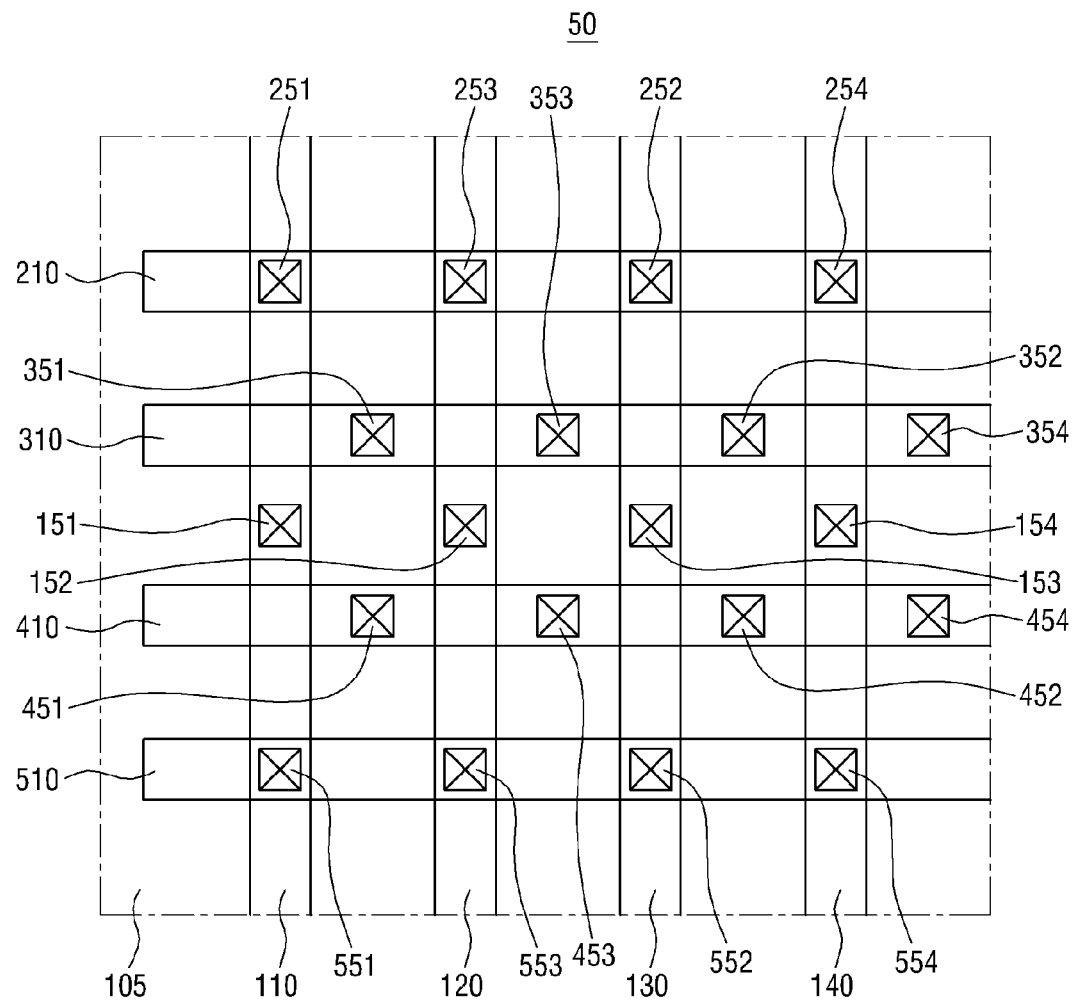

Referring to FIGS. 55 and 56, each of the nonvolatile memory devices 49 and 50 according to the forty-ninth and fiftieth embodiments of the present invention further includes a (2_3)th strap contact 353, a (2_4)th strap contact 354, a (3_3)th strap contact 453, and a (3_4)th strap contact 454.

Each of the (2_3)th strap contact 353 and the (3_3)th strap contact 453 is formed between a second active region 120 and a third active region 130. Each of the (2_4)th strap contact 354 and the (3_4)th strap contact 454 is not formed between a first active region 110 and a fourth active region 140. For example, each of the (2_4)th strap contact 354 and the (3_4)th strap contact 454 may be formed between the fourth active region 140 and an active region most adjacent to the fourth active region 140.

In FIGS. 53 and 55, a (4_1)th strap contact 551 can also be formed on an area in which the second active region 120 and a fourth gate electrode 510 overlap each other, and a (4_2)th strap contact 552 can also formed on an area in which the fourth active region 140 and the fourth gate electrode 510 overlap each other. That is, the positional relationship between first strap contacts 251 and 252 and the fourth strap contacts 551 and 552 can be changed.

Figure 57:
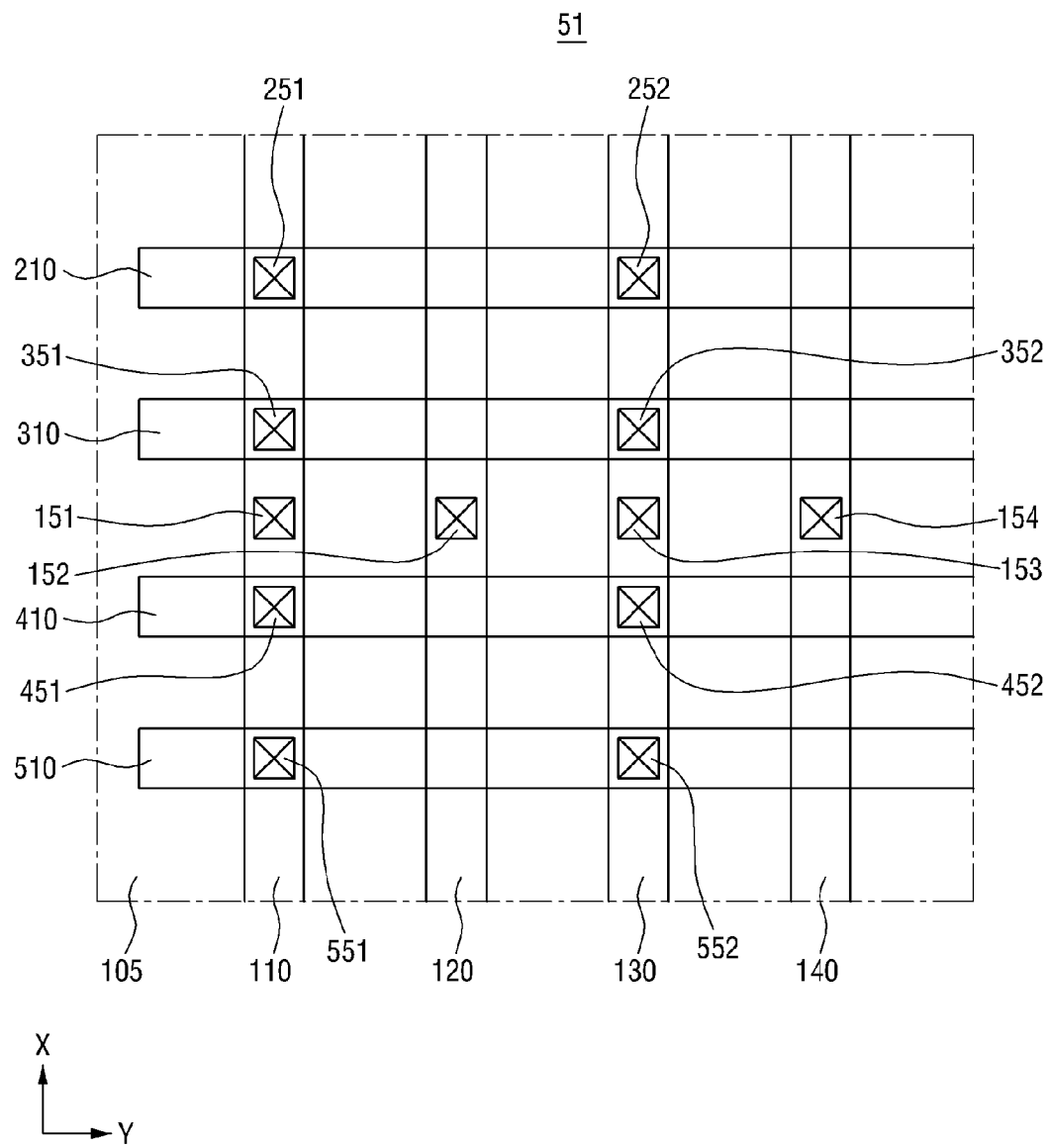

FIG. 57 is a layout view of a nonvolatile memory device 51 according to a fifty-first embodiment of the present invention. For simplicity, the current embodiment will hereinafter be described, focusing mainly on differences with the embodiment of FIGS. 32A and 32B.

Referring to FIG. 57, (1_1)th through (4_1)th strap contacts 251 through 551 are respectively formed on areas in which first through fourth gate electrodes 210 through 510 overlap a first active region 110.

(1_2)th through (4_2)th strap contacts 252 through 552 are respectively formed on areas in which the first through fourth gate electrodes 210 through 510 overlap a third active region 130.

The (1_1)th through (4_1)th strap contacts 251 through 551 and a first bit line contact 151 may be formed on the first active region 110 along a first direction X. The (1_2)th through (4_2)th strap contacts 252 through 552 and a third bit line contact 153 may be formed on the third active region 130 along the first direction X.

Figure 58:
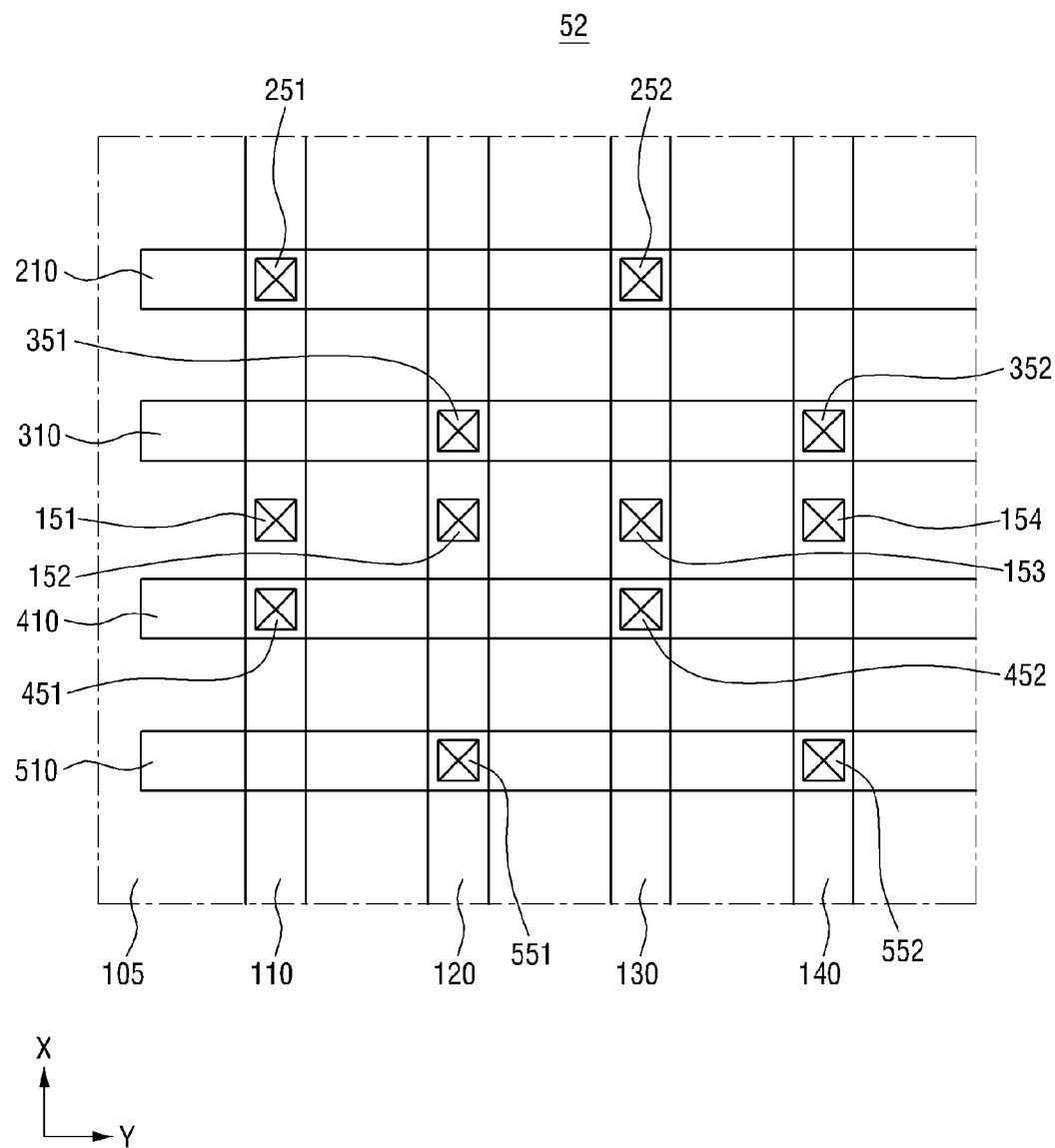
Figure 59:
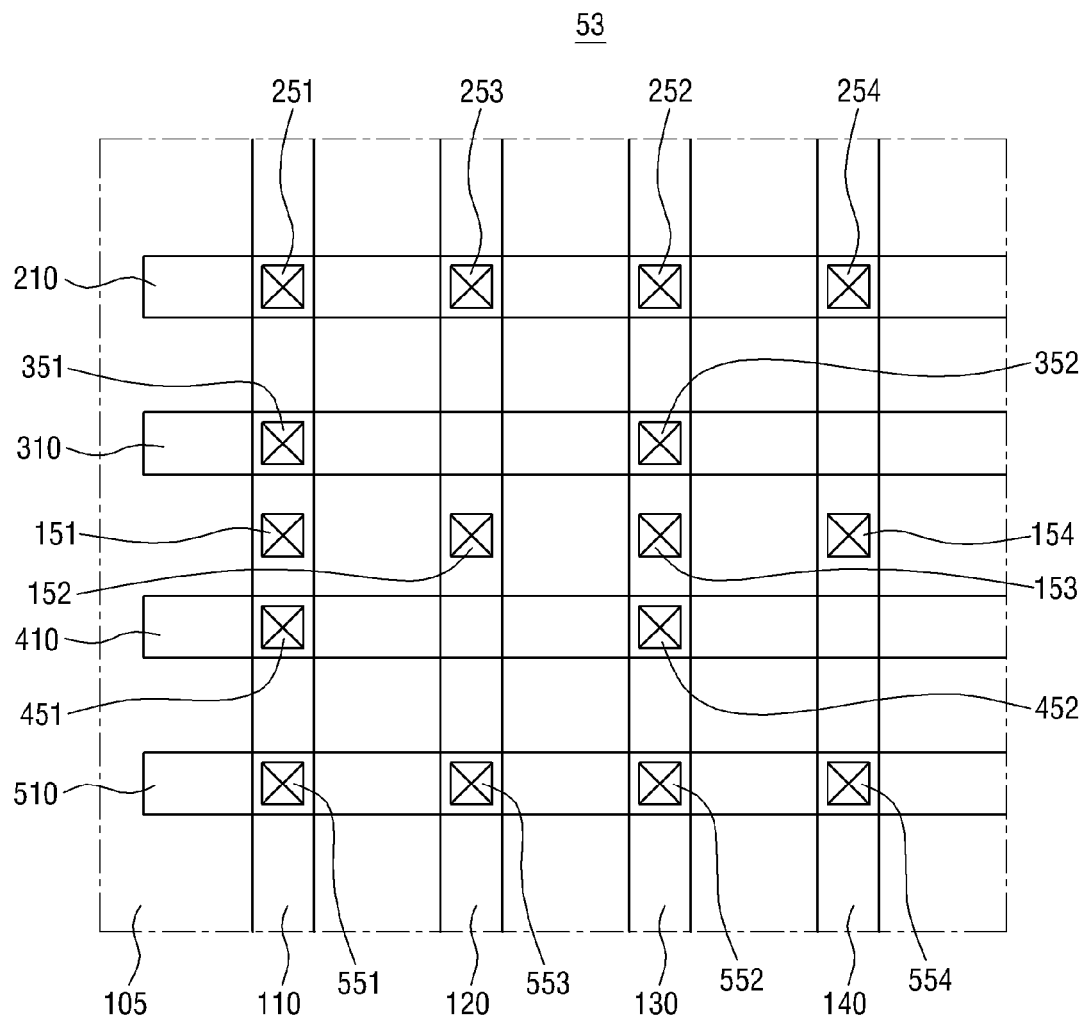
Figure 60:
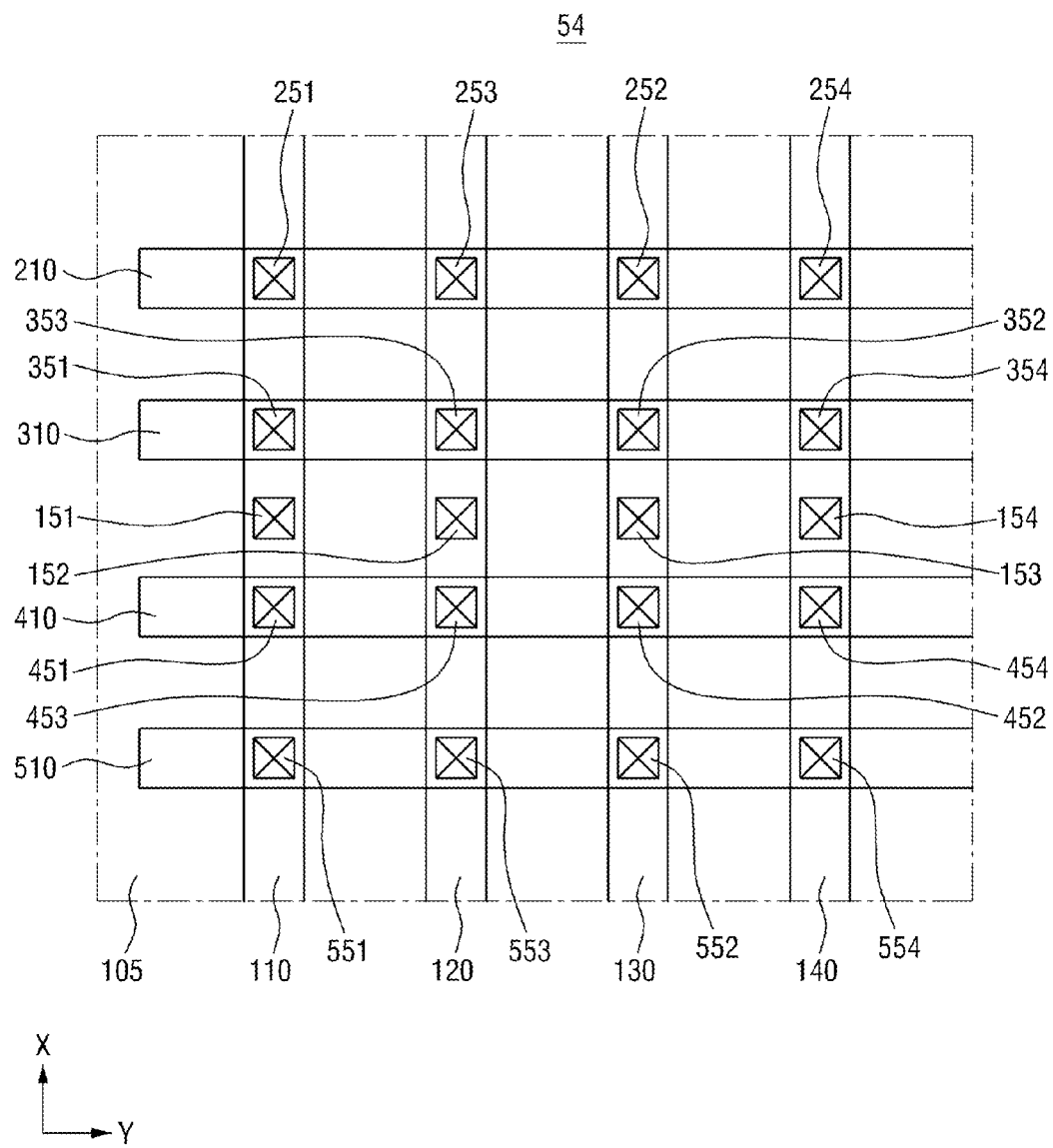

FIGS. 58 through 60 are layout views of nonvolatile memory devices 52 through 54 according to fifty-second through fifty-fourth embodiments of the present invention. For simplicity, the current embodiments will hereinafter be described, focusing mainly on differences with the embodiment of FIG. 57.

Referring to FIG. 58, in the nonvolatile memory device 52 according to the fifty-second embodiment of the present invention, a (2_1)th strap contact 351 is formed on an area in which a second active region 120 and a second gate electrode 310 overlap each other. A (2_2)th strap contact 352 is formed on an area in which a fourth active region 140 and the second gate electrode 310 overlap each other.

In addition, a (4_1)th strap contact 551 is formed on an area in which the second active region 120 and a fourth gate electrode 510 overlap each other. A (4_2)th strap contact 552 is formed on an area in which the fourth active region 140 and the fourth gate electrode 510 overlap each other.

Referring to FIG. 59, the nonvolatile memory device 53 according to the fifty-third embodiment of the present invention further includes a (1_3)th strap contact 253, a (1_4)th strap contact 254, a (4_3)th strap contact 553, and a (4_4)th strap contact 554.

The (1_3)th strap contact 253 is formed on an area in which a second active region 120 and a first gate electrode 210 overlap each other. The (4_3)th strap contact 553 is formed on an area in which the second active region 120 and a fourth gate electrode 510 overlap each other.

The (1_4)th strap contact 254 is formed on an area in which a fourth active region 140 and the first gate electrode 210 overlap each other. The (4_4)th strap contact 554 is formed on an area in which the fourth active region 140 and the fourth gate electrode 510 overlap each other.

In FIG. 59, a (3_1)th strap contact 451 can also be formed on an area in which the second active region 120 and a third gate electrode 410 overlap each other, and a (3_2)th strap contact 452 can also formed on an area in which the fourth active region 140 and the third gate electrode 410 overlap each other. That is, the positional relationship between second strap contacts 351 and 352 and the third strap contacts 451 and 452 can be changed.

In a modified example of the nonvolatile memory device 53 according to the fifty-third embodiment of the present invention, not all of first strap contacts 251 through 254 are formed on areas in which a first gate electrode 210 overlaps active regions 110 through 140, and not all of fourth strap contacts 551 through 554 are formed on areas in which a fourth gate electrode 510 overlaps the active regions 110 through 140. Instead, all of second strap contacts may be formed on areas in which a second gate electrode 310 overlaps the active regions 110 through 140, and all of third strap contacts may be formed on areas in which a third gate electrode 410 overlaps the active regions 110 through 140.

Referring to FIG. 60, the nonvolatile memory device 54 according to the fifty-fourth embodiment of the present invention further includes a (1_3)th strap contact 253, a (1_4)th strap contact 254, a (2_3)th strap contact 353, a (2_4)th strap contact 354, a (3_3)th strap contact 453, a (3_4)th strap contact 454, a (4_3)th strap contact 553, and a (4_4)th strap contact 554.

The (1_3)th through (4_3)th strap contacts 253 through 553 are respectively formed on areas in which first through fourth gate electrodes 210 through 510 overlap a second active region 120.

The (1_4)th through (4_4)th strap contacts 254 through 554 are respectively formed on areas in which the first through fourth gate electrodes 210 through 510 overlap a fourth active region 140.

Figure 61:
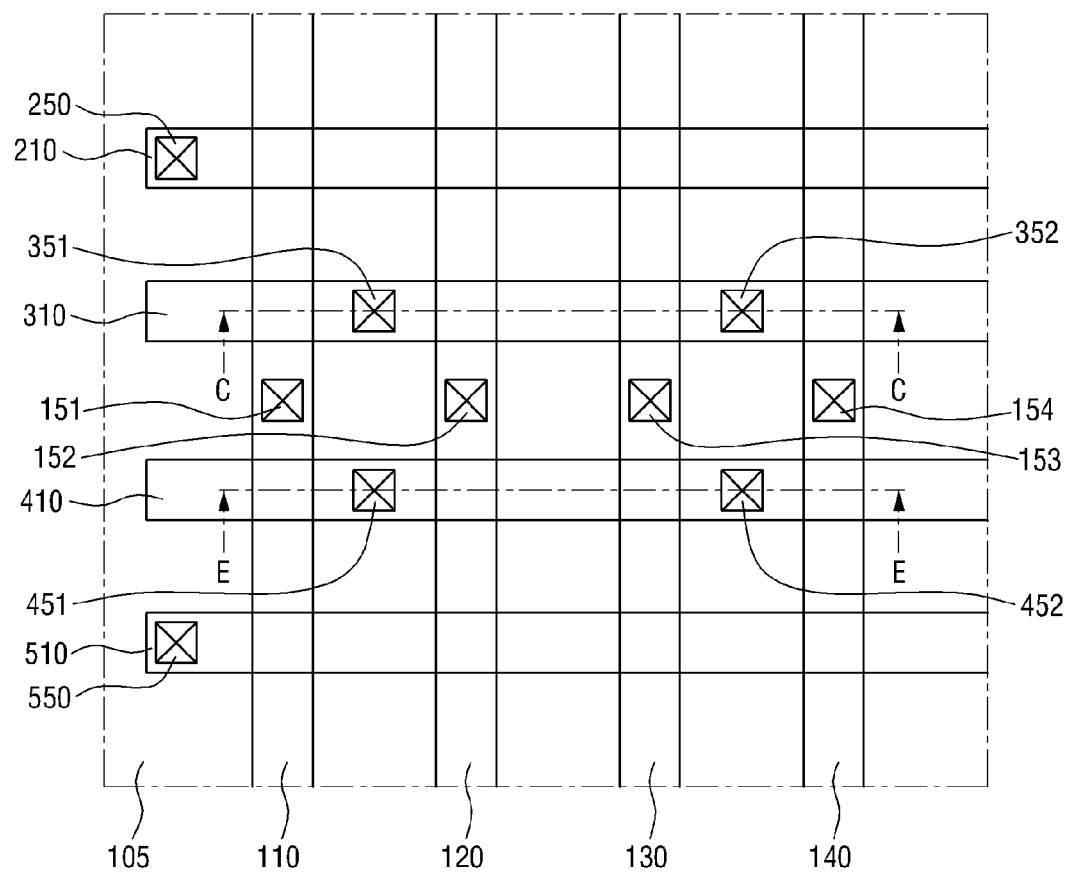

FIG. 61 is a layout view of a nonvolatile memory device 55 according to a fifty-fifth embodiment of the present invention. Cross-sectional views taken along the lines C-C and E-E of FIG. 61 are substantially the same as FIGS. 9B and 32B, respectively.

Referring to FIG. 61, the nonvolatile memory device 55 according to the fifty-fifth embodiment of the present invention includes a first active region 110, a second active region 120, a third active region 130, a fourth active region 140, a first gate electrode 210, a second gate electrode 310, a third gate electrode 410, a fourth gate electrode 510, a second wiring line 330, a third wiring line 430, a (2_1)th strap contact 351, a (2_2)th strap contact 352, a (3_1)th strap contact 451, and a (3_2)th strap contact 452.

First through fourth bit line contacts 151 through 154 may be arranged in a row along a second direction Y.

A second wiring line 330 is formed on the second gate electrode 310, and a third wiring line 430 is formed on the third gate electrode 410. The second wiring line 330 may extend along the second gate electrode 310 in the second direction Y, and the third wiring line 430 may extend along the third gate electrode 410 in the second direction Y.

The second wiring line 330 may apply a uniform voltage to the second gate electrode 310, and the third wiring line 430 may apply a uniform voltage to the third gate electrode 410.

Each of the second wiring line 330 and the third wiring line 430 may be a word line WL described above with reference to FIG. 2 or may be a connecting line connected to the word line WL.

The second gate electrode 310 is electrically connected to the second wiring line 330 by a plurality of second strap contacts 351 and 352, and the third gate electrode 410 is electrically connected to the third wiring line 430 by a plurality of third strap contacts 451 and 452.

Each of the (2_1)th strap contact 351 and the (3_1)th strap contact 451 is formed between the first active region 110 and the second active region 120. Each of the (2_2)th strap contact 352 and the (3_2)th strap contact 452 is formed between the third active region 130 and the fourth active region 140.

A first normal contact 250 is formed on the first gate electrode 210 to be connected to the first gate electrode 210. A fourth normal contact 550 is formed on the fourth gate electrode 510 to be connected to the fourth gate electrode 510. The first normal contact 250 and the fourth normal contact 550 respectively connect the first gate electrode 210 and the fourth gate electrode 510 to high-voltage lines WP described above with reference to FIG. 2.

One first normal contact 250 may be connected to the first gate electrode 210. In addition, one fourth normal contact 550 may be connected to the fourth gate electrode 510. That is, unlike the second gate electrode 310, the first gate electrode 210 may receive a gate voltage from one contact, that is, one first normal contact 250 connected to an end of the first gate electrode 210. In addition, unlike the third gate electrode 410, the fourth gate electrode 510 may receive a gate voltage from one contact, that is, one fourth normal contact 550 connected to an end of the fourth gate electrode 510.

Figure 62:
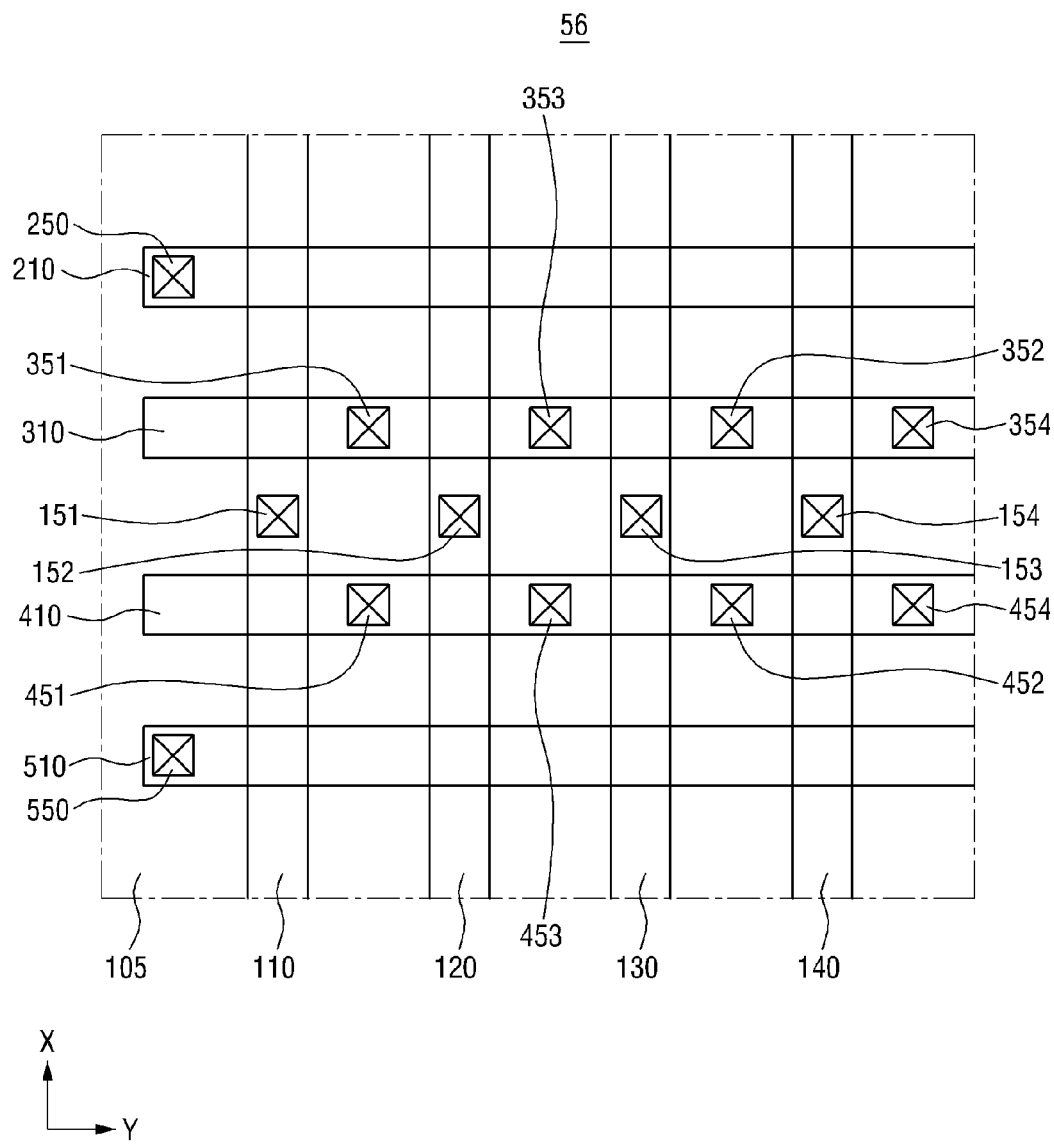
Figure 63:
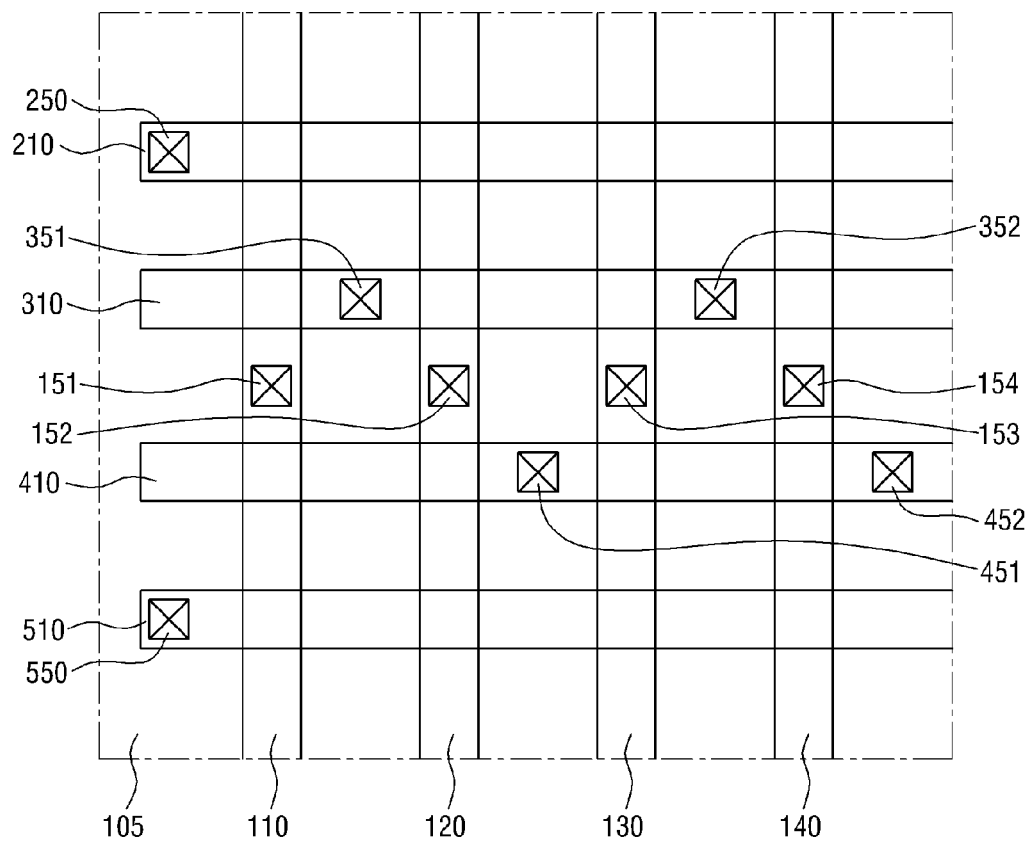
Figure 64:
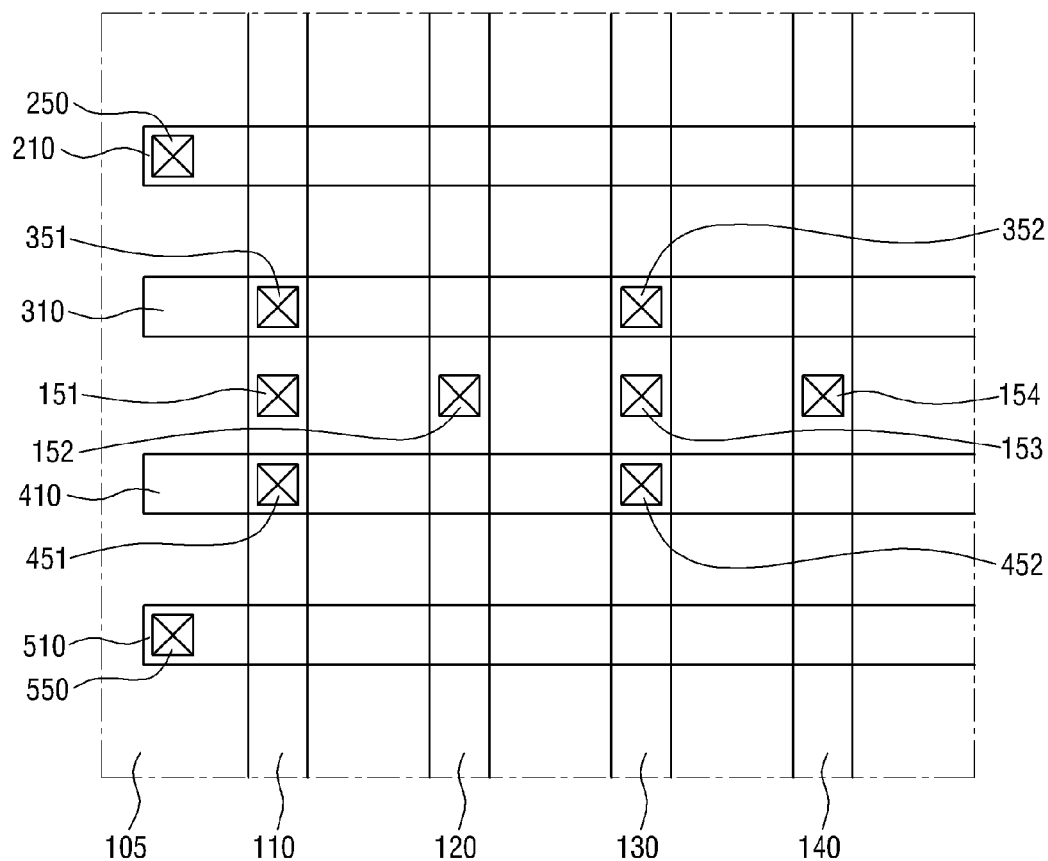

FIGS. 62 through 64 are layout views of nonvolatile memory devices 56 through 58 according to fifty-sixth through fifty-eighth embodiments of the present invention. For simplicity, the current embodiments will hereinafter be described, focusing mainly on differences with the embodiment of FIG. 61.

Referring to FIG. 62, the nonvolatile memory device 56 according to the fifty-sixth embodiment of the present invention further includes a (2_3)th strap contact 353, a (2_4)th strap contact 354, a (3_3)th strap contact 453, and a (3_4)th strap contact 454.

Each of the (2_3)th strap contact 353 and the (3_3)th strap contact 453 is formed between a second active region 120 and a third active region 130. Each of the (2_4)th strap contact 354 and the (3_4)th strap contact 454 is not formed between a first active region 110 and a fourth active region 140. For example, each of the (2_4)th strap contact 354 and the (3_4)th strap contact 454 may be formed between the fourth active region 140 and an active region most adjacent to the fourth active region 140.

In FIG. 62, no strap contact is formed at an end of a second gate electrode 310 which protrudes from the first active region 110 in a second direction Y and at an end of a third gate electrode 410 which protrudes from the first active region 110 in the second direction Y. However, the present invention is not limited thereto.

Referring to FIG. 63, in the nonvolatile memory device 57 according to the fifty-seventh embodiment of the present invention, a (3_1)th strap contact 451 is formed between a second active region 120 and a third active region 130.

A (3_2)th strap contact 452 is not formed between a first active region 110 and a fourth active region 140. For example, the (3_2)th strap contact 452 may be formed between the fourth active region 140 and an active region most adjacent to the fourth active region 140.

Referring to FIG. 64, in the nonvolatile memory device 58 according to the fifty-eighth embodiment of the present invention, a (2_1)th strap contact 351 is formed on an area in which a first active region 110 and a second gate electrode 310 overlap each other. A (2_2)th strap contact 352 is formed on an area in which a third active region 130 and the second gate electrode 310 overlap each other.

In addition, a (3_1)th strap contact 451 is formed on an area in which the first active region 110 and a third gate electrode 410 overlap each other. A (3_2)th strap contact 452 is formed on an area in which the third active region 130 and the third gate electrode 410 overlap each other.

Figure 65:
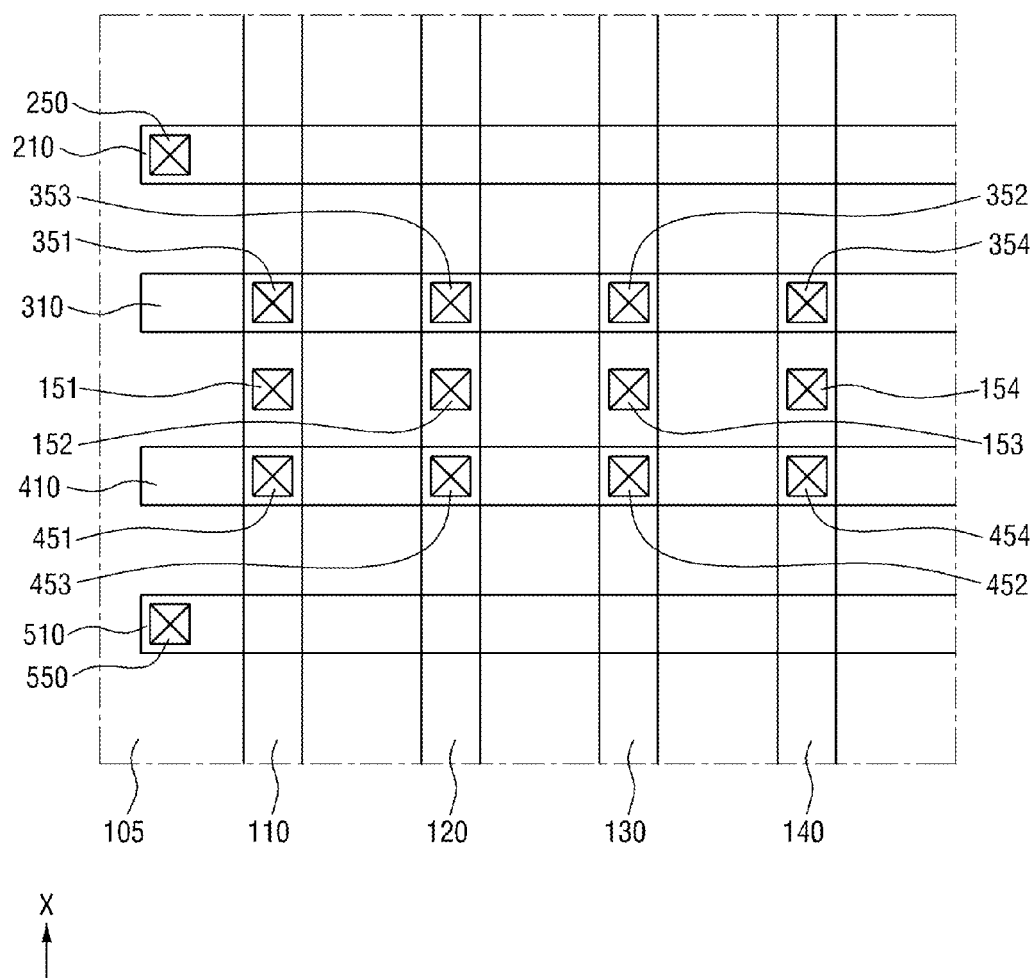

FIG. 65 is a layout view of a nonvolatile memory device 59 according to a fifty-ninth embodiment of the present invention. For simplicity, the current embodiment will hereinafter be described, focusing mainly on differences with the embodiment of FIG. 64.

Referring to FIG. 65, the nonvolatile memory device 59 according to the fifty-ninth embodiment of the present invention further includes a (2_3)th strap contact 353, a (2_4)th strap contact 354, a (3_3)th strap contact 453, and a (3_4)th strap contact 454.

The (2_3)th strap contact 353 is formed on an area in which a second active region 120 and a second gate electrode 310 overlap each other. The (3_3)th strap contact 453 is formed on an area in which the second active region 120 and a third gate electrode 410 overlap each other.

The (2_4)th strap contact 354 is formed on an area in which a fourth active region 140 and the second gate electrode 310 overlap each other. The (3_4)th strap contact 454 is formed on an area in which the fourth active region 140 and the third gate electrode 410 overlap each other.

Figure 66:
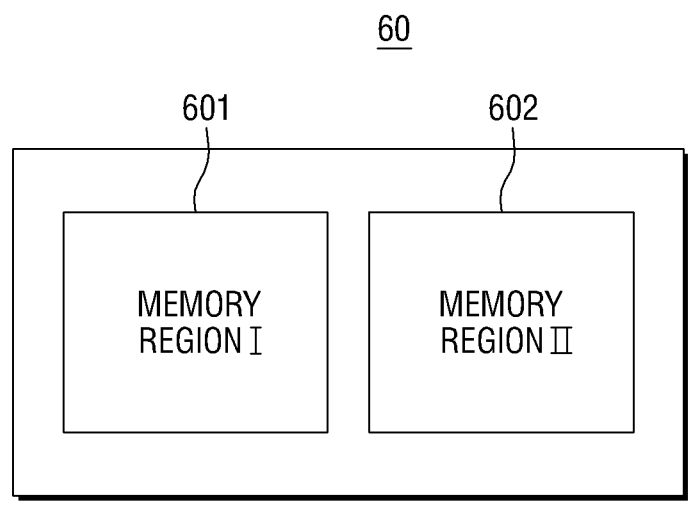
FIG. 66 is a conceptual diagram of a nonvolatile memory device according to a sixtieth embodiment of the present invention.

FIG. 66 is a conceptual diagram of a nonvolatile memory device 60 according to a sixtieth embodiment of the present invention.

Referring to FIG. 66, the nonvolatile memory device 60 according to the sixtieth embodiment of the present invention includes a first memory region 601 and a second memory region 602.

An antifuse memory cell array that may be included in each of the first memory region 601 and the second memory region 602 may be one of the nonvolatile memory devices 1 through 59 according to the first through fifty-ninth embodiments of the present invention.

In the nonvolatile memory device 60 according to the sixtieth embodiment of the present invention, the area of each of bit line contacts 151 through 154 of an antifuse memory cell array included in the first memory region 601 is different from that of each of bit line contacts 151 through 154 of an antifuse memory cell array included in the second memory region 602.

The effects of nonvolatile memory devices according to embodiments of the present invention will now be described with reference to FIG. 67.

Figure 67:
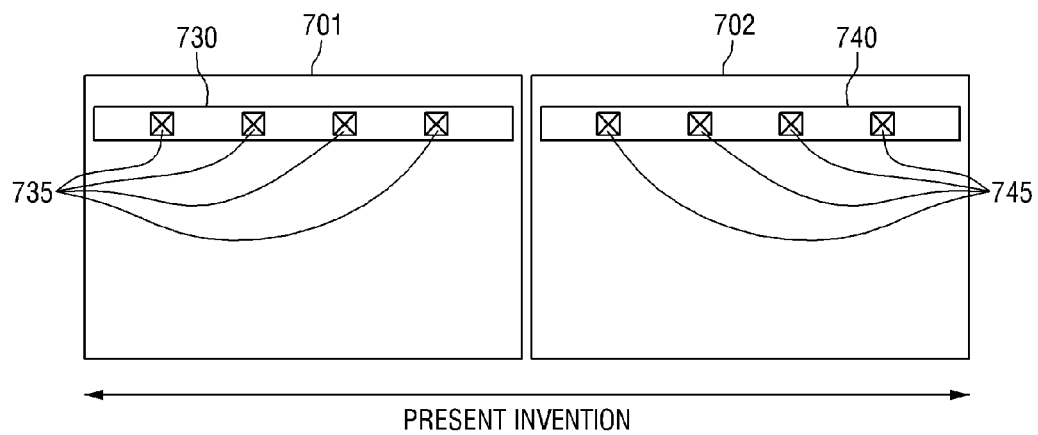
FIG. 67 is a diagram illustrating exemplary effects of a nonvolatile memory device according to certain embodiments.
Figure 67:
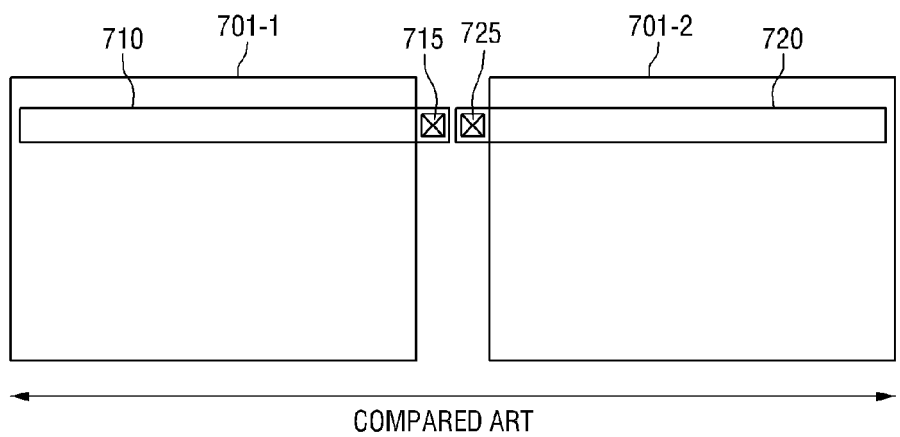

FIG. 67 is a diagram illustrating the effects of a nonvolatile memory device according to the present invention.

Referring to FIG. 67, in a nonvolatile memory device (shown on the upper portion of the figure) according to embodiments of the present invention, a plurality of strap contacts 735 are formed on a first gate electrode 730 of a first memory region 701, and a plurality of strap contacts 745 are formed on a first gate electrode 740 of a second memory region 702. The two gate electrodes 730 may be separated from each other but may be formed along the same row.

In certain examples, a plurality of strap contacts 735 or 745 are used as paths for applying a gate voltage to each of the first gate electrode 730 and the first gate electrode 740. Accordingly, a gate voltage can pass through each of the first gate electrode 730 and the second gate electrode 740 without an IR-drop phenomenon. As a result, a uniform gate voltage can be applied to each of the first gate electrode 730 and the second gate electrode 740.

On the other hand, in a nonvolatile memory device (shown on the lower portion of the figure) according to the compared art, only one contact 715 is formed on a first gate electrode 710 of a first memory region 701-1, and another contact 725 is formed on a first gate electrode 720 of a second memory region 701-2.

As a result, one contact 715 or 725 is used as a path for applying a gate voltage to each of the first gate electrodes 710 and 720.

Accordingly, the IR-drop phenomenon may occur while a gate voltage passes through each of the first gate electrodes 710 and 720. As a result, a substantial voltage applied to each of the first gate electrode 710 and the first gate electrode 720 may vary according to a distance from the contact 715 or 725.

Consequently, since a plurality of strap contacts 735 or 745 that can apply a gate voltage to each gate electrode 730 or 740 is formed in the nonvolatile memory device according to various embodiments of the present invention, a uniform gate voltage can be applied to each gate electrode 730 or 740 regardless of the position of the gate electrode 730 or 740, which, in turn, improves the operating performance of the nonvolatile memory device.

In addition, unlike the nonvolatile memory device according to the compared art, the nonvolatile memory device according to various embodiments of the present invention does not require an additional region for forming a contact that is to be connected to the gate electrode 710 or 720. Therefore, the area of the nonvolatile memory device can be reduced.

Figure 68:
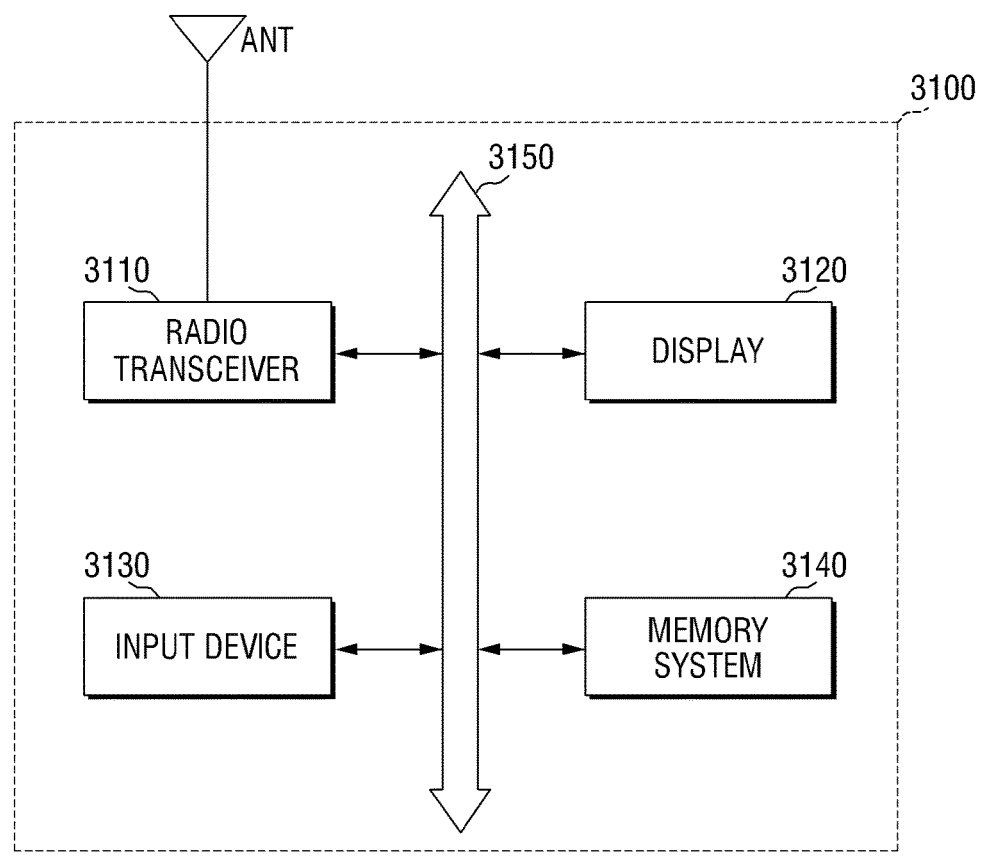
FIG. 68 illustrates an exemplary embodiment of a data processing system including the memory apparatus of FIG. 1.

FIG. 68 illustrates an embodiment of a data processing system including the memory apparatus of FIG. 1.

Referring to FIG. 68, a data processing system 3100 may be implemented as an electronic device such as a cellular phone, a smartphone, a personal digital assistant (PDA), or a wireless communication device. The data processing system 3100 includes a memory system 3140.

The memory system 3140 includes a memory device and a memory controller that can control the operation of the memory device. The memory controller may control a data access operation (such as a program operation, an erase operation or a read operation) of the memory device under the control of a processor. The memory device may include one or more of the antifuse memory cell arrays described above.

Page data programmed into the memory apparatus may be displayed on a display 3120 under the control of the processor and the memory controller.

A radio transceiver 3110 may receive or transmit radio signals through an antenna ANT. For example, the radio transceiver 3110 may convert a radio signal received through the antenna ANT into a signal that can be processed by the processor. Therefore, the processor may process the signal output from the radio transceiver 3110 and transmit the processed signal to the memory system 3140 or the display 3120. In addition, the radio transceiver 3110 may convert a signal output from the processor into a radio signal and transmit the radio signal to an external device through the antenna ANT.

An input device 3130 is a device by which a control signal for controlling the operation of the processor or data to be processed by the processor can be input. The input device 3130 may be implemented, for example, as a pointing device such as a touchpad or computer mouse, a keypad, or a keyboard.

The processor may control the display 3120 to display data output from the memory system 3140, data output from the radio transceiver 3110, or data output from the input device 3130. Depending on embodiments, the memory controller that can control the operation of the memory apparatus may form a stacked structure together with the memory apparatus (e.g., a stacked package including both a memory chip and a controller chip).

Figure 69:
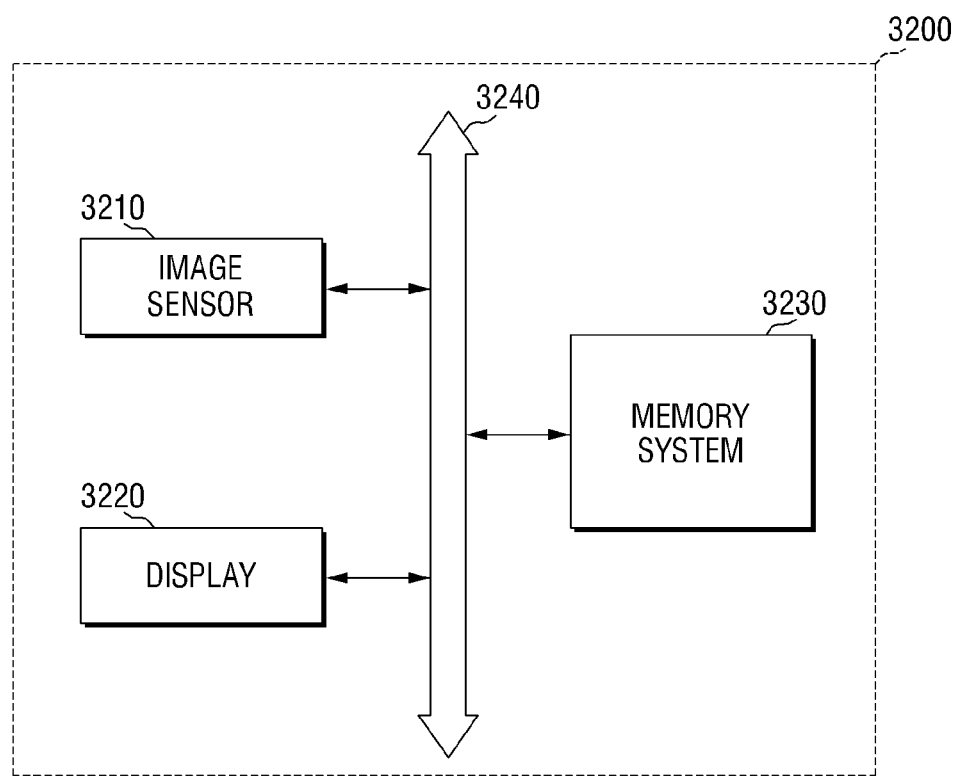
FIG. 69 illustrates another embodiment of the data processing system including the memory apparatus of FIG. 1.

FIG. 69 illustrates another embodiment of the data processing system including the memory apparatus of FIG. 1.

Referring to FIG. 69, a data processing system 3200 may be implemented as an image processing device, such as a digital camera, or a cellular phone to which a digital camera is attached.

The data processing system 3200 may include an image sensor 3210, a display 3220, and a memory system 3230.

The memory system 3230 includes a memory device and a memory controller that can control a data processing operation of the memory device. The memory device may include one or more of the antifuse memory cell arrays described above.

The image sensor 3210 of the data processing system 3200 converts an optical image into digital signals and transmits the digital signals to the memory system 3230. The digital signals may be processed by the memory system 3230 to be displayed on the display 3230 or stored in the memory device through the memory controller. In addition, data stored in the memory device is displayed on the display 3230. Depending on embodiments, the memory controller that can control the operation of the memory device may be implemented as a part of the memory device or as a chip separate from the memory device (e.g., they may form a stacked package including both a memory chip and a controller chip, or may form a different type of apparatus).

Figure 70:
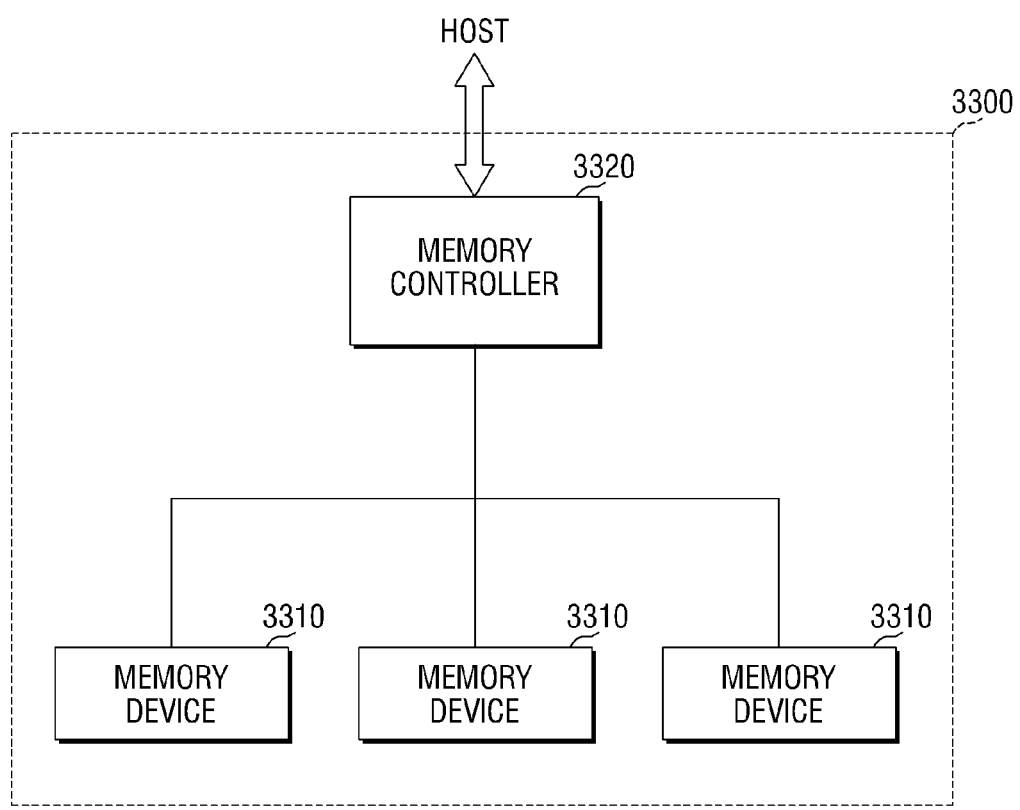
FIG. 70 illustrates another embodiment of the data processing system including the memory apparatus of FIG. 1.

FIG. 70 illustrates another embodiment of the data processing system including the memory apparatus of FIG. 1.

Referring to FIG. 70, a data processing system 3300 may be implemented as a data storage device such as a solid state drive (SSD). The data processing system 3300 may include a plurality of memory devices 3310 and a memory controller 3320 that can control a data processing operation of each of the memory devices 3310. Each memory device may include one or more of the antifuse memory cell arrays described above. The data processing system 3300 may be implemented as a memory module.

Figure 71:
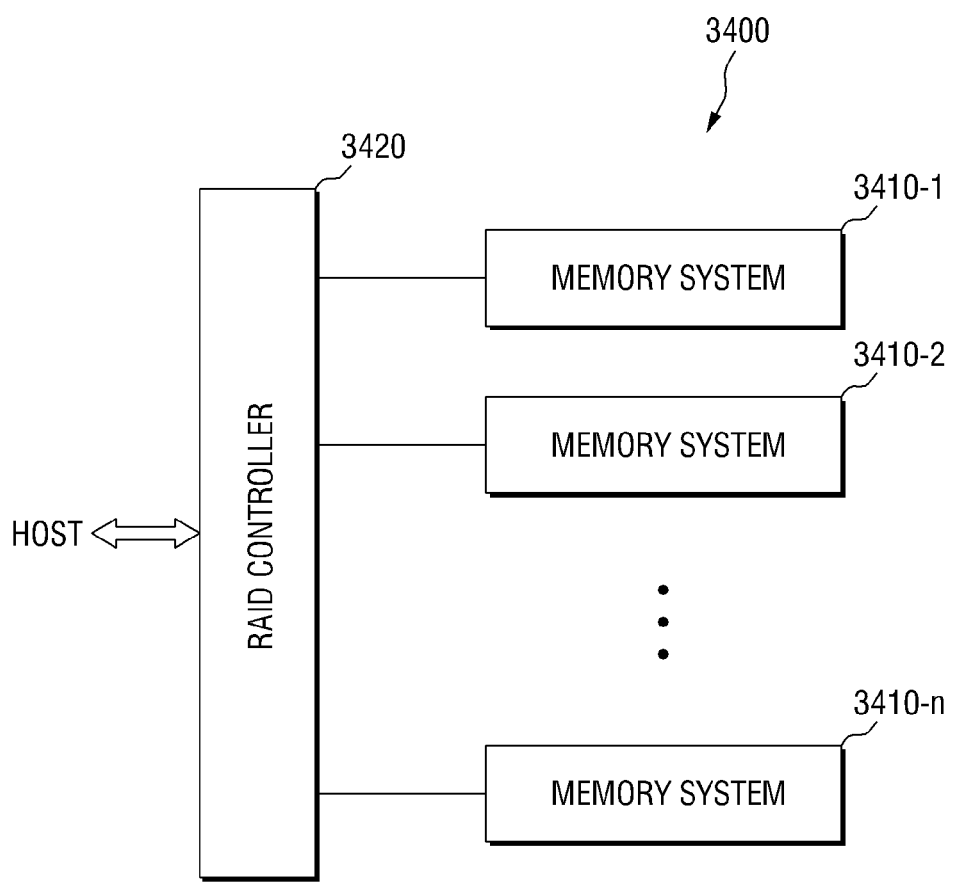
FIG. 71 illustrates another embodiment of the data processing system including the memory apparatus of FIG. 1.

FIG. 71 illustrates another embodiment of the data processing system including the memory apparatus of FIG. 1.

Referring to FIG. 71, a data processing system (e.g., a data storage device) 3400 may be implemented as a redundant array of independent disks (RAID) system. The data processing system 3400 may include a RAID controller 3420 and a plurality of memory modules 3410-1 through 3410-n, where n is a natural number.

Each of the memory modules 3410-1 through 3410-n may be the data processing system 3300 illustrated in FIG. 70, and may include one or more of the antifuse memory cell arrays described above. The memory modules 3410-1 through 3410-n may constitute a RAID array.

The data processing system 3400 may be implemented as an electronic device such as a personal computer (PC) or an SSD. During a program operation, in response to a program command received from a host, the RAID controller 3420 may transmit program data output from the host to any one of the memory modules 3410-1 through 3410-n according to any one RAID level selected from a plurality of RAID levels based on RAID level information. In addition, during a read operation, in response to a read command received from the host, the RAID controller 3420 may transmit to the host data read from any one of the memory modules 3410-1 through 3410-n according to any one RAID level selected from the RAID levels based on the RAID level information.

Figure 72:
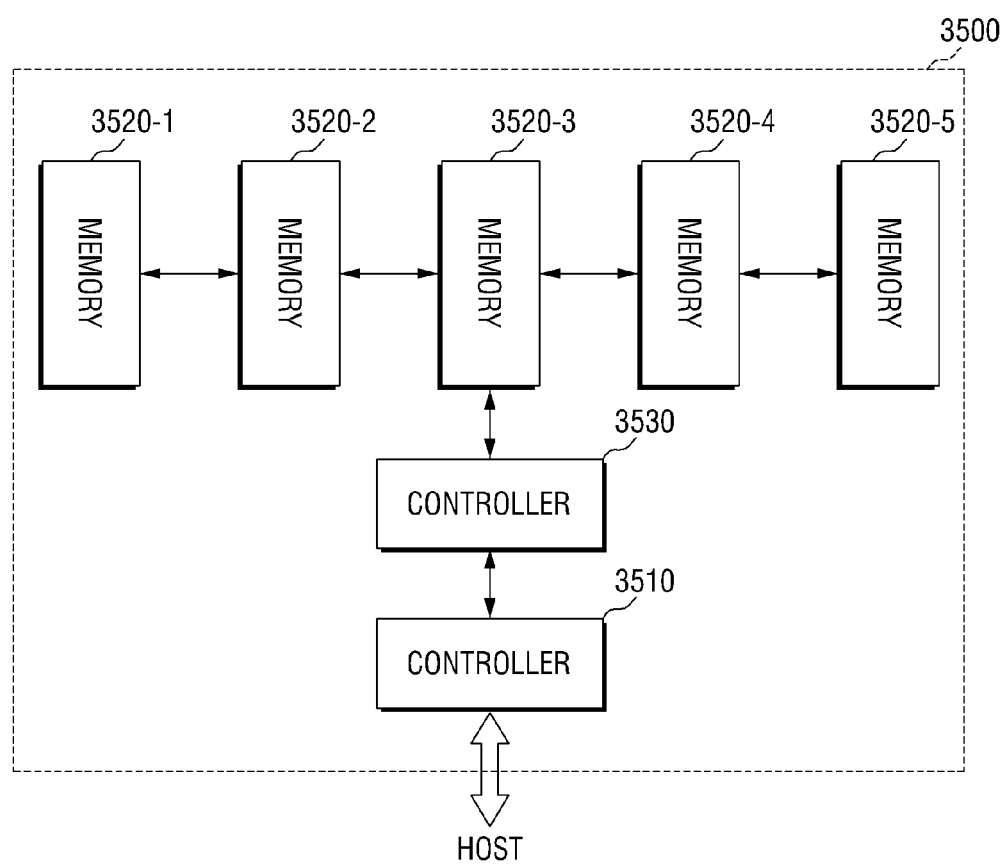
FIG. 72 is a block diagram of an embodiment of a module including a plurality of memory apparatuses of FIG. 1.

FIG. 72 is a block diagram of an embodiment of a module including a plurality of memory apparatuses of FIG. 1.

Referring to FIG. 72, a module 3500 may include a plurality of memory devices 3520-1 through 3520-5, a memory controller 3530, and an optical interface 3510 which interfaces the data input/output of each of the memory devices 3520-1 through 3520-5. Each memory device 3520-1 through 3520-5 may include one or more of the antifuse memory cell arrays described above.

The optical interface 3510 may include an input/output controller and a signal converter. The input/output controller may control the input/output operation of each of the memory apparatuses 3520-1 through 3520-5. The signal converter may convert data about the data input/output of each of the memory apparatuses 3520-1 through 3520-5 into an optical signal.

The optical interface 3510 provides data exchange between each of the memory apparatuses 3520-1 through 3520-5 and a host by using optical communication. The optical interface 3510 may transmit or receive data using an optical fiber or a waveguide. The exchanged data is suitable to a case where high-speed signals, such as signals complying with a serial advanced technology attachment (SATA) standard, are transmitted or received. The data can also be transmitted or received using wavelength division multiplexing (WDM).

Depending on embodiments, the memory controller 3530 that can control the operation of each of the memory apparatuses 3520-1 through 3520-5 may be provided within each of the memory apparatuses 3520-1 through 3520-5 or may form a stacked structure together with each of the memory apparatuses 3520-1 through 3520-5.

While the present disclosure has been particularly shown and described with reference to exemplary embodiments, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A nonvolatile memory device comprising:
    an anti-fuse memory cell array;
    a plurality of transistors of the anti-fuse memory cell array, the transistors arranged in a plurality of rows, each row extending in a first direction and including a set of transistors;
    a first gate electrode extending along a first row of the plurality of rows and connected to a first set of transistors in the first row;
    a first wiring line above the first gate electrode and separated from the first gate electrode in a vertical direction, the first wiring line extending in the first direction;
    a plurality of strap contacts arranged along the first direction and first row, each strap contact extending between the first gate electrode and the first wiring line, and each strap contact arranged along the first row being referred to as a 1th strap contact;
    a second gate electrode extending along a second row of the plurality of rows and connected to a second set of transistors in the second row, the second row being parallel to the first row;
    at least a first contact arranged in the second row and extending vertically from the second gate electrode to connect to a word line; and
    first through fourth active regions which extend along a second direction different from the first direction and are arranged sequentially along the first direction, wherein the first gate electrode is formed on the first through fourth active regions to intersect the first through fourth active regions, and the second gate electrode is formed on the first through fourth active regions to intersect the first through fourth active regions, wherein a first 1th strap contact of the plurality of 1th strap contacts is arranged to be at a first side of a second 1th strap contact of the plurality of 1th strap contacts, and the first 1th strap contact and second 1th strap contact are arranged to have two or fewer transistors between them, wherein a third 1th strap contact of the plurality of strap contacts is arranged to be at a second side of the second 1th strap contact opposite the first side, and the third 1th strap contact and second 1th strap contact are arranged to have two or fewer transistors between them, and wherein each of the plurality of 1th strap contacts and the first contact are not arranged with respect to each other in the second direction.

2. The nonvolatile memory device of claim 1, wherein:
the first set of transistors are rupture transistors of respective fuse circuits.

3. The nonvolatile memory device of claim 1, wherein:
the first contact arranged in the second row is the only contact extending vertically from the second gate electrode.

4. The nonvolatile memory device of claim 1, wherein:
the first set of transistors are rupture transistors of respective fuse circuits; and
the second set of transistors are access transistors of respective fuse circuits,
wherein each rupture transistor corresponds to an access transistor to form a fuse circuit.

5. The nonvolatile memory device of claim 1,
wherein the first 1th strap contact connects the first wiring line and the first gate electrode between the first active region and the second active region, and
wherein one of the second 1th strap contact or the third 1th strap contact connects the first wiring line and the first gate electrode between the third active region and the fourth active region.

6. The nonvolatile memory device of claim 5, further comprising:
first through fourth bit line contacts which are respectively and electrically connected to the first through fourth active regions and are arranged on a side of the second gate electrode, wherein the second gate electrode is disposed between the first gate electrode and the first bit line contact.

7. The nonvolatile memory device of claim 1, wherein each of the first gate electrode and the second gate electrode is a metal gate electrode.

8. The nonvolatile memory device of claim 1, further comprising:
a second wiring line above the second gate electrode and separated from the second gate electrode in a vertical direction, the second wiring line extending in the first direction and being parallel to the first wiring line,
wherein the first contact arranged in the second row is a strap contact extending vertically between and connecting the second gate electrode and the second wiring line.

9. The nonvolatile memory device of claim 1, wherein the first gate electrode extends in the first direction from a first end to a second end, and wherein the first set of transistors and the first, second, and third 1th strap contacts are all disposed between the first end and the second end.

10. A nonvolatile memory device comprising:
an anti-fuse memory cell array;
a plurality of transistors of the anti-fuse memory cell array, the transistors arranged in a plurality of rows, each row extending in a first direction and including a set of transistors;
a first gate electrode extending along a first row of the plurality of rows from a first end of the first gate electrode to a second end of the first gate electrode, the first gate electrode connected to a first set of transistors in the first row;
a first wiring line above the first gate electrode and separated from the first gate electrode in a vertical direction, the first wiring line extending in the first direction;
a plurality of strap contacts arranged along the first direction and first row and disposed between the first end of the first gate electrode and the second end of the first gate electrode, each strap contact extending between the first gate electrode and the first wiring line in the vertical direction, wherein each strap contact arranged along the first row is referred to as a 1th strap contact;
a second gate electrode extending along a second row of the plurality of rows and connected to a second set of transistors in the second row, the second row being parallel to the first row; and
at least a first contact arranged in the second row and extending vertically from the second gate electrode to connect to a word line,
wherein the number of strap contacts extending between the first gate electrode and first wiring line is different from the number of contacts extending vertically from the second gate electrode.

11. The nonvolatile memory device of claim 10, wherein:
two adjacent 1th strap contacts of the plurality of 1th contacts have only one or two transistors of the first set of transistors disposed between them in the first direction.

12. The nonvolatile memory device of claim 10, wherein:
the plurality of strap contacts includes at least three strap contacts.

13. The nonvolatile memory device of claim 10, wherein only one strap contact extends vertically from the second gate electrode to connect to the word line.

14. The nonvolatile memory device of claim 10, wherein:
the first set of transistors are rupture transistors of respective fuse circuits; and
the second set of transistors are access transistors of respective fuse circuits,
wherein each rupture transistor corresponds to an access transistor to form a fuse circuit.

15. The nonvolatile memory device of claim 10, further comprising:
first through fourth active regions which extend along a second direction different from the first direction and are arranged sequentially along the first direction,
wherein the first gate electrode is formed on the first through fourth active regions to intersect the first through fourth active regions, and the second gate electrode is formed on the first through fourth active regions to intersect the first through fourth active regions, wherein a first 1th strap contact connects the first wiring line and the first gate electrode between the first active region and the second active region, and wherein a second 1th strap contact connects the first wiring line and the first gate electrode between the third active region and the fourth active region.

16. A memory device comprising:

first through fourth active regions arranged sequentially along a first direction, and which extend along a second direction different from the first direction;

a first gate electrode formed on the first through fourth active regions to intersect the first through fourth active regions, and extending along the first direction;

a second gate electrode formed on the first through fourth active regions to intersect the first through fourth active regions, extending along the second direction, and arranged so that no other gate electrodes are between the first gate electrode and the second gate electrode in the second direction;

the first gate electrode extending between a first end and a second end;

a first wiring line which is formed on the first gate electrode;

a first strap contact, which connects the first wiring line and the first gate electrode between the first active region and the second active region; and a second strap contact, which connects the first wiring line and the first gate electrode between the third active region and the fourth active region;

wherein each of the first strap contact and the second strap contact vertically overlaps a field insulation layer below the first gate electrode.

17. The memory device of claim 16, further comprising a third strap contact, which connects the first wiring line and the first gate electrode between the second active region and the third active region.

* * * * *